US012781362B2

(12) United States Patent
Toma et al.

(10) Patent No.: US 12,781,362 B2
(45) Date of Patent: Nov. 3, 2026

(54) CRYSTALLOGRAPHIC- AND OXYNITRIDE-BASED SURFACE STABILIZATION

(71) Applicants: The Regents of the University of Michigan, Ann Arbor, MI (US); Francesca Maria Toma, Ann Arbor, MI (US); Guosong Zeng, Ann Arbor, MI (US); Tadashi Ogitsu, Ann Arbor, MI (US); Tuan Anh Pham, Ann Arbor, MI (US)

(72) Inventors: Francesca Maria Toma, Berkeley, CA (US); Tadashi Ogitsu, Dublin, CA (US); Zetian Mi, Ann Arbor, MI (US); Srinivas Vanka, Ann Arbor, MI (US); Guosong Zeng, Berkeley, CA (US); Tuan Anh Pham, Livermore, CA (US); Yixin Xiao, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 345 days.

(21) Appl. No.: 18/279,181

(22) PCT Filed: Feb. 28, 2022

(86) PCT No.: PCT/US2022/018126

§ 371 (c)(1),
(2) Date: Aug. 28, 2023

(87) PCT Pub. No.: WO2022/187133

PCT Pub. Date: Sep. 9, 2022

(65) Prior Publication Data

US 2024/0141519 A1 May 2, 2024

Related U.S. Application Data

(60) Provisional application No. 63/154,428, filed on Feb. 26, 2021.

(51) Int. Cl.
*C25B 11/087* (2021.01)
*C25B 11/052* (2021.01)
(Continued)

(52) U.S. Cl.
CPC .......... *C25B 11/087* (2021.01); *C25B 11/052* (2021.01); *C25B 11/059* (2021.01);
(Continued)

(58) Field of Classification Search
CPC . H10P 14/6312; H10H 20/034; H10H 20/825
See application file for complete search history.

(56) References Cited

U.S. PATENT DOCUMENTS

| | | | |
|---|---|---|---|
| 8,563,395 | B2 | 10/2013 | Mi |
| 9,112,085 | B2 | 8/2015 | Mi |

(Continued)

FOREIGN PATENT DOCUMENTS

| | | | |
|---|---|---|---|
| JP | 2018204094 | A | 12/2018 |
| WO | 2022187133 | A2 | 9/2022 |

OTHER PUBLICATIONS

"Photoenhanced wet oxidation of gallium nitride" by Chen et al. (Year: 2000).*

(Continued)

*Primary Examiner* — Evren Seven
(74) *Attorney, Agent, or Firm* — Lempia Summerfield Katz LLC

(57) ABSTRACT

A method of fabricating a device includes providing a substrate of the device, forming a structure of the device, the structure being supported by the substrate, having a semiconductor composition, and including a surface, where nitrogen is present at the surface, and incorporating oxygen into the surface to form a stabilizing layer on the surface.
(Continued)

Incorporating oxygen into the surface is implemented such that the stabilizing layer includes a uniform distribution of an oxynitride material

24 Claims, 18 Drawing Sheets

(51) Int. Cl.

| | |
|---|---|
| ***C25B 11/059*** | (2021.01) |
| ***H10D 62/40*** | (2025.01) |
| ***H10D 62/85*** | (2025.01) |
| ***H10D 64/01*** | (2025.01) |
| ***H10D 64/68*** | (2025.01) |
| ***H10H 20/01*** | (2025.01) |
| ***H10H 20/817*** | (2025.01) |
| ***H10H 20/825*** | (2025.01) |
| ***H10H 20/84*** | (2025.01) |
| ***H10P 14/60*** | (2026.01) |
| ***H10P 14/692*** | (2026.01) |

(52) U.S. Cl.

CPC ........... *H10D 64/01* (2025.01); *H10D 64/685* (2025.01); *H10D 64/693* (2025.01); *H10H 20/84* (2025.01); *H10P 14/6312* (2026.01); *H10P 14/6939* (2026.01); *H10D 62/405* (2025.01); *H10D 62/8503* (2025.01); *H10H 20/034* (2025.01); *H10H 20/817* (2025.01); *H10H 20/825* (2025.01)

(56) References Cited

U.S. PATENT DOCUMENTS

| | | | | |
|---|---|---|---|---|
| 9,240,516 | B2 | 1/2016 | Mi | |
| 10,576,447 | B2 | 3/2020 | Mi | |
| 2011/0127490 | A1 | 6/2011 | Mi | |
| 2012/0292618 | A1 | 11/2012 | Nomura et al. | |
| 2013/0240348 | A1 | 9/2013 | Kibria et al. | |
| 2017/0233885 | A1 | 8/2017 | Joya | |
| 2018/0358482 | A1* | 12/2018 | Murase | H10F 77/20 |
| 2022/0406949 | A1* | 12/2022 | Cheng | H10D 8/00 |

OTHER PUBLICATIONS

"Effect of Thermal Oxidation on the Structure, Surface Texturing, and Microstructure Evolution in Nanocrystalline Ga—O—N Films" by Das et al. (Year: 2025).*

"Anodic oxidation of gallium nitride" by Skeldon et al. (Year: 2003).*

Abe, R., Higashi, M. & Domen, K. Facile Fabrication of an Efficient Oxynitride TaON Photoanode for Overall Water Splitting into H2 and O2 under Visible Light Irradiation. J. Am. Chem. Soc. 132, 11828-11829 (2010).

Akimov, A. V., Muckerman, J. T. & Prezhdo, O. V. Nonadiabatic dynamics of positive charge during photocatalytic water splitting on GaN(10-10) surface: Charge localization governs splitting efficiency. J. Am. Chem. Soc. 135, 8682-8691 (2013).

Albero, J.; Peng, Y.; García, H., Photocatalytic CO2 Reduction to C2+ Products. ACS Catalysis 2020, 10 (10), 5734-5749.

B. A. Pinaud et al.; Technical and economic feasibility of centralized facilities for solar hydrogen production via photocatalysis and photoelectrochemistry; Energy Environ. Sci., 2013, vol. 6, pp. 1983-2002.

B. Zhou et al.; A GaN:Sn nanoarchitecture integrated on a silicon platform for converting CO2 to HCOOH by photoelectrocatalysis; Energ. Environ. Sci., 2019; vol. 12, pp. 2842-2848.

Bae et al., "Improvement of efficiency in graphene/gallium nitride nanowire on Silicon photoelectrode for overall water splitting", Applied Surface Science 422 (2017) 354-358.

Bae et al., Ferroelectric Oxides for Solar Energy Conversion, Multi-Source Energy—Harvesting/Sensing, and Opto-Ferroelectric Applications, Chem Sus Chem Concepts, vol. 12, Apr. 29, 2019, pp. 2540-2549.

Bai, S.; Wang, L.; Li, Z.; Xiong, Y., Facet-Engineered Surface and Interface Design of Photocatalytic Materials. Advanced Science 2017, 4 (1), 1600216.

Bard, A. J.; Bocarsly, A. B.; Fan, F. R. F.; Walton, E. G.; Wrighton, M. S., The concept of Fermi level pinning at semiconductor/liquid junctions. Consequences for energy conversion efficiency and selection of useful solution redox couples in solar devices. Journal of the American Chemical Society 1980, 102 (11), 3671-3677.

Belanger, D., Dodelet, J. P. & Lombos, B. A. Characteristics and Stability of n-Si/SnO2 and n-Si/SnO2/Pt Photoanodes. J. Electrochem. Soc. 133, 1113-1119 (1986).

Bergmann, A. et al. Reversible amorphization and the catalytically active state of crystalline Co3O4 during oxygen evolution. Nat. Commun. 6, 8625 (2015).

Bermudez, V. M. Study of oxygen chemisorption on the GaN(0001)-(1×1) surface. J. Appl. Phys. 80, 1190-1200 (1996).

Bermudez, V. M. The fundamental surface science of wurtzite gallium nitride. Surf. Sci. Rep. 72, 147-315 (2017).

Bernal, R. A. et al. Effect of growth orientation and diameter on the elasticity of GaN nanowires. A combined in situ TEM and atomistic modeling investigation. Nano Lett. 11, 548-555 (2011).

Britto, R. J. et al. Molybdenum Disulfide as a Protection Layer and Catalyst for Gallium Indium Phosphide Solar Water Splitting Photocathodes. J. Phys. Chem. Lett. 7, 2044-2049 (2016).

Bush, K. A. et al. 23.6%-efficient monolithic perovskite/silicon tandem solar cells with improved stability. Nat. Energy 2, 1-7 (2017).

Cao, S.; Li, Y.; Zhu, B.; Jaroniec, M.; Yu, J., Facet effect of Pd cocatalyst on photocatalytic CO2 reduction over g-C3N4. Journal of Catalysis 2017, 349, 208-217.

Chatterjee, U.; Park, J.-H.; Um, D.-Y.; Lee, C.-R., III-nitride nanowires for solar light harvesting: A review. Renewable and Sustainable Energy Reviews 2017, 79, 1002-1015.

Chen, L. et al. P-type transparent conducting oxide/n-type semiconductor heterojunctions for efficient and stable solar water oxidation. J. Am. Chem. Soc. 137, 9595-9603 (2015).

Chen, R., Fan, F., Dittrich, T. & Li, C. Imaging photogenerated charge carriers on surfaces and interfaces of photocatalysts with surface photovoltage microscopy. Chem. Soc. Rev. 47, 8238-8262 (2018).

Chen, Y. W. et al. Atomic layer-deposited tunnel oxide stabilizes silicon photoanodes for water oxidation. Nat. Mater. 10, 539-544 (2011).

Cheng, W.-H. et al.; Monolithic Photoelectrochemical Device for Direct Water Splitting with 19% Efficiency; ACS Energ; Lett. 2018, vol. 3, (8), pp. 1795-1800.

Choi et al., "Fabrication and characterization of GaN/amorphous Ga2O3 nanocables through thermal oxidation", ScienceDirect, Solid State Communications 142 (2007) 437-440.

Chu et al., Solar Water Oxidation by InGaN Nanowire Photoanode with a Bandgap of 1.7 eV, ACS Energy Letters, Jan. 2, 2018, 30 pages.

Chu, S.; Fan, S.; Wang, Y.; Rossouw, D.; Wang, Y.; Botton, G. A.; Mi, Z., Tunable Syngas Production from CO2 and H2O in an Aqueous Photoelectrochemical Cell. Angewandte Chemie International Edition 2016, 55 (46), 14262-14266.

Chu, S.; Ou, P.; Ghamari, P.; Vanka, S.; Zhou, B.; Shih, I.; Song, J.; Mi, Z., Photoelectrochemical CO2 Reduction into Syngas with the Metal/Oxide Interface. Journal of the American Chemical Society 2018, 140 (25), 7869-7877.

Chuah, L. S., Hassan, Z., Ng, S. S. & Hassan, H. A. High carrier concentrations of n- and p-doped GaN on Si (111) by nitrogen plasma-assisted molecular-beam epitaxy. J. Mater. Res. 22, 2623-2630 (2007).

Church, S. A. et al. Photoluminescence studies of cubic GaN epilayers. Phys. status solidi 254, 1600733 (2017).

Eichhorn, J. et al. Nanoscale imaging of charge carrier transport in water splitting photoanodes. Nat. Commun. 9, 1-8 (2018).

(56) References Cited

OTHER PUBLICATIONS

Extended European Search Report in European Patent Application No. 22763832, dated Apr. 17, 2025, 9 pages.
Fuertes, A. Chemistry and applications of oxynitride perovskites. J. Mater. Chem. 22, 3293-3299 (2012).
Gao, Y.; Craven, M. D.; Speck, J. S.; Den Baars, S. P.; Hu, E. L., Dislocation- and crystallographic-dependent photoelectrochemical wet etching of gallium nitride. Applied Physics Letters 2004, 84 (17), 3322-3324.
Giannozzi, P. et al. Quantum Espresso: a modular and open-source software project for quantum simulations of materials. J. Phys. Condens. matter 21, 395502 (2009).
Gray, J. M.; Rogers, C. T.; Bertness, K. A.; Sanford, N. A., Gallium nitride nanowire electromechanical resonators with piezoresistive readout. Journal of Vacuum Science & Technology B 2011, 29 (5), 052001.
He, Y. et al. Dependence of interface energetics and kinetics on catalyst loading in a photoelectrochemical system. Nano Res. 12, 2378-2384 (2019).
Hellman, E. S. The polarity of GaN: a Critical Review. MRS internet J. Nitride Semicond. Res. 3, 1-11 (1999).
Hu, C.-C.; Teng, H., Gallium Oxynitride Photocatalysts Synthesized from Ga(OH)3 for Water Splitting under Visible Light Irradiation. The Journal of Physical Chemistry C 2010, 114 (47), 20100-20106.
Hu, D.; Ordomsky, V. V.; Khodakov, A. Y., Major routes in the photocatalytic methane conversion into chemicals and fuels under mild conditions. Applied Catalysis B: Environmental 2021, 286, 119913.
Hu, S. et al. Amorphous TiO2 coatings stabilize Si, GaAs, and GaP photoanodes for efficient water oxidation. Science (80-. ). 344, 1005-1009 (2014).
Hu, S. et al. Thin-film materials for the protection of semiconducting photoelectrodes in solar-fuel generators. J. Phys. Chem. C 119, 24201-24228 (2015).
Huang, M. H.; Naresh, G.; Chen, H.-S., Facet-Dependent Electrical, Photocatalytic, and Optical Properties of Semiconductor Crystals and Their Implications for Applications. ACS Applied Materials & Interfaces 2018, 10 (1), 4-15.
Huang, Y.; Duan, X.; Cui, Y.; Lieber, C. M., Gallium Nitride Nanowire Nanodevices. Nano Letters 2002, 2 (2), 101-104.
Hwang, Y. J.; Wu, C. H.; Hahn, C.; Jeong, H. E.; Yang, P., Si/InGaN Core/Shell Hierarchical Nanowire Arrays and their Photoelectrochemical Properties. Nano Letters 2012, 12 (3), 1678-1682.
Idriss, H., Toward Large-Scale Hydrogen Production from Water: What Have We Learned and What Are the Main Research Hurdles to Cross for Commercialization? Energy Technology 2021, 9 (2), 2000843.
International Preliminary Report on Patentability in International Patent Application No. PCT/US2022/018126, dated Aug. 29, 2023, 11 pages.
International Search Report and Written Opinion of the International Searching Authority in International Patent Application No. PCT/US2022/018126, dated Oct. 20, 2022, 16 pages.
Jahangir, S., Mandl, M., Strassburg, M. & Bhattacharya, P. Molecular beam epitaxial growth and optical properties of red-emitting ($\lambda$=650 nm) InGaN/GaN disks-in-nanowires on silicon. Appl. Phys. Lett. 102, 71101 (2013).
Jiang, K. et al. Effects of Surface Roughness on the Electrochemical Reduction of CO2 over Cu. ACS Energy Lett. 5, 1206-1214 (2020).
Jing, L.; Zhou, W.; Tian, G.; Fu, H., Surface tuning for oxide-based nanomaterials as efficient photocatalysts. Chemical Society Reviews 2013, 42 (24), 9509-9549.
Khaselev, O. et al.; A monolithic photovoltaic-photoelectrochemical device for hydrogen production via water splitting; Science 1998, vol. 280, (5362), pp. 425-427.
Kibria, M. G.; Mi, Z., Artificial photosynthesis using metal/nonmetal-nitride semiconductors: current status, prospects, and challenges. Journal of Materials Chemistry A 2016, 4 (8), 2801-2820.
Kibria, M. G.; Zhao, S.; Chowdhury, F. A.; Wang, Q.; Nguyen, H. P.; Trudeau, M. L.; Guo, H.; Mi, Z., Tuning the surface Fermi level on p-type gallium nitride nanowires for efficient overall water splitting. Nat Commun 2014, 5, 3825.
Kida, T.; Minami, Y.; Guan, G.; Nagano, M.; Akiyama, M.; Yoshida, A., Photocatalytic activity of gallium nitride for producing hydrogen from water under light irradiation. Journal of Materials Science 2006, 41 (11), 3527-3534.
Kim, Surface Engineering of GaN and Interface Engineering of Si/GaNJ Heterostructures for Energy-Efficient Semiconductor Devices, University of Winsconson—Madisori. Dissertation, 2018, pp. iv-v, 1-5, 38-64, 89-94.
King, L. A., Hellstern, T. R., Park, J., Sinclair, R. & Jaramillo, T. F. Highly Stable Molybdenum Disulfide Protected Silicon Photocathodes for Photoelectrochemical Water Splitting. ACS Appl. Mater. Interfaces 9, 36792-36798 (2017).
Kishino, K.; Kikuchi, A.; Sekiguchi, H.; Ishizawa, S., InGaN/GaN nanocolumn LEDs emitting from blue to red. SPIE: 2007; vol. 6473, 64730T.
Kistler, T. A. et al. Integrated membrane-electrode-assembly photoelectrochemical cell under various feed conditions for solar water splitting. J. Electrochem. Soc. 166, H3020-H3028 (2019).
Kreider, M. E. et al. Nitride or Oxynitride? Elucidating the Composition-Activity Relationships in Molybdenum Nitride Electrocatalysts for the Oxygen Reduction Reaction. Chem. Mater. (2020) doi:10.1021/acs.chemmater.9b05212.
Krost, A.; Dadgar, A., GaN-based optoelectronics on silicon substrates. Materials Science and Engineering: B 2002, 93 (1), 77-84.
Krost, A.; Dadgar, A.; Strassburger, G.; Clos, R., GaN-based epitaxy on silicon: stress measurements. phys. stat. sol. (a) 200, No. 1, 26-35 (2003).
Kulandaivalu, T.; Mohamed, A. R.; Ali, K. A.; Mohammadi, M., Photocatalytic carbon dioxide reforming of methane as an alternative approach for solar fuel production—a review. Renewable and Sustainable Energy Reviews 2020, 134, 110363.
Le, B. H.; Zhao, S.; Liu, X.; Woo, S. Y.; Botton, G. A.; Mi, Z., Controlled Coalescence of AlGaN Nanowire Arrays: An Architecture for Nearly Dislocation-Free Planar Ultraviolet Photonic Device Applications. Advanced Materials 2016, 28 (38), 8446-8454.
Li, D. et al. Selective etching of GaN polar surface in potassium hydroxide solution studied by x-ray photoelectron spectroscopy. J. Appl. Phys. 90, 4219-4223 (2001).
Li, H.; Tsai, C.; Koh, A. L.; Cai, L.; Contryman, A. W.; Fragapane, A. H.; Zhao, J.; Han, H. S.; Manoharan, H. C.; Abild-Pedersen, F.; Nørskov, J. K.; Zheng, X., Activating and optimizing MoS2 basal planes for hydrogen evolution through the formation of strained sulphur vacancies. Nature Materials 2016, 15 (1), 48-53.
Li, L. et al. Nitrogen Photofixation over III-Nitride Nanowires Assisted by Ruthenium Clusters of Low Atomicity. Angew. Chemie Int. Ed. 56, 8701-8705 (2017).
Li, L.; Fan, S.; Mu, X.; Mi, Z.; Li, C.-J., Photoinduced conversion of methane into benzene over GaN nanowires. Journal of the American Chemical Society 2014, 136 (22), 7793-7796.
Li, N.; Liu, M.; Zhou, Z.; Zhou, J.; Sun, Y.; Guo, L., Charge separation in facet-engineered chalcogenide photocatalyst: a selective photocorrosion approach. Nanoscale 2014, 6 (16), 9695-9702.
Li, R.; Zhang, F.; Wang, D.; Yang, J.; Li, M.; Zhu, J.; Zhou, X.; Han, H.; Li, C., Spatial separation of photogenerated electrons and holes among and crystal facets of BiVO4. Nature Communications 2013, 4 (1), 1432.
Lim, H. et al. High performance III-V photoelectrodes for solar water splitting via synergistically tailored structure and stoichiometry. Nat. Commun. 10, (2019).
Liu, J.; Xu, S.-M.; Li, Y.; Zhang, R.; Shao, M., Facet engineering of WO3 arrays toward highly efficient and stable photoelectrochemical hydrogen generation from natural seawater. Applied Catalysis B: Environmental 2020, 264, 118540.
Liu, R., Schaller, R., Chen, C. Q. & Bayram, C. High internal quantum efficiency ultraviolet emission from phase-transition cubic GaN integrated on nanopatterned Si (100). ACS photonics 5, 955-963 (2018).
Lutterman, D. A., Surendranath, Y. & Nocera, D. G. A Self-Healing Oxygen-Evolving Catalyst. J. Am. Chem. Soc. 131, 3838-3839 (2009).

(56) References Cited

OTHER PUBLICATIONS

M. G. Kibria et al.; Atomic-Scale Origin of Long-Term Stability and High Performance of p-GaN Nanowire Arrays for Photocatalytic Overall Pure Water Splitting; Adv. Mater. 2016; vol. 28, pp. 8388-8397.
Ma et al., "Low-temperature epitaxial growth of high-quality GaON films on ZnO nanowires for superior photoelectrochemical water splitting", Nano Energy 66 (2019) 104089.
Malara, F., Fabbri, F., Marelli, M. & Naldoni, A. Controlling the Surface Energetics and Kinetics of Hematite Photoanodes Through Few Atomic Layers of NiOx. ACS Catal. 6, 3619-3628 (2016).
Moram, M. A.; Johnston, C. F.; Hollander, J. L.; Kappers, M. J.; Humphreys, C. J., Understanding x-ray diffraction of nonpolar gallium nitride films. Journal of Applied Physics 2009, 105 (11), 113501.
Moss, B.; Babacan, O.; Kafizas, A.; Hankin, A., A Review of Inorganic Photoelectrode Developments and Reactor Scale-Up Challenges for Solar Hydrogen Production. Advanced Energy Materials 2021, 11 (13), 2003286.
Narangari, P. R.; Karuturi, S. K.; Lysevych, M.; Hoe Tan, H.; Jagadish, C., Improved photoelectrochemical performance of GaN nanopillar photoanodes. Nanotechnology 2017, 28 (15), 154001.
Nguyen, H. P. T. et al. Breaking the carrier injection bottleneck of phosphor-free nanowire white light-emitting diodes. Nano Lett. 13, 5437-5442 (2013).
Okamoto, K.; Tanaka, T.; Kubota, M., High-Efficiency Continuous-Wave Operation of Blue-Green Laser Diodes Based on Nonpolarm-Plane Gallium Nitride. Applied Physics Express 2008, 1, 072201.
Ono, M.; Fujii, K.; Ito, T.; Iwaki, Y.; Hirako, A.; Yao, T.; Ohkawa, K., Photoelectrochemical reaction and H2 generation at zero bias optimized by carrier concentration of n-type GaN. The Journal of chemical physics 2007, 126 (5), 054708.
Perdew, J. P., Burke, K. & Ernzerhof, M. Generalized gradient approximation made simple. Phys. Rev. Lett. 77, 3865 (1996).
Pham, T. A.; Lee, D.; Schwegler, E.; Galli, G., Interfacial Effects on the Band Edges of Functionalized Si Surfaces in Liquid Water. Journal of the American Chemical Society 2014, 136 (49), 17071-17077.
Pham, T. A.; Zhang, X.; Wood, B. C.; Prendergast, D.; Ptasinska, S.; Ogitsu, T., Integrating Ab Initio Simulations and X-ray Photoelectron Spectroscopy: Toward a Realistic Description of Oxidized Solid/Liquid Interfaces. The Journal of Physical Chemistry Letters 2018, 9 (1), 194-203.
Ratschinski, I. et al. Indentation-induced dislocations and cracks in (0001) freestanding and epitaxial GaN. J. Phys. Conf. Ser. 281, (2011).
Rawdanowicz, T. A.; Narayan, J., Epitaxial GaN on Si(111): Process control of SiNx interlayer formation. Applied Physics Letters 2004, 85 (1), 133-135.
Romano, L. T.; Walle, C. G. V. d.; III, J. W. A.; Götz, W.; Kern, R. S., Effect of Si doping on strain, cracking, and microstructure in GaN thin films grown by metalorganic chemical vapor deposition. Journal of Applied Physics 2000, 87 (11), 7745-7752.
Sanchez-Garcia, M. A.; Calleja, E.; Monroy, E.; Sanchez, F. J.; Calle, F.; Muñoz, E.; Beresford, R., The effect of the III/V ratio and substrate temperature on the morphology and properties of GaN- and AlN-layers grown by molecular beam epitaxy on Si(1 1 1). Journal of Crystal Growth 1998, 183 (1), 23-30.
Scheuermann, A. G. et al. Design principles for maximizing photovoltage in metal-oxide-protected water-splitting photoanodes. Nat. Mater. 15, 99-105 (2016).
Shan, B.; Vanka, S.; Li, T.-T.; Troian-Gautier, L.; Brennaman, M. K.; Mi, Z.; Meyer, T. J., Binary molecular-semiconductor p-n junctions for photoelectrocatalytic CO2 reduction. Nature Energy 2019, 4 (4), 290-299.
Song, D.; Li, L.; Li, B.; Sui, Y.; Shen, A., Band gap engineering of N-alloyed Ga2O3 thin films. AIP Advances 2016, 6 (6), 065016.
Strandwitz, N. C. et al. Photoelectrochemical behavior of n-type Si(100) electrodes coated with thin films of manganese oxide grown by atomic layer deposition. J. Phys. Chem. C 117, 4931-4936 (2013).
Stutzmann, M. et al. Playing with Polarity. Phys. Status Solidi 512, 505-512 (2001).
Sun, Q.; Selloni, A.; Myers, T. H.; Doolittle, W. A., Oxygen adsorption and incorporation at irradiated GaN (0001) and GaN(0001) and GaN (000-1) surfaces: First-principles density-functional calculations. Physical Review B 2006, 74 (19), 195317.
Thakur, A.; Ghosh, D.; Devi, P.; Kim, K.-H.; Kumar, P., Current progress and challenges in photoelectrode materials for the production of hydrogen. Chemical Engineering Journal 2020, 397, 125415.
Toma, F. M. et al. Mechanistic insights into chemical and photochemical transformations of bismuth vanadate photoanodes. Nat. Commun. 7, 1-11 (2016).
Vanderbilt, D. Soft self-consistent pseudopotentials in a generalized eigenvalue formalism. Phys. Rev. B 41, 7892 (1990).
Vanka, S. et al. A High Efficiency Si Photoanode Protected by Few-Layer MoSe2. Sol. RRL 2, 1800113 (2018).
Vanka, S., Arca, E., Cheng, S. B., Sun, K., Botton, G. A., Teeter, G. and Mi, Z. T. (2018). High efficiency Si photocathode protected by multifunctional GaN nanostructures. Nano Lett. 18 (10), 6530-6537.
Vanka, S.; Sun, K.; Zeng, G.; Pham, T. A.; Toma, F. M.; Ogitsu, T.; Mi, Z., Long-term stability studies of a semiconductor photoelectrode in three-electrode configuration. Journal of Materials Chemistry A 2019, 7 (48), 27612-27619.
Varadhan, P.; Fu, H.-C.; Priante, D.; Retamal, J. R. D.; Zhao, C.; Ebaid, M.; Ng, T. K.; Ajia, I.; Mitra, S.; Roqan, I. S.; Ooi, B. S.; He, J.-H., Surface Passivation of GaN Nanowires for Enhanced Photoelectrochemical Water-Splitting. Nano Letters 2017, 17 (3), 1520-1528.
Verlage, E. et al.; A monolithically integrated, intrinsically safe, 10% efficient, solar-driven water-splitting system based on active, stable earth-abundant electrocatalysts in conjunction with tandem III-V light absorbers protected by amorphous TiO2 films; Energ. Environ. Sci. 2015, vol. 8, (11), pp. 3166-3172.
Walle, C. G. V. d.; Segev, D., Microscopic origins of surface states on nitride surfaces. Journal of Applied Physics 2007, 101 (8), 081704.
Walter, M. G. et al. Solar water splitting cells. Chem. Rev. 110, 6446-6473 (2010).
Wang, D.; Pierre, A.; Kibria, M. G.; Cui, K.; Han, X.; Bevan, K. H.; Guo, H.; Paradis, S.; Hakima, A.-R.; Mi, Z., Wafer-Level Photocatalytic Water Splitting on GaN Nanowire Arrays Grown by Molecular Beam Epitaxy. Nano Letters 2011, 11 (6), 2353-2357.
Wang, J., Pedroza, L. S., Poissier, A. & Fernández-Serra, M. V. Water Dissociation at the GaN($10\bar{1}0$) Surface: Structure, Dynamics and Surface Acidity. J. Phys. Chem. C 116, 14382-14389 (2012).
Wang, R., Liu, X., Shih, I. & Mi, Z. High efficiency, full-color AlInGaN quaternary nanowire light emitting diodes with spontaneous core-shell structures on Si. Appl. Phys. Lett. 106, 261104 (2015).
Wang, S.; Liu, G.; Wang, L., Crystal Facet Engineering of Photoelectrodes for Photoelectrochemical Water Splitting. Chemical Reviews 2019, 119 (8), 5192-5247.
Wang, Y.; Zhang, H.; Han, Y.; Liu, P.; Yao, X.; Zhao, H., A selective etching phenomenon on faceted anatase titanium dioxide single crystal surfaces by hydrofluoric acid. Chemical Communications 2011, 47 (10), 2829-2831.
Wolter et al., An investigation into the early stages of oxide growth on gallium nitride, Thin- Solid Films, vol. 371, 2000, pp. 153-160.
Wolter, S. D. et al. X-ray photoelectron spectroscopy and x-ray diffraction study of the thermal oxide on gallium nitride. Appl. Phys. Lett. 70, 2156 (1997).
Wong, M. H. et al. N-polar GaN epitaxy and high electron mobility transistors. Semicond. Sci. Technol. 28, 74009 (2013).
Wu, Y., Lazic, P., Hautier, G., Persson, K. & Ceder, G. First principles high throughput screening of oxynitrides for water-splitting photocatalysts. Energy Environ. Sci. 6, 157-168 (2013).

(56) References Cited

OTHER PUBLICATIONS

Y. Wang et al.; A Monolithically Integrated Gallium Nitride Nanowire/Silicon Solar Cell Photocathode for Selective Carbon Dioxide Reduction to Methane; Chemistry—A European Journal 2016, vol. 22, pp. 8809-8813.
Yang, J. et al. A multifunctional biphasic water splitting catalyst tailored for integration with high-performance semiconductor photoanodes. Nat. Mater. 16, 335-341 (2017).
Yang, M. et al. Anion order in perovskite oxynitrides. Nat. Chem. 3, 47-52 (2011).
Yang, S.; Prendergast, D.; Neaton, J. B., Tuning Semiconductor Band Edge Energies for Solar Photocatalysis via Surface Ligand Passivation. Nano Letters 2012, 12 (1), 383-388.
Yang, W.; Wang, H.-J.; Liu, R.-R.; Wang, J.-W.; Zhang, C.; Li, C.; Zhong, D.-C.; Lu, T.-B., Tailoring Crystal Facets of Metal-Organic Layers to Enhance Photocatalytic Activity for CO2 Reduction. Angewandte Chemie International Edition 2021, 60 (1), 409-414.
Yang, X. et al. Nitrogen-plasma treated hafnium oxyhydroxide as an efficient acid-stable electrocatalyst for hydrogen evolution and oxidation reactions. Nat. Commun. 10, 1543 (2019).
Young, J. L. et al.; Direct solar-to-hydrogen conversion via inverted metamorphic multi-junction semiconductor architectures; Nat. Energ. 2017, vol. 2, 17028; pp. 1-8.
Yu, J.; Low, J.; Xiao, W.; Zhou, P.; Jaroniec, M., Enhanced Photocatalytic CO2-Reduction Activity of Anatase TiO2 by Coexposed and Facets. Journal of the American Chemical Society 2014, 136 (25), 8839-8842.
Yu, Y. et al. Enhanced photoelectrochemical efficiency and stability using a conformal TiO2 film on a black silicon photoanode. Nat. Energy 17045, 1-7 (2017).
Yuliati, L.; Yoshida, H., Photocatalytic conversion of methane. Chemical Society Reviews 2008, 37 (8), 1592-1602.
Zakharov, D. N.; Liliental-Weber, Z.; Wagner, B.; Reitmeier, Z. J.; Preble, E. A.; Davis, R. F., Structural TEM study of nonpolar a-plane gallium nitride grown on (1120)4H—SiC by organometallic vapor phase epitaxy. Physical Review B 2005, 71 (23), 235334.
Zeng, G., Sun, W., Song, R., Tansu, N. & Krick, B. A. Crystal Orientation Dependence of Gallium Nitride Wear. Sci. Rep. 7, 14126 (2017).
Zeng, G., Tan, C. K., Tansu, N. & Krick, B. A. Ultralow wear gallium nitride. Appl. Phys. Lett. 109, 051602 (2016).
Zeng, G.; Pham, T. A.; Vanka, S.; Liu, G.; Song, C.; Cooper, J. K.; Mi, Z.; Ogitsu, T.; Toma, F. M., Development of a photoelectrochemically self-improving Si/GaN photocathode for efficient and durable H2 production. Nat Mater 2021, 20 (8), 1130-1135.
Zhang, X. & Ptasinska, S. Electronic and chemical structure of the H2O/GaN(0001) interface under ambient conditions. Sci. Rep. 1-7 (2016).
Zhang, Z.; Yates, J. T., Band Bending in Semiconductors: Chemical and Physical Consequences at Surfaces and Interfaces. Chemical Reviews 2012, 112 (10), 5520-5551.
Zhao, S.; Wang, R.; Chu, S.; Mi, Z., Molecular Beam Epitaxy of III-Nitride Nanowires: Emerging Applications From Deep-Ultraviolet Light Emitters and Micro-LEDs to Artificial Photosynthesis. IEEE Nanotechnology Magazine 2019, 13 (2), 6-16.
Zhao, Y. et al. Precise determination of surface band bending in Ga-polar n-GaN films by angular dependent X-Ray photoemission spectroscopy. Sci. Rep. 9, 1-7 (2019).
Zhou, B. et al. Gallium nitride nanowire as a linker of molybdenum sulfides and silicon for photoelectrocatalytic water splitting. Nat. Commun. 9, 3856 (2018).
Zhou, B. et al.; Highly efficient binary copper- iron catalyst for photoelectrochemical carbon dioxide reduction toward methane; Proceedings of the National Academy of Sciences 2020, vol. 117, pp. 1330-1338.
Office Action in Japanese Patent Application No. 2023-552213, dated Jan. 20, 2026, 9 pages (including English translation).
Office Action in Korean Patent Application No. 10-2023-7033302, dated Jan. 31, 2026, 9 pages (including English translation).
Office Action in Korean Patent Application No. 10-2023-7033302, dated Jun. 28, 2026, 5 pages (including English translation).

* cited by examiner

CRYSTALLOGRAPHIC- AND OXYNITRIDE-BASED SURFACE STABILIZATION

CROSS-REFERENCE TO RELATED APPLICATION

This U.S. National Phase application is based on International Application No. PCT/US2022/018126, filed Feb. 28, 2022, which claims the benefit of U.S. provisional application entitled "Oxynitride-Based Surface Stabilization," filed Feb. 26, 2021, and assigned Ser. No. 63/154,428, the entire disclosures of which are hereby expressly incorporated by reference. Priority benefit of these earlier filed applications is hereby claimed.

STATEMENT REGARDING FEDERALLY SPONSORED RESEARCH OR DEVELOPMENT

This invention was made with government support under Contracts Nos. DE-AC02-05CH11231 and DE-EE0008086 awarded by the Department of Energy and under Contract No. W911NF-21-1-0337 awarded by the Army Research Laboratory-Army Research Office. The government has certain rights in the invention.

BACKGROUND OF THE DISCLOSURE

Field of the Disclosure

The disclosure relates generally to stabilization and activation of device surfaces during water splitting and other reactions, as well as during other types of device operation.

Brief Description of Related Technology

Photoelectrochemical (PEC) water splitting mimics plants to generate sustainable clean fuels using two most abundant resources on the earth—sunlight and water. One prevailing scheme to artificially attain this solar to chemical energy conversion is to monolithically integrate a semiconductor material with electrocatalysts in a photoelectrode. In this approach, the semiconductor efficiently harvests the solar energy, while the electrocatalyst, which sometimes also acts as a protection layer, lowers the overpotential, mediates the charge carrier transfer, and provides active sites for the chemical reaction at solid/liquid interface.

Unfortunately, efficient photo-absorbers are not durable (e.g., Si, III-V), whereas durable materials show poor efficiency (e.g., $TiO_2$, $SrTiO_3$). For instance, both Si and III-V compound semiconductors suffer from poor stability due to chemical and photochemical corrosion. Compared to photovoltaic electrolyser (PV-EL) devices, the light absorber of PEC devices is often in direct contact with electrolyte, leading to more rapid degradation. The corrosion of semiconductors is influenced by many factors, including intensity of light illumination, biasing conditions, catalyst, surface passivation, semiconductor electronic band structure, electrolyte composition, and the interfaces of semiconductor/electrolyte as well as catalyst/electrolyte. These factors can be potentially addressed by exploring thermodynamic and kinetic protection schemes.

Recent efforts have been directed to providing a stable coating to yield stable photoelectrodes. These coatings are usually a combination of a charge transport layer combined with a catalyst, thus promoting efficient charge collection and separation and preventing corrosion. Different oxides, nitrides, selenides, and sulfides materials have been explored for protection of Si-based photocathodes in the presence of catalysts for the hydrogen evolution reaction (HER). Among these, gallium nitride (GaN) is an interesting option due to the chemical stable nature of N-rich surfaces. GaN is suitable as an efficient protective layer for silicon photocathodes, due to the almost ideal band alignment of the two materials for providing optimal electron transport.

Other protection schemes have been developed to enhance the stability of photoelectrodes. Kinetic protection for a given photoelectrode is possible by using a synergetic combination of a stable surface protection layer and a highly active co-catalyst. To further improve device stability, other photoelectrodes have employed relatively thick metal oxides, such as $TiO_2$, $Al_2O_3$, and IrOx, as passivation layers, in addition to the use of suitable co-catalysts. Although the stability of these devices has improved, one major issue is the loss of photocurrent, due to poor charge transfer and, in some cases, undesired light absorption by the protection layers.

SUMMARY OF THE DISCLOSURE

In accordance with one aspect of the disclosure, a method of fabricating a device includes providing a substrate of the device, forming a structure of the device, the structure being supported by the substrate, having a semiconductor composition, and including a surface, where nitrogen is present at the surface, and incorporating oxygen into the surface to form a stabilizing layer on the surface. Incorporating the oxygen is implemented such that the stabilizing layer includes a uniform distribution of an oxynitride material.

In accordance with another aspect of the disclosure, a device includes a substrate, a structure having a semiconductor composition, the structure being supported by the substrate, the structure including a surface, where nitrogen is present at the surface, and a stabilizing layer disposed on the surface of the structure. The stabilizing layer includes a uniform distribution of an oxynitride material.

In accordance with another aspect of the disclosure, a device includes a substrate, a structure having a semiconductor composition, the structure being supported by the substrate, the structure including a surface, and a stabilizing layer disposed on the surface of the structure, the stabilizing layer including an oxynitride material. The oxynitride material of the stabilizing layer is continuously distributed across the surface of the structure.

In accordance with another aspect of the disclosure, a device includes a substrate, a structure having a semiconductor composition, the structure being supported by the substrate, the structure including a non-polar sidewall surface; a passivation structure disposed along the non-polar sidewall surface of the structure, and a stabilizing layer disposed between the structure and the passivation structure, the stabilizing layer including an oxynitride material.

In accordance with another aspect of the disclosure, a method of fabricating a device includes providing a substrate of the device, forming a structure of the device, the structure being supported by the substrate, having a semiconductor composition, and including a surface, forming a stabilizing layer on the surface, the stabilizing layer including an oxynitride material, and depositing an insulating structure adjacent to the structure such that the stabilizing layer is disposed between the surface of the structure and the insulating structure.

In connection with any one of the aforementioned aspects, the methods, devices, and/or systems described herein may alternatively or additionally include or involve any combination of one or more of the following aspects or features. The stabilizing layer is configured as an activation layer. The stabilizing layer is configured as a passivation layer. Incorporating the oxygen includes implementing an oxidation reaction to form the stabilizing layer. Incorporating the oxygen includes implementing an electrochemical procedure. The electrochemical procedure is implemented for a period of time on the order of minutes. The electrochemical procedure includes implementing a water splitting reaction in which the device is immersed in water. Incorporating the oxygen includes annealing the surface. Incorporating the oxygen includes depositing an oxygen-containing material on the surface. The oxygen-containing material includes an oxide. The oxide is aluminum oxide. The oxide is hafnium oxide. Incorporating the oxygen includes treating the surface before depositing the oxygen-containing material. Incorporating the oxygen further includes annealing the surface after depositing the oxygen-containing material. The oxygen-containing material includes a ferroelectric material. Forming the structure includes forming an array of conductive projections supported by the substrate and extending outwardly from the substrate, the array of conductive projections including the structure. Forming the array of conductive projections includes implementing a molecular beam epitaxy (MBE) growth procedure such that each conductive projection of the array of conductive projections includes a respective nanowire. The MBE growth procedure is implemented under nitrogen-rich conditions such that sidewalls of each conductive projection of the array of conductive projections are nitrogen-terminated. The substrate includes silicon. The semiconductor composition of the structure includes gallium nitride such that the oxynitride material is $GaO_xN_{1-x}$. The stabilizing layer has a thickness falling in a range from about one monolayer to a few monolayers. The surface is oriented along a non-polar plane of the semiconductor composition. The surface is oriented along a polar plane of the semiconductor composition. The semiconductor composition is configured such that implementing the oxidation reaction results in partial oxygen substitution of the nitrogen. The semiconductor composition has a Wurtzite crystal structure. The nitrogen of the surface is disposed in a compound semiconductor arrangement of the semiconductor composition. The stabilizing layer is configured as a passivation layer. The structure is configured as a transistor channel. The device further includes a gate oxide layer. The stabilizing layer is disposed between the transistor channel and the gate oxide layer to stabilize an interface between the transistor channel and the gate oxide layer. The transistor channel includes gallium nitride. The gate oxide layer includes aluminum oxide. The gate layer includes hafnium oxide. The structure includes a stack of semiconductor layers configured for light emission. The device further includes a metal contact layer adjacent the stack of semiconductor layers, wherein the stabilizing layer is disposed along an interface between the metal contact layer and the stack of semiconductor layers. The stack of semiconductor layers includes an active layer. The stabilizing layer is disposed along a sidewall of the active layer. The stabilizing layer is configured as an activation layer. The stabilizing layer is configured to define catalytic sites along the surface of the structure. The surface is oriented along a non-polar plane of the semiconductor composition. The surface is oriented along a polar plane of the semiconductor composition. The stabilizing layer is configured with partial oxygen substitution of the nitrogen. The semiconductor composition has a Wurtzite crystal structure. The nitrogen of the surface is disposed in a compound semiconductor arrangement of the semiconductor composition. The surface includes a sidewall. The stabilizing layer is disposed along the sidewall. The stabilizing layer has a thickness falling in a range from a sub-nanometer thickness to a thickness of a few nanometers. The substrate includes silicon. The semiconductor composition of the structure includes gallium nitride such that the oxynitride material is $GaO_xN_{1-x}$. The surface is free of catalyst nanoparticles. The device further includes an array of conductive projections supported by the substrate and extending outwardly from the substrate. The array of conductive projections includes the structure. Each conductive projection of the array of conductive projections has a surface protected by an oxynitride layer. An electrochemical system including a working electrode configured in accordance with a device as described herein. The surface is a non-polar surface of the structure. The non-polar surface is oriented along an m-plane of a lattice of the structure. The non-polar surface is a sidewall of the structure. The device further includes a passivation cap disposed on a polar surface of the structure. The polar surface is oriented along a c-plane of a lattice of the structure. The passivation cap includes a nitride material or an oxide material. The device further includes a passivation structure that partially covers the non-polar surface. The passivation structure includes parylene. The passivation structure includes a nitride material or an oxide material. The structure is configured as a nanowire. The device further includes an electrode supported by the structure. The stabilizing layer is disposed between the structure and the electrode. The semiconductor composition includes nitrogen such that nitrogen is present at the surface. The semiconductor composition includes oxygen such that oxygen is present at the surface. The surface is a polar surface of the structure. The structure is configured as a transistor channel. The device further includes a gate oxide layer. The stabilizing layer is disposed between the transistor channel and the gate oxide layer to stabilize an interface between the transistor channel and the gate oxide layer. The surface is oriented along a c-plane of a lattice of the structure. The semiconductor composition includes nitrogen such that nitrogen is present at the surface. The semiconductor composition includes oxygen such that oxygen is present at the surface. The device further includes a passivation structure disposed along a sidewall of the structure, the sidewall being oriented along an m-plane of a lattice of the structure, and a further stabilizing layer between the passivation structure and the sidewall of the structure. The non-polar sidewall surface is an m-plane of a lattice of the structure. The passivation structure partially covers the non-polar sidewall surface. The stabilizing layer covers an entirety of the non-polar sidewall surface, and the passivation layer passivates an entirety of the non-polar sidewall surface. The surface is a non-polar surface of the structure. The surface is a polar surface of the structure. Depositing the insulating structure includes covering a c-plane surface of the structure. Depositing the insulating structure includes partially covering an m-plane surface of the structure. Depositing the insulating structure is implemented after forming the stabilizing layer. Forming the stabilizing layer includes depositing an oxygen-containing material on the surface, and treating the surface before depositing the oxygen-containing material. Forming the stabilizing layer further includes implementing an anneal to form the oxynitride material from oxygen of the oxygen-containing material. Forming the stabilizing layer includes depositing a nitrogen-containing material on the surface, and implementing an anneal to form the oxynitride material from nitrogen of the nitrogen-containing material.

BRIEF DESCRIPTION OF THE DRAWING FIGURES

For a more complete understanding of the disclosure, reference should be made to the following detailed description and accompanying drawing figures, in which like reference numerals identify like elements in the figures.

Figure 12:
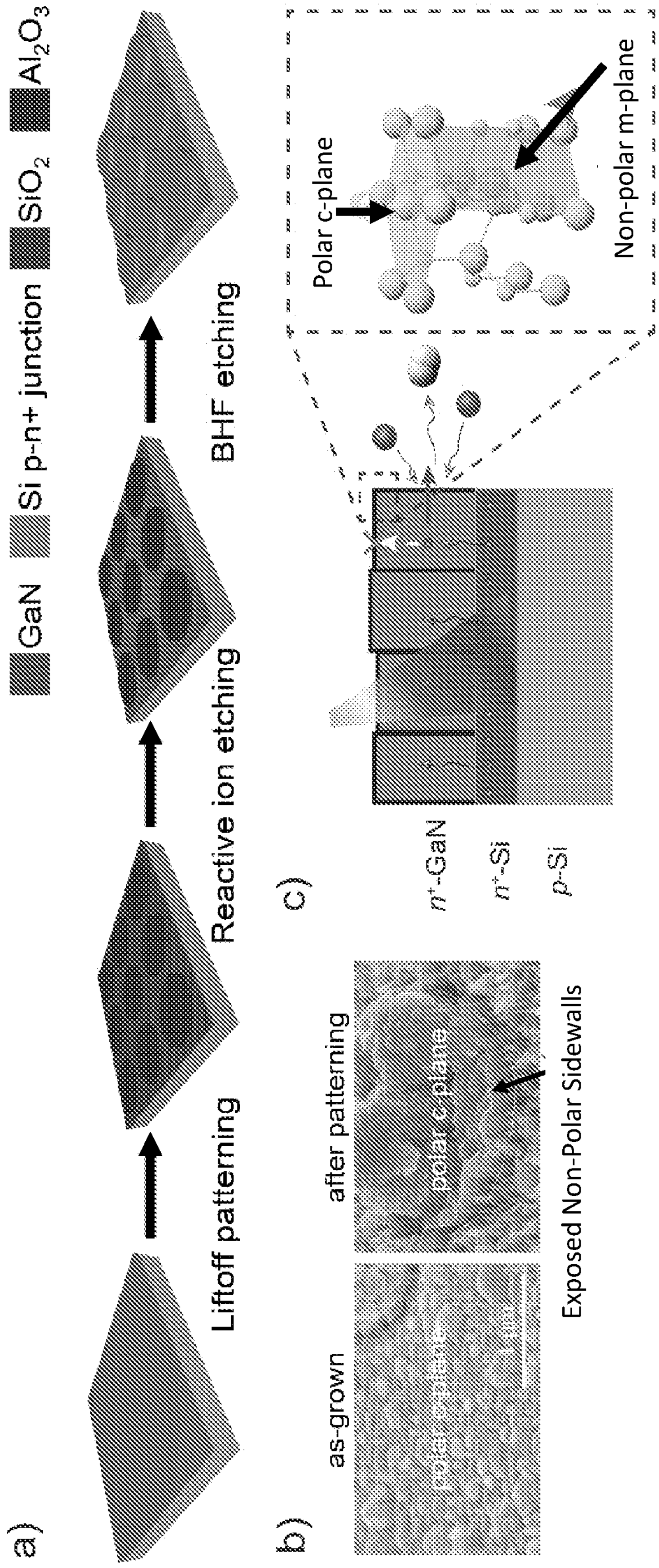

FIG. 12 depicts a schematic, perspective view of example devices with nanostructures having either polar c-plane surfaces or non-polar m-plane surfaces exposed to an electrolyte, along with scanning electron microscopy images of the nanostructures and a schematic view of the wurtzite structure of a GaN structure to show the top surface of the polar c-plane and the sidewalls of non-polar m-plane in greater detail.

Figure 13:
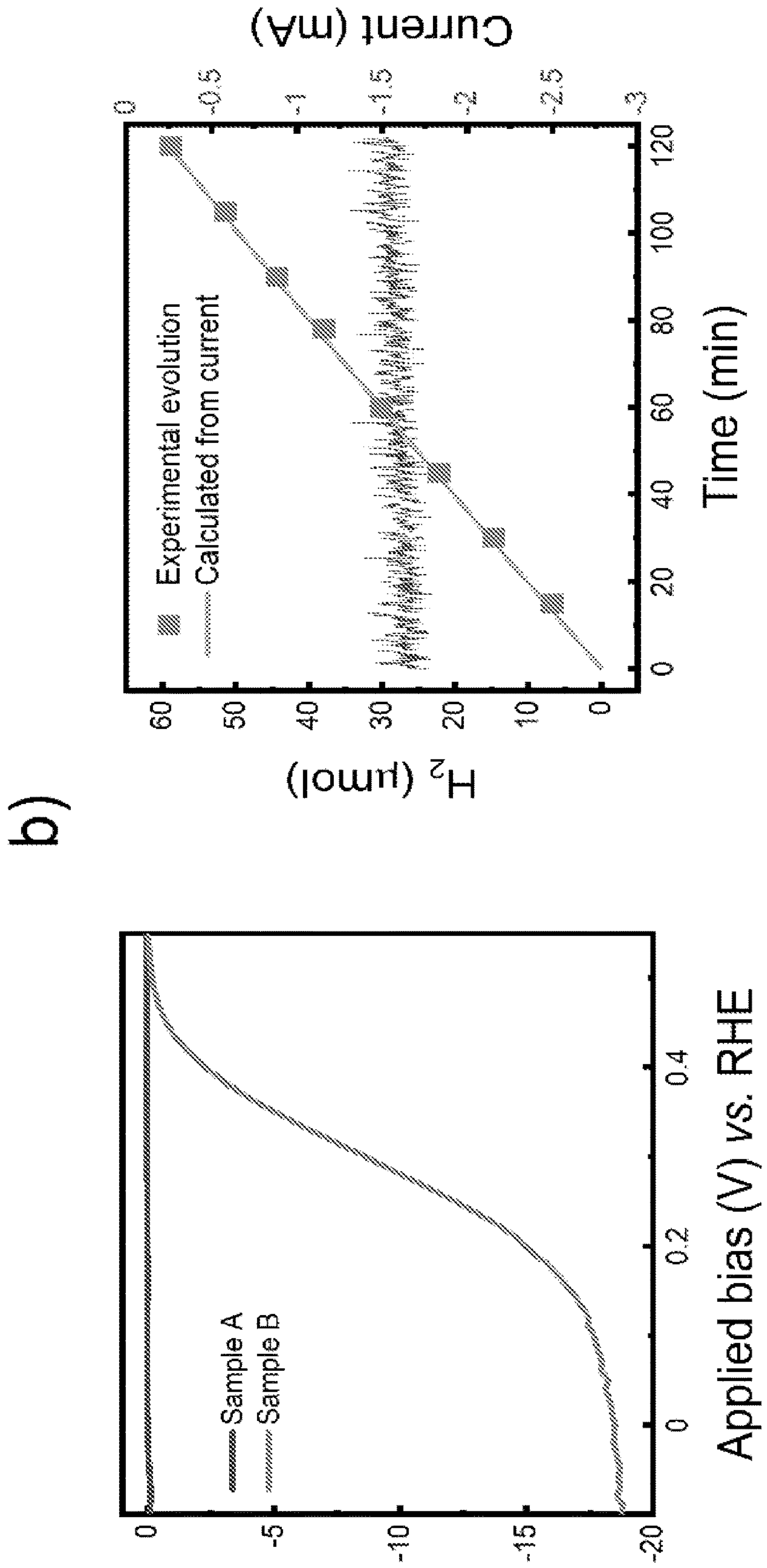

FIG. 13 depicts graphical plots of (a) linear sweep voltammetry curves for example devices having polar c-plane surfaces or non-polar m-plane surfaces in 0.5 M $H_2SO_4$ under AM1.5G one-sun illumination and (b) photocurrent and the amount of hydrogen evolution of the example device having exposed non-polar m-plane surfaces, showing nearly 100% Faradaic efficiency.

Figure 14:
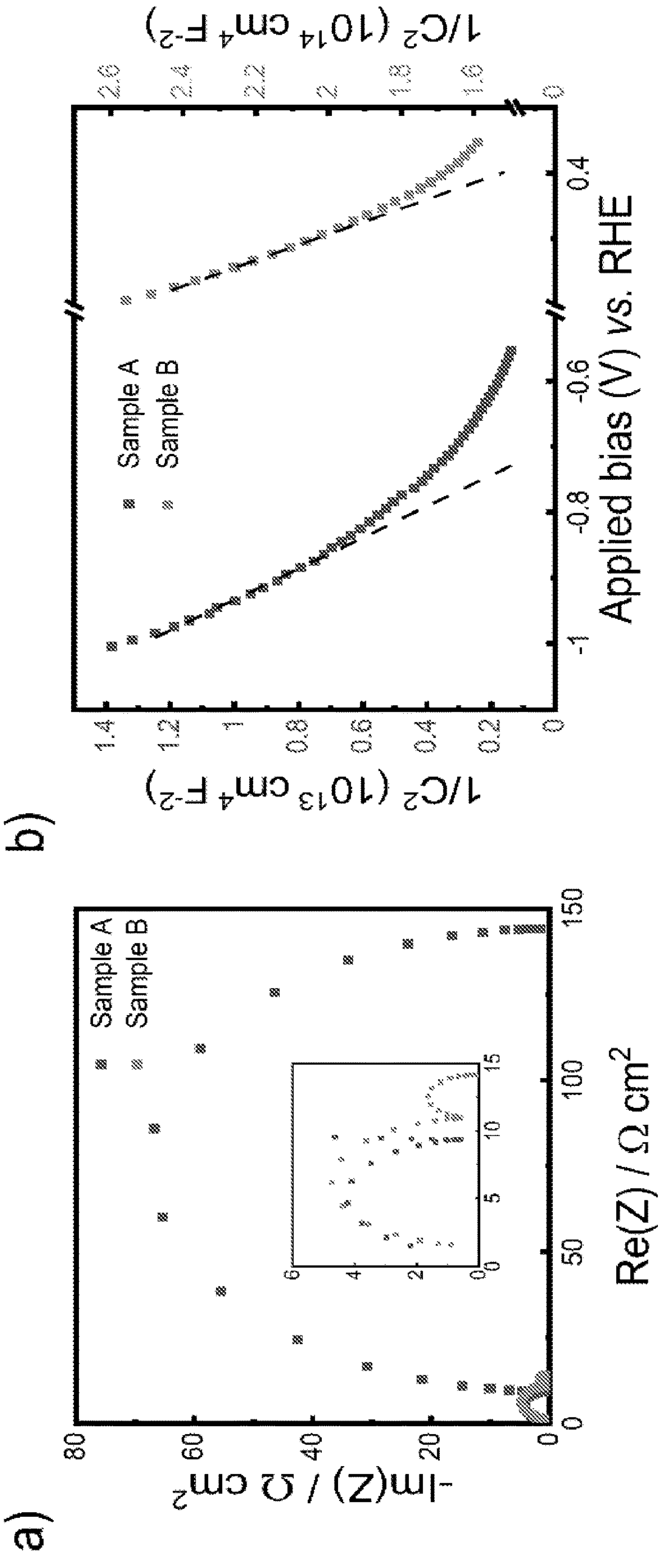

FIG. 14 depicts Nyquist plots of the example devices having polar c-plane surfaces or non-polar m-plane surfaces, along with a graphical plot of Mott-Schottky measurements for the example devices.

Figure 15:
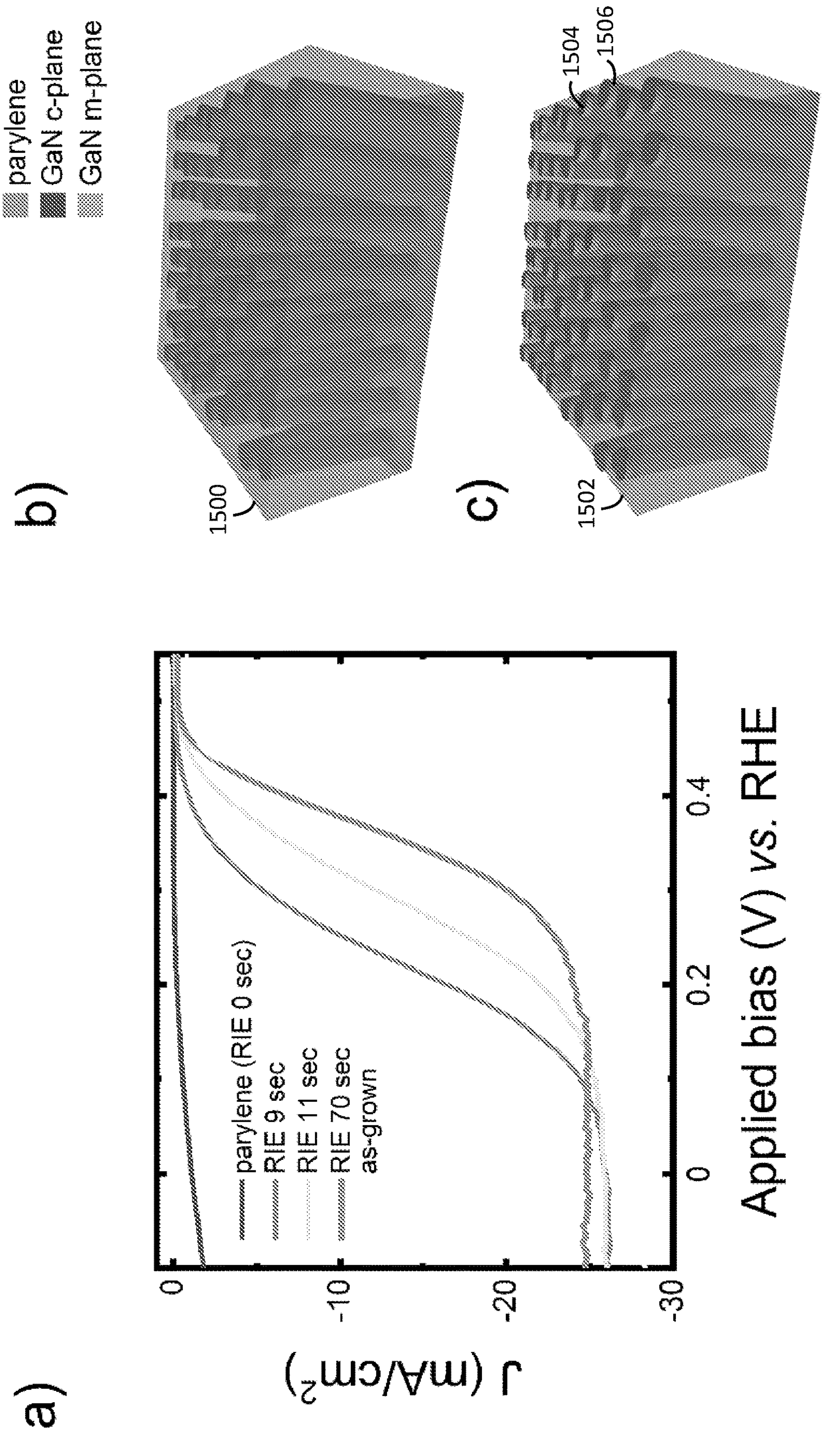

FIG. 15 depicts a graphical plot of linear scan voltammograms of example devices having variously parylene-coated GaN nanowires under one-sun illumination, along with schematic views of two of the example devices.

Figure 16:
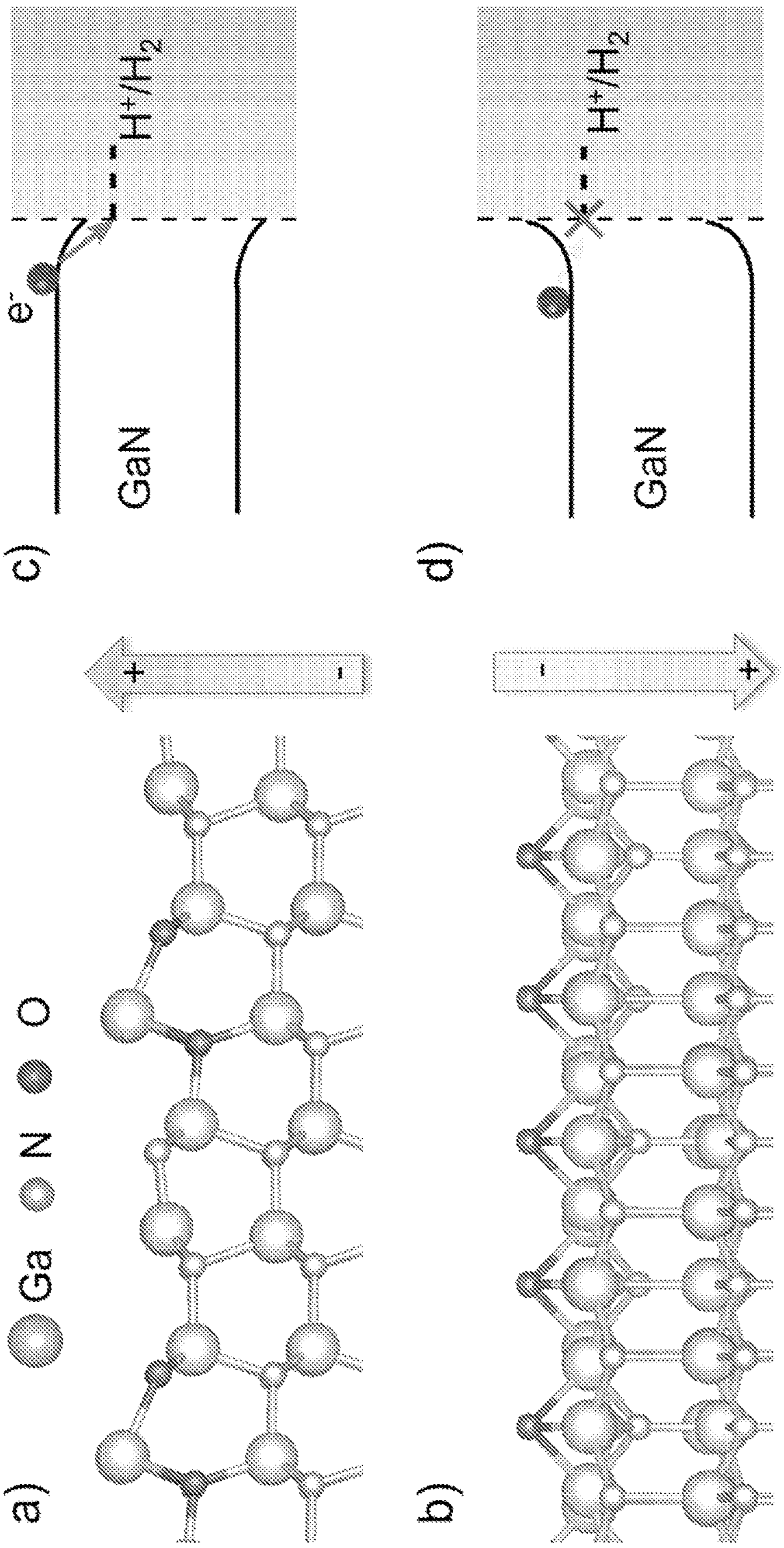

FIG. 16 depicts a schematic view of density functional theory (DFT) configurations of gallium oxynitride formation via oxygen substitution at c- and m-plane surfaces, along with schematic views of band bending induced by the oxygen substitution.

Figure 17A:
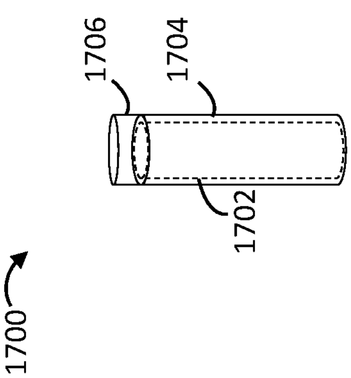

FIG. 17A is a schematic view of a nanostructure having a passivated c-plane surface in accordance with one example.

Figure 17B:
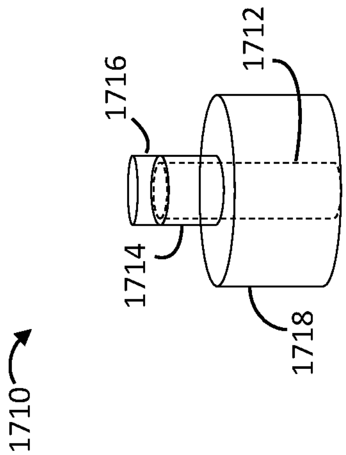

FIG. 17B is a schematic view of a nanostructure having a passivated c-plane surface and a partially passivated m-plane surface in accordance with one example.

Figure 17C:
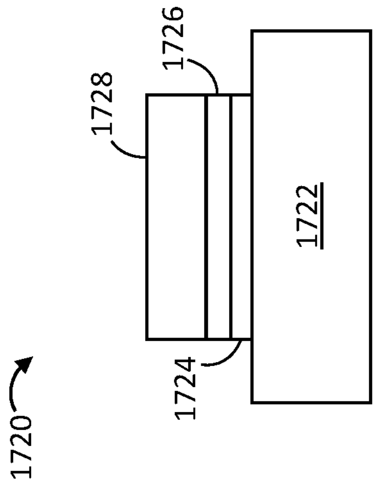

FIG. 17C is a schematic view of a device with a planar nanostructure having a surface stabilized in accordance with one example.

Figure 18:
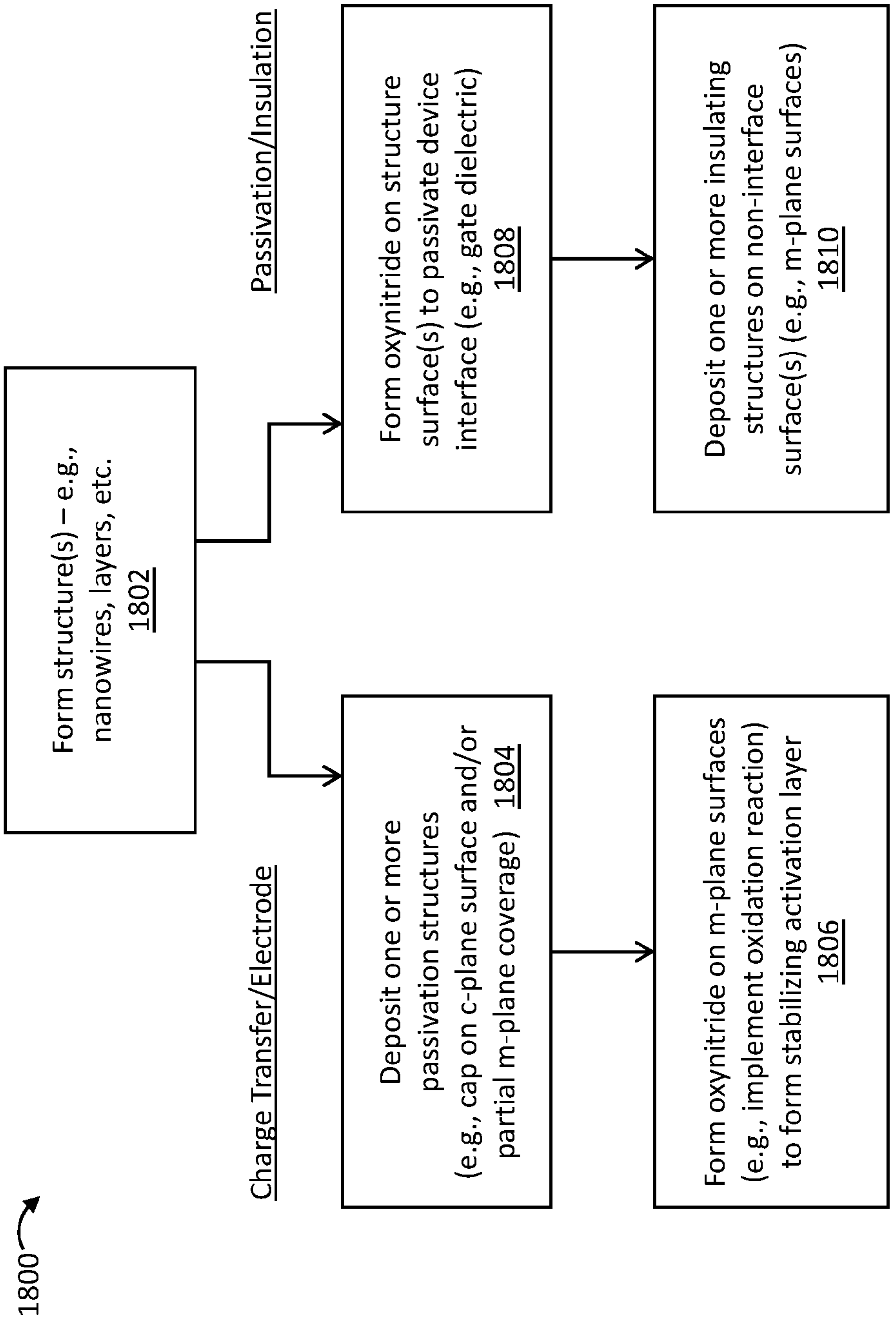

FIG. 18 is a flow diagram of methods of fabricating a device having a stabilizing layer in accordance with multiple examples.

The embodiments of the disclosed devices, systems, and methods may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

Photoelectrochemical, photocatalytic, electronic, and other systems and devices are described. In some cases, the disclosed systems and devices (e.g., photoelectrodes) may be configured for water splitting and other chemical reactions. Methods of fabricating the devices (e.g., photoelectrodes or photocatalytic devices) are also described. The photoelectrodes or other devices include a stabilizing layer (e.g., a stabilizing activation layer) disposed on one or more surfaces thereof.

The stabilizing layer includes an oxynitride material. As described herein, the disclosed methods include incorporating oxygen into a structure surface (e.g., oxidizing the structure surface) to form the oxynitride material (e.g., a continuous or other uniform distribution of the oxynitride material). For instance, an oxidation reaction configured to form the continuous or other uniform distribution of an oxynitride material may be implemented. In some cases, the uniformity of the oxynitride distribution may relate to the comprehensive formation of the oxynitride material at each nitrogen site at the surface. Alternative or additional ways in which the distribution is uniform are presented below.

The composition of the oxynitride material may vary. For instance, the ratio of nitrogen to oxygen may vary. Thus, in some cases, the oxygen composition, may vary (e.g., decrease) as the distance from the surface increases. The oxynitride material may have a varying oxygen concentration, such as $O_xN_{1-x}$ For example, in devices having a GaN device structure, the oxynitride material may be or otherwise include $GaO_xN_{1-x}$. The stabilizing layer in such cases may accordingly include gallium oxynitride in combination with a very thin layer (e.g., 1 nm or less) of gallium and oxide (e.g., on top of the gallium oxynitride, and a region of $GaO_xN_{1-x}$ with the oxygen concentration decreasing as the distance from the surface increases. References to the oxynitride material of the stabilizing layer may thus include materials with varying levels of oxygen content. The oxygen content level may vary with a number of factors, including, for instance, surface orientation, surrounding environment (e.g., electrolyte, metal layer, passivation layer, etc.), and/or treatment conditions. In any case, the oxynitride material of the stabilizing layer provides surface stabilization and device performance enhancement, as described below. The oxynitride material may vary in alternative or additional ways. For instance, the nitrogen and oxygen may be disordered. In some cases, the positioning of the nitrogen and oxygen may be swapped or otherwise vary.

In some cases, the oxynitride layer is configured as an activation layer. For instance, the oxynitride layer may activate a device surface by establishing or otherwise defining catalytic sites along the device surface. Alternatively or additionally, the oxynitride layer may activate the device surface by establishing or otherwise defining sites along the device surface for efficient charge transfer. Resistance presented at an interface, such as a metal-semiconductor interface of a light emitting device, may thus be decreased. The activation aspect of the oxynitride layer may thus improve the efficiency or performance of the disclosed devices, as described in connection with a number of examples herein.

In addition to providing such activation functions, the stabilizing layer may provide protection or other stabilization of the device surface. A structure on which the stabilizing layer is disposed may thus be more durable. For instance, in electrochemical cases, the stabilizing layer may provide protection against corrosion or other degradation. Such protection or other stabilization is achieved without adverse effects on device performance. Indeed, to the contrary, the oxynitride layer unexpectedly improves device performance while providing such protection or other stabilization.

In some cases, the stabilizing layer is configured as a passivation layer rather than an activation layer. The stabilizing layer may be used to stabilize an interface between a device structure, such as a transistor channel, and an adjacent structure, such as a transistor gate oxide. The stabilizing layer may be disposed between such structures to stabilize an interface therebetween. In some cases, the stabilizing layer may reduce interfacial traps at an interface of an electronic device. Such reduction may be useful during operation of transistors and a wide variety of other electronic devices. The stabilizing layer may provide alternative or additional stabilization functions, including, for instance, rendering conventionally unstable interfaces (e.g., high dielectric constant interfaces, such as III-nitride interfaces) more chemically stable. Such increased stability may be useful in connection with a broad range of electronic devices, such as high electron mobility transistors (HEMTs), metal-oxide-semiconductor field-effect transistors (MOSFETs), fin field-effect transistors (FinFETs), and vertical transistors. Still further stabilization may be provided in connection with light emitting devices via a passivation layer configured to reduce current leakage and/or surface recombination.

The water splitting and other chemical reactions may be solar driven (e.g., solar water splitting). The disclosed devices, systems and methods may thus be considered to implement artificial photosynthesis in some cases. In some cases, the disclosed devices, systems and devices include an array of conductive projections, such as nanowires or other nanostructures. Each nanostructure or other conductive projection may establish a structure to support and otherwise provide catalysts for the water splitting or other chemical reaction. In other cases, the disclosed devices may be configured with other types of structures, including planar structures. For instance, the functionality of the devices may be provided instead by a number of planar structures supported by a substrate.

The disclosed methods, devices, and systems involve structures having a surface that includes nitrogen. For instance, in transistor cases, the structure may be a transistor channel composed of, or otherwise including, a compound semiconductor that establishes the nitrogen-based surface. In photoelectrode cases involving an array of nanostructures, each nanostructure may be composed of, or otherwise include, a compound semiconductor that establishes the nitrogen-based surface. Alternative or additional surface protection may be provided by the nitrogen-based aspect of the surface. For instance, the nanostructures may be composed of GaN in an arrangement in which the surface is nitrogen-terminated. Such nitrogen termination may support the protection or other stabilization of the structures. Alternatively or additionally, the disclosed photoelectrodes or other devices may have one or more surfaces on which a nitrogen or other nitrogen-based layer is disposed.

Although described in connection with nanowire arrays, the surface stabilization and activation schemes described herein may be applied to a variety of different device structures. Various planar catalytic surfaces may be modified to include nitrogen. For instance, a nitrogen layer (or other nitrogen-based layer) may be deposited or otherwise applied to a variety of different electrode surfaces.

Photoelectrochemical, photocatalytic, and other water splitting provided by the disclosed devices and systems may involve solar-to-hydrogen conversion. The disclosed devices and systems provide improvements in the efficiency of photoelectrochemical water splitting and/or other water splitting (e.g., photocatalytic water splitting). The disclosed devices and systems may include one or more other aspects directed to efficiency improvements. For instance, the structures may include a double junction configuration, such as in multi-band InGaN nanowire arrays configured to provide a second junction.

Although described in connection with photoelectrochemical water splitting, the disclosed devices and systems may be used in other chemical reaction contexts and applications. For instance, the disclosed devices and systems may be useful in connection with various types of photocatalytic and/or other systems, and/or in connection with other reactions, including, for instance, nitrogen reduction to ammonia, $CO_2$ reduction to various fuels and other chemicals, and activation of C—H bonds for the production of various chemicals.

Although described herein in connection with electrodes having GaN-based nanowire arrays for water splitting, the disclosed devices and systems are not limited to GaN-based nanowire arrays. A wide variety of other types of nanostructures and other conductive projections may be used. In some cases, the electrodes of the disclosed systems do not include an array of projections, and are instead planar devices. Thus, the nature, construction, configuration, characteristics, shape, and other aspects of electrodes through which the water splitting is implemented may vary.

The surface stabilization and activation of the disclosed methods and devices are also not limited to electrochemical or other chemical contexts. Although described herein in connection with a field effect transistor, the surface stabilization may be applied in various electronic contexts. For instance, the disclosed devices may be any type of photoelectronic, optoelectronic, or other electronic device. In such cases, the structures formed by the disclosed methods may be or include other various types of device structures, including, for instance, structures other than transistor structures. The manner in which the surfaces of such structures are protected or otherwise stabilized by the oxynitride material of the stabilizing layer of the disclosed methods and devices may vary accordingly.

Figure 1:
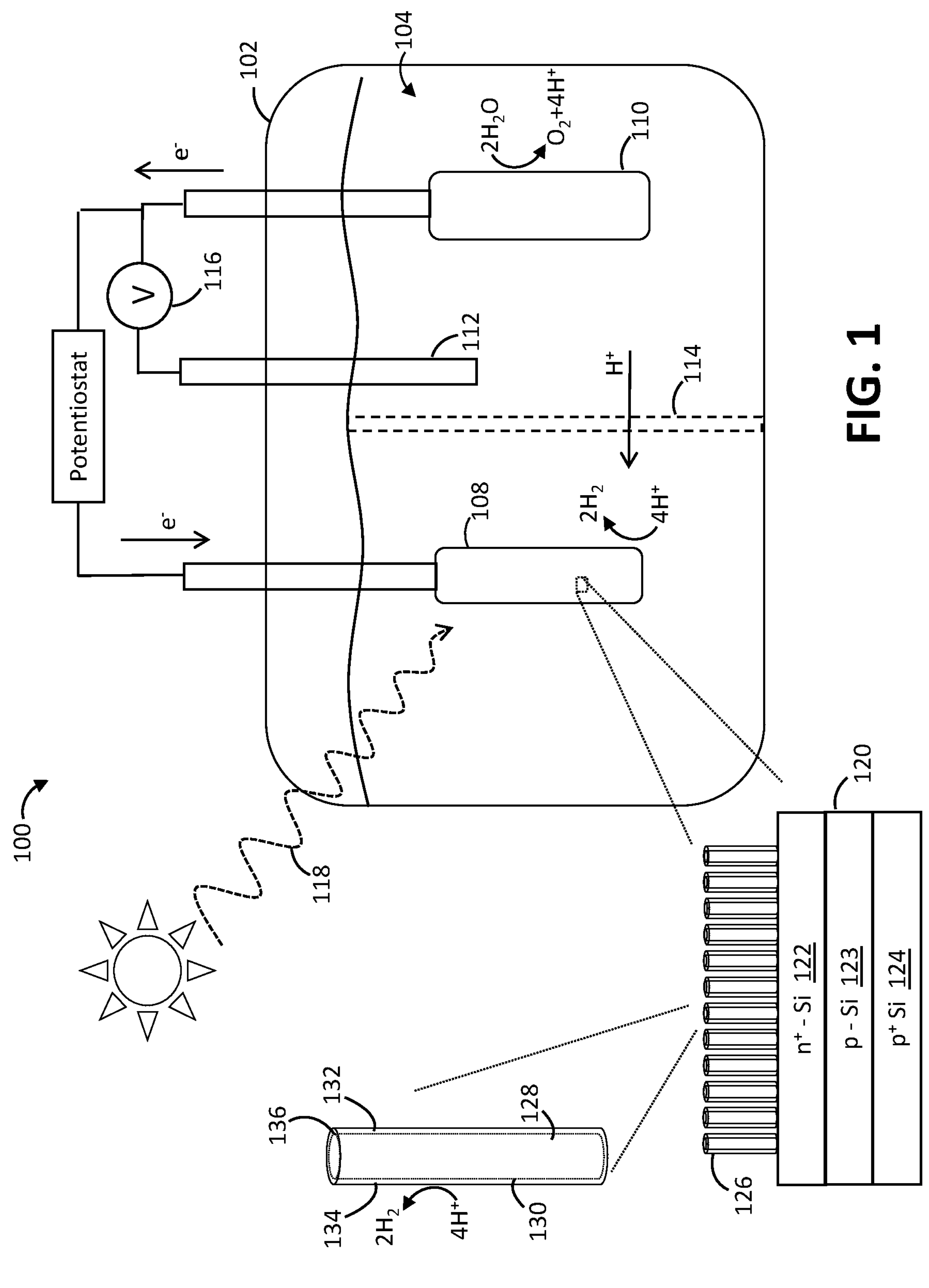
FIG. 1 is a schematic view and block diagram of an electrochemical system having a photocathode with an array of nanostructures having an stabilizing layer for stable activation of hydrogen evolution via water splitting in accordance with one example.

FIG. 1 depicts a system 100 for hydrogen evolution via water splitting. The system 100 may also be configured for other reactions. The system 100 may be configured as an electrochemical system. In this example, the electrochemical system 100 is a photoelectrochemical (PEC) system in which solar and/or other radiation is used to facilitate the hydrogen evolution and water splitting. The water splitting may be assisted or unassisted, as described herein. The manner in which the PEC system 100 is illuminated may vary. The wavelength and other characteristics of the radiation may vary accordingly.

The electrochemical system 100 includes one or more electrochemical cells 102. A single electrochemical cell 102 is shown for ease in illustration and description. The electrochemical cell 102 and other components of the electrochemical system 100 are depicted schematically in FIG. 1 also for ease in illustration. The cell 102 contains an electrolyte solution 104. In some cases, a $CO_2$ and/or other source is applied. In some cases, the electrolyte solution is saturated with $CO_2$. Potassium bicarbonate $KHCO_3$ may be used as an electrolyte. Additional or alternative electrolytes may be used, as described below. Further details regarding examples of the electrochemical system 100 are provided below.

In the example of FIG. 1, the electrochemical cell 102 has a three-electrode configuration. The electrochemical cell 102 includes a working electrode 108, a counter electrode 110, and a reference electrode 112, each of which is immersed in the electrolyte 104. The counter electrode 110 may be or include a metal wire, such as a platinum wire. The reference electrode 112 may be configured as a reversible hydrogen electrode (RHE). The positioning of the reference electrode 112 may vary from the example shown. For example, the reference electrode 112 may be adjacent to the counter electrode 110 in other cases. The configuration of the counter and reference electrodes 110, 112 may vary. For example, the counter electrode 110 may be configured as, or otherwise include, a photoanode at which water oxidation ($2H_2O \Leftrightarrow O_2+4e^-+4H^+$) occurs. In some cases, the counter electrode 110 is configured as, or otherwise includes, an IrOx electrode. The configuration of the electrochemical cell may vary. For instance, in other cases, a two-electrode or other configuration may be used.

The hydrogen evolution occurs at the working electrode 108 as follows:

$$\text{Hydrogen evolution: } 2H^+ + 2e^- \Leftrightarrow H_2$$

To that end, electrons may flow from the counter electrode 110 through a circuit path external to the electrochemical cell 102 to reach the working electrode 108. The working and counter electrodes 108, 110 may thus be considered a cathode and an anode, respectively.

In the example of FIG. 1, the working and counter electrodes are separated from one another by a membrane 114, e.g., a proton-exchange membrane. The construction, composition, configuration and other characteristics of the membrane 114 may vary.

In some cases, no bias voltage is applied—e.g., in unassisted systems. In the example of FIG. 1, the circuit path includes a voltage source 116 of the electrochemical system 100. The voltage source 116 is configured to apply a bias voltage between the working and counter electrodes 108, 110. The bias voltage may be used to establish a ratio of $CO_2$ reduction to hydrogen ($H_2$) evolution at the working electrode, and/or another reaction ratio(s). The circuit path may include additional or alternative components. For example, the circuit path may include a potentiometer in some cases.

In this example, the working electrode 108 is configured as a photocathode. Light 118, such as solar radiation, may be incident upon the working electrode 108 as shown. The electrochemical cell 102 may thus be considered and configured as a photoelectrochemical cell. In such cases, illumination of the working electrode 108 may cause charge carriers to be generated in the working electrode 108. Electrons that reach the surface of the working electrode 108 may then be used in the hydrogen evolution. The photogenerated electrons may augment electrons provided via the current path. Alternatively or additionally, the electrons provided via the current path may recombine with the photogenerated holes at a backside or other contact. Further details regarding examples of photocathodes are provided below.

The working electrode 108 includes a substrate 120. The substrate 120 of the working electrode 108 may constitute a part of an architecture, a scaffolding, or other support structure, of the working electrode 108. The substrate 120 may be uniform or composite. For example, the substrate 120 may include any number of layers or other components. The substrate 120 thus may or may not be monolithic. The shape of the substrate 120 may also vary. For instance, the substrate 120 may or may not be planar or flat.

In the example of FIG. 1, the substrate 120 is doped and otherwise configured to present a junction. The substrate 120 of the working electrode 108 may thus be active (functional) in connection with the photogeneration of charge carriers. Alternatively or additionally, the substrate 120 is passive (e.g., structural). The substrate 120 may be configured and act as a support structure for a catalyst arrangement of the working electrode 108, as described below. Alternatively or additionally, the substrate 120 may be composed of, or otherwise include, a material suitable for the growth or other deposition of the catalyst arrangement of the working electrode 108.

In active or functional cases, the substrate 120 may include a light absorbing material. The light absorbing material is configured to generate charge carriers upon solar or other illumination. The light absorbing material has a bandgap such that incident light generates charge carriers (electron-hole pairs) within the substrate. Some or all of the substrate 120 may be configured for photogeneration of electron-hole pairs. To that end, the substrate 120 may include a semiconductor material. In some cases, the substrate 120 is composed of, or otherwise includes, silicon. For instance, the substrate 120 may be provided as a silicon wafer.

The silicon may be doped. In the example of FIG. 1, the substrate 120 includes a heavily n-type doped layer 122, a moderately or lightly p-type doped layer 123, and a heavily p-type doped layer 124. The arrangement of the layers 122-124 establishes a junction within the substrate 120. The doping arrangement may vary. For example, one or more components of the substrate 120 may be non-doped (intrinsic), or effectively non-doped. The substrate 120 may include alternative or additional layers, including, for instance, support or other structural layers. In other cases, the substrate 120 is not light absorbing.

The substrate 120 of the working electrode 108 establishes a surface at which a number of structures are provided. Each structure may be disposed on, or otherwise supported by, the substrate 120. In this example, the structures are configured to provide a catalyst arrangement. In this case, the structures are configured to provide catalytic functionality. In such cases, the structures are free of catalyst nanoparticles. In other cases, the structures are configured as support structures, or scaffolding, for catalysts (e.g., catalyst nanoparticles) of the electrode 108. As described below, the structures may include an array of conductive projections extending outward from a surface of the substrate 120. In other cases, the structures are not configured as, or otherwise include, conductive projections. For instance, the structure (s) may include one or more planar structures, such as one or more layers supported by the substrate 120.

In the example of FIG. 1, the working electrode 100 includes an array of nanostructures 126 (or other conductive projections) supported by the substrate 120. Each nanostructure 126 is configured to extract the charge carriers (e.g., electrons) from the substrate 120. The extraction brings the electrons to external sites along the nanostructures 126 for use in the hydrogen evolution. In some cases, each nanostructure 126 is configured as a nanowire.

Each nanostructure 126 and/or other structure supported by the substrate 120 has a semiconductor composition. In some cases, the semiconductor composition is or otherwise includes a semiconductor core 128. For instance, the core 128 may be composed of, or otherwise include, a Group III-V nitride semiconductor material, such as gallium nitride (GaN). Additional or alternative semiconductor materials may be used, including, for instance, indium gallium nitride (InGaN) and/or other Group III-V nitride semiconductor materials.

The core 128 of each nanowire or other nanostructure 126 may be or include a columnar, post-shaped, or other elongated structure that extends outward (e.g., upward) from the plane of the substrate 120. The semiconductor nanowires or other nanostructures 126 may be grown or formed as described in U.S. Pat. No. 8,563,395, the entire disclosure of which is hereby incorporated by reference. The nanostructures 126 may be referred to herein as nanowires with the understanding that the dimensions, size, shape, composition, and other characteristics of the nanostructures 126 or other conductive projections may vary.

The semiconductor composition of each nanostructure 126 may or may not be configured to facilitate the reaction (s) supported by the electrochemical system 100. In some cases, the semiconductor composition may be configured for photo-generation of charge carriers. Alternatively or additionally, the semiconductor composition may be configured to act as a catalyst for the reaction(s). The semiconductor composition may provide other functions, including, for instance, protection of the substrate 120. As mentioned above, the semiconductor composition may include GaN and/or InGaN. Further details regarding a number of examples involving GaN are provided below. Additional or alternative semiconductor materials may be used, including, for instance, indium nitride, aluminum nitride, boron nitride, aluminum oxide, silicon, and/or their alloys.

The semiconductor composition of each nanostructure 126 may be configured to provide or support surface passivation and/or other protection of the photoelectrode 108. As described herein, nitrogen is present at one or more surfaces 130 of each nanostructure 126. The surface 130 may thus be considered to include nitrogen. For instance, in some cases, the semiconductor composition is terminated with nitrogen. The nitrogen termination or other nitrogen-based aspect of the nanostructures 126 may protect the nanostructures 126 and/or other components of the electrode 108 (e.g., the substrate 120) during operation from, e.g., corrosion. Alternative or additional nitrogen-based protection schemes may be used in other cases. For instance, a layer including nitrogen may be deposited or otherwise disposed along the surface 130 of each nanostructure 126 and/or other element of the electrode 108. As described herein, the nitrogen may be present at the surface in various ways. In some cases, the nitrogen may be disposed below the surface (e.g., about 1 nm below), but sufficiently near the surface to be functionally active (e.g., chemically active for formation of an oxynitride layer). Accordingly, the terms "at", "present" and "presence" are used herein to include various instances in which the nitrogen is functionally present at the surface, thereby including situations in which nitrogen atoms are disposed along or sufficiently near the surface to be functional for activity at the surface (e.g., chemically functional in connection with an oxidation reaction at the surface), rather than being limited to instances in which the nitrogen disposed is disposed only on the surface.

The nanostructures 126 may facilitate the hydrogen evolution and/or another chemical reaction in one or more ways. For instance, each nanostructure 126 may be configured to extract the charge carriers (e.g., electrons) generated in the substrate 120. The extraction brings the electrons to external sites along the surface 130 of the nanostructures 126 for use in the hydrogen evolution and/or other chemical reaction. The composition of the nanostructures 122 may also form an interface well-suited for hydrogen evolution and/or another chemical reaction, as explained below.

Each nanostructure 126 may be or include a columnar, post-shaped, or other elongated structure that extends outward (e.g., upward) from the plane of the substrate 120. The dimensions, size, shape, composition, and other characteristics of the nanostructures 126 may vary. For instance, each nanostructure 126 may or may not be elongated like a nanowire. Thus, other types of nanostructures from the substrate 120, such as various shaped nanocrystals, may be used.

In some cases, the nanostructures 126 are configured to generate electron-hole pairs upon illumination. For instance, the nanostructures 122 may be configured to absorb light at frequencies different than other light absorbing components of the electrode 108. For example, one light absorbing component, such as the substrate 120, may be configured for absorption in the visible or infrared wavelength ranges, while another component may be configured to absorb light at ultraviolet wavelengths. In other cases, the nanostructures 126 are the only light absorbing component of the electrode 108. In still other cases, the substrate 120 is the only light absorbing component of the electrode 108.

Each nanostructure 126 may include a layered or segmented arrangement of semiconductor materials. For instance, in Group III-nitride examples, the layers or segments of the arrangement may have differing Group III (e.g., indium and gallium) compositions. One or more layers or segments in the arrangement may be configured for absorption of a respective range of wavelengths. Other layers or segments may be directed to establishing a tunnel junction. Each nanostructure 126 may also include additional or alternative segments.

In other cases, the layered arrangement of semiconductor materials is also used to establish a multi-band structure, such as a quadruple band structure. Each layer or segment of the arrangement may have a different semiconductor composition to establish a different bandgap. The different bandgaps may be useful in connection with absorbing light of differing wavelengths. Further details regarding the formation and configuration of multi-band structures, including, for instance, triple-band structures, are provided in U.S. Pat. No. 9,112,085 ("High efficiency broadband semiconductor nanowire devices") and U.S. Pat. No. 9,240,516 ("High efficiency broadband semiconductor nanowire devices"), the entire disclosures of which are incorporated by reference. Other layered or non-layered arrangements may be used in the semiconductor composition of the structure(s) of the disclosed devices.

The semiconductor composition of each nanowire 126 may be configured to improve the efficiency of the water splitting in additional ways. For instance, in some cases, the semiconductor composition of each nanowire 126 may include doping to promote charge carrier separation and extraction, as well as facilitate the establishment of a photochemical diode. For example, a dopant concentration of the semiconductor composition may vary laterally.

In examples involving III-nitride compositions, the dopant may be or include magnesium. Further details regarding the manner in which magnesium doping promotes charge carrier separation and extraction are set forth in U.S. Pat. No. 10,576,447 ("Methods and systems relating to photochemical water splitting"), the entire disclosure of which is incorporated by reference. Additional or alternative dopant materials may be used, including, for instance, silicon, carbon, and beryllium, depending on the semiconductor light absorber of choice.

In some cases, the working electrode 108 may further include catalyst nanoparticles disposed over the array of nanostructures 126. For instance, the nanoparticles may be distributed across or along the outer surface 130 (e.g., sidewalls) of each nanowire 126. In some cases, the nanoparticles are configured to facilitate or promote the proton reduction reaction. For instance, each nanoparticle 136 includes a metal, such as platinum. Other metals or materials may be used, including alloys, oxides, and/or other metal or metallic combinations. Further details regarding the formation, configuration, functionality, and other characteristics of nanoparticles in conjunction with a nanowire array are set forth in one or more of the above-referenced U.S. patents. Further details regarding the distribution of the nanoparticles are provided below in connection with a number of examples.

The electrode 108 also includes a stabilizing layer 132 disposed on the surface 130 of each nanostructure 126. In this case, the stabilizing layer 132 is configured to provide both stabilization and activation functionality for the electrode 108. The stabilizing layer 132 is thus configured as an activation layer or a stabilizing activation layer. The term "activation" is used to differentiate the activation layer from layers configured to act solely as a passivation or other protective layer, as well as other non-active layers. In this electrode example, the stabilization functionality may involve protection against corrosion and/or other passivation or protection. The activation functionality may involve defining or otherwise establishing catalytic sites along the surface 130 for the electrode 108. The nature of the stabilization and activation functionality may vary in other device contexts.

The stabilizing layer 132 may be composed of, or otherwise, include a uniform distribution of an oxynitride material. For instance, in cases in which the nanostructures 126 have a GaN core, the stabilizing layer 132 includes gallium oxynitride. The composition of the oxynitride layer may thus vary in accordance with the semiconductor composition of the nanostructure 126. Alternative or additional oxynitride materials may thus be used, including, for instance, aluminum oxynitride, indium oxynitride, strontium gallium oxynitride, zinc oxynitride, titanium oxynitride, chromium oxynitride, and silicon oxynitride.

The distribution of the oxynitride material may be uniform in various ways. For instance, the uniformity may establish, or otherwise relate to, a thickness of the stabilizing layer 132. Alternatively or additionally, the uniformity may establish, or otherwise relate to, a conformal nature of the stabilizing layer 132. Alternatively or additionally, the uniformity may relate to the consistency, regularity or smoothness of the surface of the stabilizing layer 132. For instance, the roughness of the surface may be decreased as a result of the uniform distribution of the oxynitride material. In some cases, the oxynitride material of the stabilizing layer 132 may be continuously distributed across the surface 130 (e.g., continuously cover the entirety of the surface 130).

Alternatively or additionally, the uniformity may relate to the presence of nitrogen atoms at the surface 130. For example, if the nitrogen atoms are randomly distributed on or otherwise at the surface, then the uniformity refers to the essentially universal or comprehensive (as opposed to local or restricted) formation of oxynitride sites around those nitrogen atoms. The phrase "uniform distribution" is thus used herein to include both continuous and discontinuous instances of the stabilizing layer 132. For instance, in some cases, adjacent nitrogen atoms may be spaced sufficiently apart so as to establish a discontinuity in the stabilizing layer 132. Thus, the stabilizing layer 132 (and accordingly the oxynitride material) may not be continuous at the surface 130 in some cases, but nonetheless still has a uniform distribution of oxynitride material in relation to the nitrogen sites at the surface 130. Alternatively or additionally, the surfaces 130 (or sections of a single surface 130) of the nanostructures 126 on which the stabilizing layer 132 is disposed may be spaced apart from one another, thereby establishing discrete sections of the stabilizing layer 132. As shown in these examples, the stabilizing layer 132 may be continuous or discontinuous, notwithstanding the uniform nature of the distribution of the oxynitride material.

The terms "presence" and "present at" are not limited to situations in which the nitrogen atoms, stabilizing layer, and/or oxynitride material are disposed on the surface. The terms are instead used to include situations in which the nitrogen atoms, the stabilizing layer, and/or the oxynitride material are below the surface, but still sufficiently near the surface to be functional for activity at the surface. The nitrogen atoms, the stabilizing layer, and/or the oxynitride material may thus be disposed slightly below the surface (e.g., about 1 nm below) in some cases, yet still sufficiently near the surface for purposes of formation of the oxynitride material and consequent stabilization of the surface.

The formation and/or presence of the oxynitride may be derived from the nitrogen at the surface 130. In some cases, the nitrogen of the surface 130 is disposed in a compound semiconductor arrangement of the semiconductor composition. For instance, in GaN and other examples, the semiconductor composition has a Wurtzite crystal structure. In some cases, a non-polar plane of the Wurtzite crystal structure may be nitrogen-terminated. The stabilizing layer 132 may be provided or otherwise configured with partial oxygen substitution of the nitrogen along the non-polar plane (and/or other planes in other cases). The surface(s) 130 may thus correspond with those surfaces of the nanostructures 126 that is/are oriented along a non-polar plane(s) of the semiconductor composition. In other cases (e.g., in transistor examples), the surface(s) 130 is/are oriented along a polar plane(s) of the semiconductor composition.

The semiconductor composition and/or the crystal orientation at the surface 130 of the nanostructure 126 may selectively determine where the stabilizing layer 132 is disposed on each nanostructure 126. Thus, the stabilizing layer 132 may or may not cover all of the surfaces of the nanostructure 126. In the example of FIG. 1, the surface 130 of each nanostructure 126 corresponds with sidewalls 134. The nanostructure 126 also includes a top or upper face 136. In this example, the stabilizing layer 132 is disposed on the sidewalls 134, but not on the upper or top face 136. The sidewalls 134 are nitrogen-terminated, but the top face 136 is not, thereby leading to the selective or partial covering of the nanostructure 126. The surface 130 covered by the stabilizing layer 132 may vary in accordance with the crystal orientation of the semiconductor composition of the nanostructure 126.

The stabilizing layer 132 may be sufficiently thin to avoid detrimental effects on charge transport or other activity along or otherwise at the surface 130. In some cases, the stabilizing layer 132 has a thickness of about 1 nm. In these and other cases, the stabilizing layer 132 may conformally cover the nanostructure 126, including any nanoparticles disposed thereon. The thickness may vary in other examples, including, for instance, thicknesses on the order of 1 nm (e.g., up to about 3 nm) or less than 1 nm. For example, the thickness may be one monolayer or on the order of one monolayer (e.g., a pair or a few monolayers). The thickness may thus vary from about 0.3 nm to about 3 nm. The thickness may not be exactly the same across the entirety of the stabilizing layer 132.

The thin nature of the stabilizing layer 132 allows the stabilization function to be provided without adversely affecting the transfer of charge carriers and other catalysis of the hydrogen evolution and/or other reaction occurring at the electrode 108. Further details regarding the functionality and other characteristics of the stabilizing layer 132 are provided below in connection with a number of examples.

In the example of FIG. 1, the surface 130 is free of catalyst nanoparticles. In other cases, a number of nanoparticles may be distributed across the surface 130. The nanoparticles may have a composition and/or otherwise be configured to act as a catalyst for the electrochemical or other reaction. The nanoparticles may have additional or alternative purposes in other cases, including, for instance, charge transport.

The nanostructures 126 and the stabilizing layer 132 are not shown to scale in the schematic depiction of FIG. 1. The shape of the nanostructures 126 may also vary from the nanowire example shown. Further details regarding the nanostructures 126 and the stabilizing layer 132, including the fabrication or formation thereof, are provided below.

The nanowire arrangement may be fabricated on a substrate (e.g., a silicon substrate) via nanostructure-engineering. In one example, molecular beam epitaxial (MBE) growth of the nanowires is followed by photo-deposition of the nanoparticles. The photo-deposition of the nanoparticles may be configured to selectively deposit the nanoparticles on the respective sides of the nanowire. Further details regarding example fabrication procedures are provided below, e.g., in connection with FIG. 2.

The nanostructures 126 may facilitate the water splitting in one or more ways. For instance, one or more aspects of each nanostructure 126 may be configured to extract charge carriers (e.g., electrons) generated in the substrate (e.g., as a result of light absorbed by the substrate 120). The extraction brings the charge carriers to external sites along the nanostructures 126 for use in the water splitting or other reactions. For instance, the nanostructures 126 may thus form an interface well-suited for evolution of hydrogen, the reduction of $CO_2$, and/or other reactions.

Figure 2:
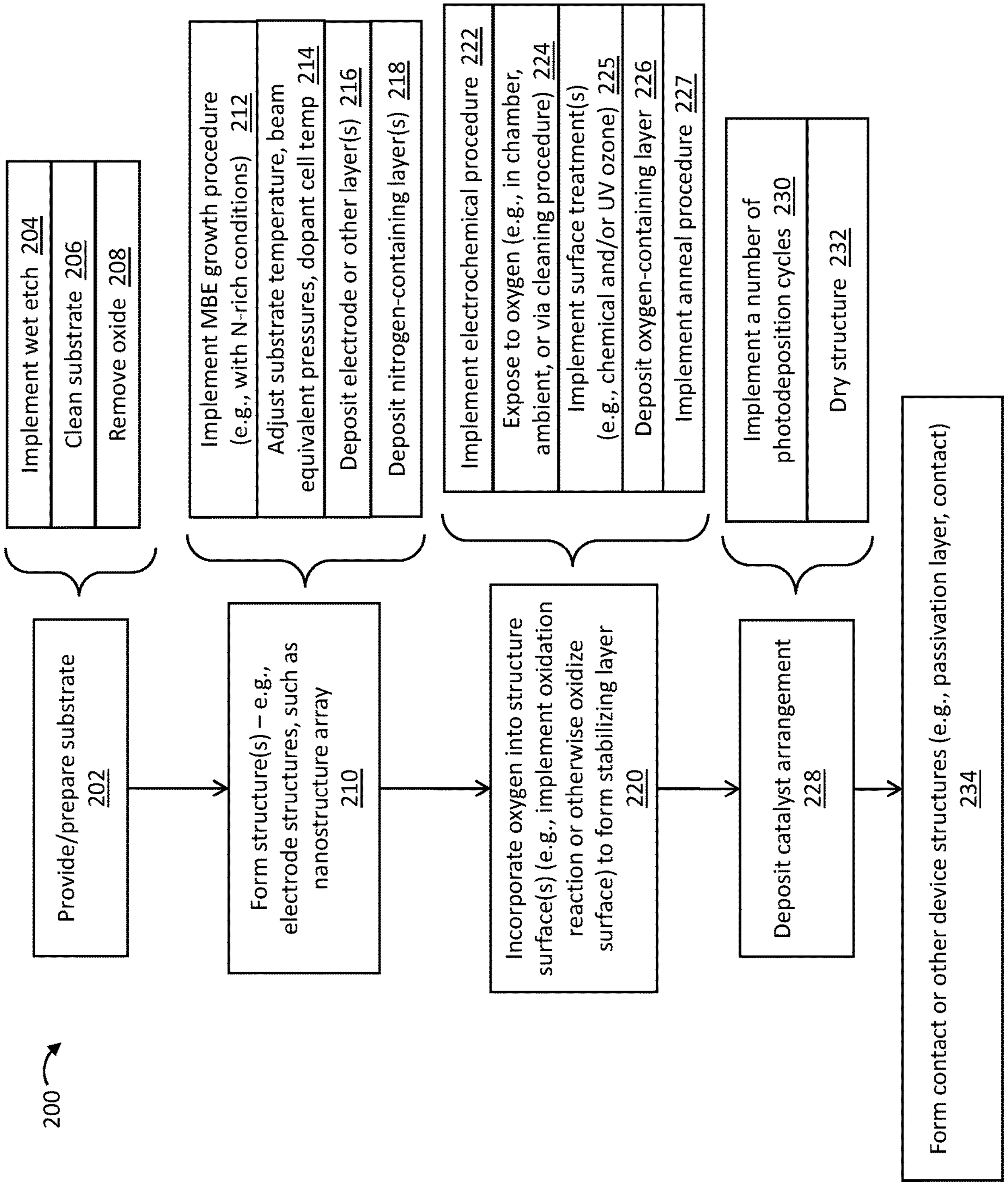
FIG. 2 is a flow diagram of a method of fabricating a photocathode having a stabilizing layer in accordance with one example.

FIG. 2 depicts a method 200 of fabricating a photoelectrode or other semiconductor device for photocatalytic water splitting, PEC water splitting, or other photocatalytic reactions, in accordance with one example. The method 200 may be used to manufacture any of the photoelectrodes or other devices described herein or another device. The method 200 may include additional, fewer, or alternative acts. For instance, the method 200 may or may not include one or more acts directed to forming a backside contact of the device (act 228).

The method 200 may begin with an act 202 in which a substrate is prepared or otherwise provided. The substrate may be or be formed from a silicon wafer. In one example, a 2-inch Si wafer was used, but other (e.g., larger) size wafers may be used. Other semiconductors and substrates may be used.

The substrate may have a planar or nonplanar surface. In some cases, the act 202 includes an act 204 in which a wet or other etch procedure is implemented to define the surface. For example, the etch procedure may be or include a crystallographic etch procedure. In silicon substrate examples, the crystallographic etch procedure may be a KOH etch procedure. In some cases, if the substrate has a <100> orientation, the wet etch procedure may establish that the surface includes a pyramidal textured surface with faces oriented along <111> planes. Other surface orientations and shapes may be used.

The act 202 may include fewer, additional, or alternative acts. For instance, in the example of FIG. 1, the act 202 includes an act 206 in which the substrate is cleaned (e.g., by acetone and/or methanol), and an act 208 in which oxide is removed (e.g., by 10% hydrofluoric acid).

The act 202 may include still further acts. For instance, the act 202 may include one or more doping procedures to form doped regions or layers, and thereby establish a junction, as described herein. Alternatively, the substrate is provided at the outset with a desired dopant concentration profile.

The method 200 includes an act 210 in which a number of electrode or other device structures are grown or otherwise formed on the substrate. In some cases, a nanowire or other nanostructure array is grown or otherwise formed on the substrate. Each nanowire is formed on the surface of the substrate such that each nanowire extends outwardly from the surface of the substrate. Each nanostructure may have a semiconductor composition, as described herein. In some cases, the semiconductor composition is or otherwise includes a compound semiconductor material, such as a III-V semiconductor.

The nanostructure growth may be achieved in an act 212 in which a molecular beam epitaxy (MBE) procedure is implemented. The substrate may be rotated during the MBE procedure such that each nanostructure is shaped as a cylindrically shaped nanostructure. Each nanostructure may thus have a circular cross-sectional shape, as opposed to a plate-shaped or sheet-shaped nanostructure.

The MBE procedure may be implemented under nitrogen-rich conditions. The nitrogen-rich conditions may lead to nitrogen-terminated sidewalls and/or other surfaces, as described herein.

In some cases, the MBE procedure may be modified to fabricate the arrangement of layers or segments of each nanowire. Various parameters may be adjusted to achieve the different composition levels of the segments. For instance, the substrate temperature may be adjusted in an act 214. Beam equivalent pressures may alternatively or additionally be adjusted. In some cases, a dopant cell temperature is adjusted to control the doping (e.g., Mg doping) of the nanowires.

In one example, N-terminated thin GaN nanostructures were grown on Si for 30 minutes at a substrate temperature of about 735° C., with a Ga beam equivalent pressure (BEP) of about $2.2\times10^{-7}$ torr, with a Ge cell (n-type dopant) temperature of about 1050° C., a nitrogen flow rate of 0.45 standard cubic centimeter per minute (sccm) and 350 W plasma power. The growth parameters may vary considerably in other cases.

In other cases (e.g., non-nanostructure cases), the act 210 may include forming other types of electrode or other device structures, such as one or more layers. The layer(s) may be configured to catalyze, participate in, or otherwise enable or facilitate the reaction. The layer(s) may accordingly be referred to as a reaction layer. For instance, the reaction layer(s) may be deposited on the substrate in an act 216. The layer(s) may establish a surface configured to catalyze or otherwise facilitate the water splitting and/or other reaction. The electrode layer(s) may be formed in alternative or additional ways, including, for instance, non-selective growth procedures.

One or more nitrogen-containing layers may be deposited or otherwise formed in an act 218. The nitrogen layer may be directed to protection of the reaction layer(s) and/or other aspects of the nanostructures. The nitrogen-containing layer (s) may alternatively or additionally be directed to supporting the formation of a stabilizing layer. In some cases, the act 218 may include implementing a reaction to form the nitrogen-containing layer(s) spontaneously. The layer(s) may be composed of, or otherwise include, a nitride or an oxynitride.

In some cases, the nitrogen-containing layer(s) may be formed on an electrode or other device structure that is planar (e.g., a structure that includes a number of planar layers or other planar components). The configuration of the planar structures may vary. Examples of planar structures are described in Cheng, et al., "Monolithic Photoelectrochemical Device for Direct Water Splitting with 19% Efficiency," ACS Energ. Lett., 3, (8), 1795-1800 (2018), Young, et al., "Direct solar-to-hydrogen conversion via inverted metamorphic multi-junction semiconductor architectures," Nat. Energ., 2, 17028 (2017), Khaselev et al., "A monolithic photovoltaic-photoelectrochemical device for hydrogen production via water splitting," Sci., 280, (5362), 425-427 (1998), and Verlage et al., "A monolithically integrated, intrinsically safe, 10% efficient, solar-driven water-splitting system based on active, stable earth-abundant electrocatalysts in conjunction with tandem III-V light absorbers protected by amorphous TiO2 films," Energ. Environ. Sci., 8, (11), 3166-3172 (2015), the entire disclosures of which are hereby incorporated by reference.

A wide variety of planar and other structures may be protected by the nitrogen-containing layer(s). For instance, the nitrogen-containing layer(s) may be deposited or otherwise formed on various surfaces not involving a c-plane surface or a nonpolar plane or surface.

In some cases, the act 218 may be integrated with, or implemented in conjunction with, the act 216, as described herein in conjunction with examples involving GaN or other nanostructures. In other cases involving GaN nanostructures, the acts 216 and 218 may be implemented separately.

The method 200 further includes an act 220 in which oxygen is incorporated into one or more surfaces of the nanostructures or other structures of the device to form a stabilizing layer on the one or more surfaces. In some cases, the surface(s) is/are oxidized. For instance, an oxidation reaction may be implemented to form the stabilizing layer. Alternatively or additionally, oxygen is deposited on the surface(s). The deposition may be followed by an annealing procedure in some cases to fully incorporate the oxygen atoms. The stabilizing layer may be configured as an activation layer or a passivation layer. The functionality of the stabilizing layer may vary with the nature of the device structure. As described herein, the oxidation of the surface(s) (or other incorporation of oxygen into the surface(s)) may be implemented such that the stabilizing layer is composed of, or otherwise includes, a uniform distribution of an oxynitride material. For instance, the oxidation reaction may be configured such that the stabilizing layer includes the uniform distribution. In some cases, the oxygen is incorporated into the surface such that the oxynitride material is continuously distributed across the surface (e.g., continuously covers the entirety of the surface).

In some cases, the oxynitride layer is formed in an act 222 in which an electrochemical procedure is implemented. The electrochemical procedure may be implemented for a period of time on the order of hours, e.g., about 5 to about 10 hours. The duration of the procedure may be sufficiently long to establish the uniform distribution of the oxynitride material. For instance, in other cases, the oxidation may be implemented for a period of time on the order of minutes. Further details are provided in connection with a number of examples below.

In some cases, the electrochemical procedure involves or otherwise includes the electrochemical reaction that the device is configured to implement. In such cases, the act 222 may be configured as an initialization step or procedure for the device. For instance, the device may be configured or directed to implementing a water splitting or other hydrogen evolution reaction. The electrochemical procedure may then include implementing the water splitting reaction in which the device is immersed in water. The hydrogen evolution reaction may be implemented for a predetermined period of time to form an oxynitride layer of a desired thickness. In other cases, the electrochemical procedure differs from the electrochemical reaction that the device is configured to implement. For instance, the electrochemical procedure may be or include a water splitting reaction, while the device is directed to implementing another reaction, such as $CO_2$ reduction.

Alternatively or additionally, the act 220 includes exposing the surface to oxygen in an act 224. In some cases, the exposure to oxygen occurs in an oxygen-containing reaction chamber, such as a plasma asher. Alternatively or additionally, the exposure involves the ambient environment. The exposure may last for a predetermined period of time, e.g., for a period of time on the order of minutes or on the order of hours, but other time periods may be used. The duration of the exposure may be selected to produce an oxynitride layer of a desired thickness. The duration of the exposure may be otherwise selected to establish the uniform distribution of the oxynitride material.

The incorporation of oxygen in the act 220 may alternatively or additionally include an act 226 in which an oxygen-containing material is deposited on the surface(s). For example, the oxygen-containing material may be composed of, or otherwise include, an oxide material, such as aluminum oxide, hafnium oxide, or an oxygen-containing ferroelectric layer (e.g., $HfZrO_2$), but other materials may be used.

The act 220 may include additional acts in combination with any one or more of the above-described techniques for exposing the surface to oxygen (or otherwise incorporating oxygen into the surface). In the example of FIG. 2, the act 220 includes implementation of one or more cleaning procedures or other surface treatments in an act 225. The surface is treated in the act 225 before exposure of the surface to oxygen (e.g., the act 224) or the deposition of an oxygen-containing layer (e.g., the act 226). In some cases, the act 225 includes an in-situ pre-cleaning procedure, such as a chemical treatment of the surface. Various chemicals may be used in the treatment(s), including, for instance, HF, buffered HF, and/or sulfuric acid. The act 225 may include an alternative or additional cleaning or treatment, such as an ultraviolet (UV) ozone treatment. Still other types of procedures may be used, including, for instance, other types of surface treatments that are configured to improve the interface at the surface.

The act 220 may alternatively or additionally include an act 227 in which the implementation of an anneal procedure. In some cases, the anneal may be implemented in an oxygen environment to provide a source of the oxygen. Alternatively, the anneal may follow the deposition of the oxygen-containing layer in the act 226 or other provision of oxygen to the surface(s). The anneal may be configured to incorporate the oxygen into the surface (e.g., via substitution in the lattice of the structure, etc.). The temperature of the annealing procedure may vary. For instance, the temperature may fall in a range from about 100° C. to about 500° C., but other temperatures may be used. The time period of the anneal may vary accordingly. The temperature, duration, and/or other characteristics of the procedure may be selected to establish the uniform distribution of the oxynitride material. In some cases, the anneal procedure may not involve an oxygen environment, e.g., when the oxygen is made available in another way, such as via deposition (e.g., deposition of an oxide material).

The oxidation of the surface may be enabled, enhanced or otherwise possible due to one or more aspects of the surface. For instance, the surface may be oriented along a non-polar plane of the semiconductor composition. In other cases, the surface is oriented along a polar plane. Alternatively or additionally, the semiconductor composition may be configured such that the oxidation reaction results in partial oxygen substitution of the nitrogen. In such cases, the nitrogen of the surface may be disposed in a compound semiconductor arrangement of the semiconductor composition. The semiconductor composition may have a Wurtzite crystal structure.

The method 200 may include an act 228 in which catalyst nanoparticles are deposited across the array of nanowires. For instance, catalyst nanoparticles may be deposited in photoelectrochemical examples, and may not be deposited in other applications, such as transistors and other electronic devices. The deposition of the nanoparticles may be achieved via implementation of a photo-deposition procedure in an act 230. The nanoparticles may be composed of, or otherwise include, a metal, such as platinum, or other metallic material. A drying act 232 may then be implemented. Further details regarding the photo-deposition procedures are set forth in one or more of the above-referenced U.S. patents. Alternatively or additionally, the act 228 includes the implementation of an electro-deposition procedure.

The amount of catalyst nanoparticles deposited in the act 228 may be reduced as a result of the formation of the oxynitride layer. As described below, The presence of the oxynitride layer allows a similar beneficial impact to be achieved with a lower amount of catalyst nanoparticles.

In some cases, the act 228 is implemented after the formation of the stabilizing layer in the act 220. In other cases, the act 228 is implemented before the formation of the stabilizing layer. Depositing the nanoparticles before the formation of the stabilizing layer may be useful in promoting the formation of the oxynitride material.

In some cases, the method 200 includes an act 234 in which one or more other device structures are formed. For instance, the structures may involve an interface stabilized by the stabilizing layer of the disclosed methods and devices. In one example, a passivation layer is deposited or otherwise formed. The stabilizing layer may thus be disposed between the passivation layer and the structure surface to be stabilized. In another example, a contact is formed in the act 234. The stabilizing layer may be disposed between the contact and structure surface to reduce contact resistance. The act 234 may alternatively or additionally be directed to the formation of any number of additional or alternative device structures, including, for instance, a backside contact.

The method 200 may include one or more additional acts directed to forming the photocatalytic structures of the device. For instance, one or more acts may be implemented to deposit catalyst nanoparticles across the array of nanowires. The deposition of the nanoparticles may be achieved via implementation of a photo-deposition procedure. The nanoparticles may be composed of, or otherwise include, a metal, such as platinum, or other metallic material. A drying act may then be implemented. Further details regarding the photo-deposition procedures are set forth in one or more of the above-referenced U.S. patents. Still other acts may include a procedure in which the photocatalytic structures of the device are annealed. The parameters of the anneal process may vary.

Figure 3:
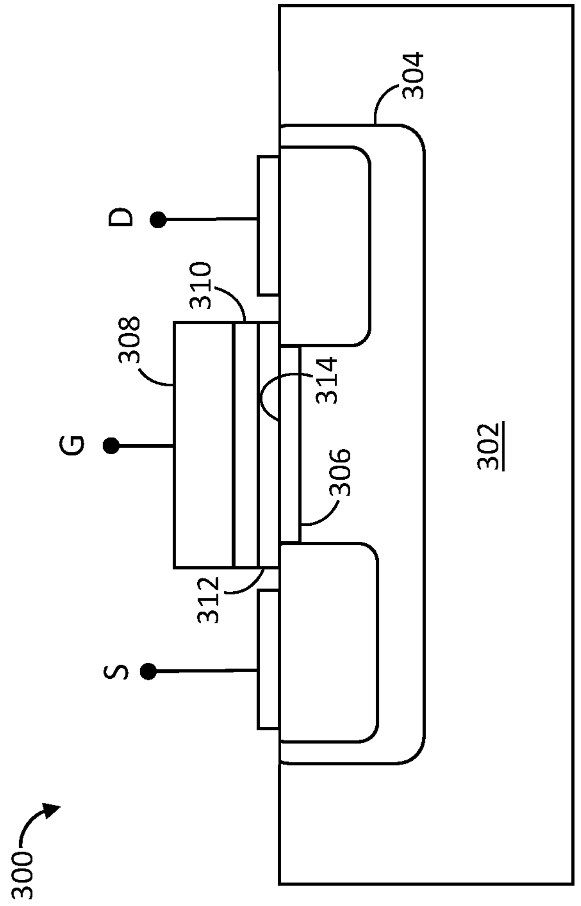
FIG. 3 is a schematic, cross-sectional view of an electronic device having a stabilizing layer in accordance with one example.

FIG. 3 depicts a device 300 having an interface stabilized in accordance with one example. The device 300 may be fabricated via the method 200 of FIG. 2, and/or another method. In this example, the device 300 is an electronic device configured as, or otherwise includes, a transistor. As a field effect transistor, one or more structures of the device 300 are subjected to high electric fields and may thus benefit from stabilization. In other cases, the stabilization may involve other types of structures and/or other contexts.

The device 300 includes a substrate 302, and a transistor body 304 supported by the substrate 302. In this example, the transistor body 304 is a region (e.g., a doped region) of the device 300. Alternatively or additionally, the transistor body 304 is a structure formed or otherwise disposed on the substrate 302. The transistor body 304 may thus be integrated with the substrate 302 to any desired extent. The manner in which the transistor body 304 is supported by the substrate 302 may vary accordingly.

The transistor body 304 includes a channel 306 or channel region having a semiconductor composition. The channel 306 may extend between source and drain regions of the device 300 as shown. The channel 306 may be formed during operation when a voltage G is applied to a gate 308 of the device 300. In some cases, the channel 306 is doped and/or otherwise configured differently relative to the remainder of the transistor body 304. The gate 308 is spaced from the channel 306 by a gate oxide layer 310. In some cases, the gate oxide layer 310 includes aluminum oxide, but additional or alternative oxide materials may be used, including, for instance, hafnium oxide, zirconium dioxide, strontium oxide, scandium oxide, lithium oxide, titanium oxide, tantalum oxide, tungsten oxide, and silicon oxide.

The channel 306 may be composed of, or otherwise include, additional or alternative semiconductor materials, including, for instance, AlGaN, GaN, InN, AlN, BN, and their alloys. The remainder of the transistor body 304 may or may not be composed of, or otherwise include, the same semiconductor material.

The device 300 includes a stabilizing layer 312 on a surface 314 of the channel 306. As described herein, the surface 314 includes nitrogen. For instance, the semiconductor composition of the channel 306 may be or include GaN. In some cases, the channel 306 is configured such that the surface 314 is nitrogen-terminated. In this example, the stabilizing layer 312 is configured as a protection or other passivation layer for the surface 314.

The stabilizing layer 312 may be or otherwise include a uniform distribution of an oxynitride material. In some cases, the oxynitride material is GaON. The uniform nature of the distribution may stabilize the interface between the channel 306 and the gate oxide layer 310. Such stability may be useful in connection with high voltage operation or other operational conditions in which the interface is subjected to high energy charge carriers and/or other damaging circumstances. In some cases, the oxynitride material is continuously distributed across the surface 314 (e.g., completely cover the entirety of the surface 314).

The stabilizing layer 312 may have a thickness that does not adversely affect the operation of the device 300. For instance, the stabilizing layer 312 may be thinner than the gate oxide layer 310. As described herein, the thickness of the stabilizing layer 312 may fall in a range from about one monolayer to a few monolayers in some cases. Other thicknesses may be used, including, for instance, various sub-nanometer thicknesses and thicknesses of about a few nanometers.

The components of the device 300 are schematically depicted in FIG. 3 for ease in illustration. The components in FIG. 3 and other schematic drawing figures referenced herein may thus not be shown to scale.

Details regarding examples of the above-described devices, systems, and methods are now provided in connection with FIGS. 4-8, which address examples of Si/GaN photocathodes configured for efficient and durable solar water splitting for, e.g., hydrogen production. The examples are described in an effort to explore the nature of Si/GaN architectures, along with the improvement of the photoelectrochemical performance of such architectures. In these examples, the improvement arises from the implementation of an electrochemical procedure, such as chronoamperometric testing. In other cases, one or more additional or alternative acts may be implemented to form the above-described oxynitride layer. The oxynitride layer leads to long-term stability of Si/GaN architectures (e.g., via an intermediate-related self-healing effect), and/or to a thermodynamically stable nature. Understanding these aspects of GaN overlayers establishes techniques for optimization of PEC cell, system, and other device performance.

The examples demonstrate that Si/GaN photocathodes are capable of generating sustained hydrogen production with approximate 100% Faradaic efficiency (FE) without the use of any electrocatalyst. Accelerated testing of the examples also demonstrates that the Si/GaN photocathodes are capable of sustaining high current density under intensified 3.5 suns illumination for more than 150 hours. As shown in the examples, under operating conditions, the photocurrent density and onset potential of Si/GaN photocathodes self-improve. A suite of advanced characterization techniques and first-principles calculations are used to elucidate the origins of this self-improving behavior. Under operating conditions, the Si/GaN photocathodes are subjected to a chemical transformation at the GaN surface that provides protection and enhances the PEC performance by adding active catalytic sites for hydrogen evolution reactions. In this way, these examples of Si protected photocathodes exhibit useful levels of stability and FE performance without the use of any electrocatalysts, as the result of a beneficial chemical transformation. The self-improving behavior and chemical transformation of the Si/GaN photocathodes provides useful devices and systems for hydrogen production in PEC water splitting.

To set a baseline for understanding the stability mechanism of the GaN overlayer, Si/GaN photocathodes were investigated under water reduction conditions. Iridium oxide (IrOx) is used as the counter electrode and graphite colloidal adhesive is used to connect the Si/GaN electrode to copper tape. This testing configuration prevents any metal contamination. Chronoamperometric (CA) tests were conducted on different samples under 1 sun intensity illumination. In all of the cases, the measured photocurrent undergoes an increase before it achieves a steady state. Interestingly, the calculated corresponding Faradaic efficiency (FE) also follows a similar enhancement, i.e., the FE starts from about 85 then achieves 100% once the photocurrent reaches its maximum, as shown in Part (a) of FIG. 4. Furthermore, only hydrogen and oxygen were produced during the CA testing. In contrast, the bare $n^+p$ silicon photocathode tested under same testing condition showed less than 0.1 $mA/cm^2$ photocurrent density. In addition, accelerated CA testing under AM 1.5G solar illumination at intensified 3.5 suns intensity was performed. While the photocurrent enhancement is still observed, this accelerated test further reveals that the Si/GaN photocathode is capable of sustaining more than 100 $mA/cm^2$ photocurrent density for more than 150 hours. This measurement demonstrates the stability of Si/GaN photocathode at a high photocurrent value and under concentrated illumination condition, as shown in Part (b) of FIG. 4. This J-E and photoelectrochemical characteristics appear to be the best reported for protected Si photocathodes, especially in the absence of a catalyst layer.

To provide further insight into the PEC performance enhancement, an intermittent 10 hour CA test was performed with linear sweep voltammetry (LSV) collected after each hour to track the changes in PEC performance, i.e. photocurrent density and onset potential. As shown in part (c) of FIG. 4, the photocurrent density versus applied potential (J-E) curve shows an anodic shift over time, with an onset potential shift of more than 300 mV, from about 460 mV vs reverse hydrogen electrode (RHE) to about 80 mV vs RHE. The as-prepared device is denoted as "CA-0h" herein, and the device tested for 10 hours is denoted as "CA-10h" herein. In addition, the maximum photocurrent density (J) gradually increases and reaches a saturation level of 25 $mA/cm^2$ after three hours.

To look into the underlying mechanism of this self-improving behavior, the changes of the surface resistance were analyzed by carrying out electrochemical impedance spectroscopy (EIS) at AM 1.5G 1 sun illumination. By evaluating the simulated equivalent circuit and the corresponding calculated results, the surface resistance ($R_{ct,surf}$) decreases from 600Ω to 100Ω. The dramatic variation of $R_{ct,surf}$ evidences that the charge transfer at the solid/liquid interface improves over time. In addition, Mott-Schottky analysis reveals that the flat band potential is similar after reaction, which suggests that the flat band position is determined by the $n^+p$ Si solar cell substrate in agreement with previous results. Given that the band alignment remains unchanged, while a significant change in $R_{ct,surf}$ and mild changes in other resistance (R) and constant phase element (CPE) values, the observed self-improving behavior is originated by an improvement of the surface kinetics of the GaN layer.

Figure 4:
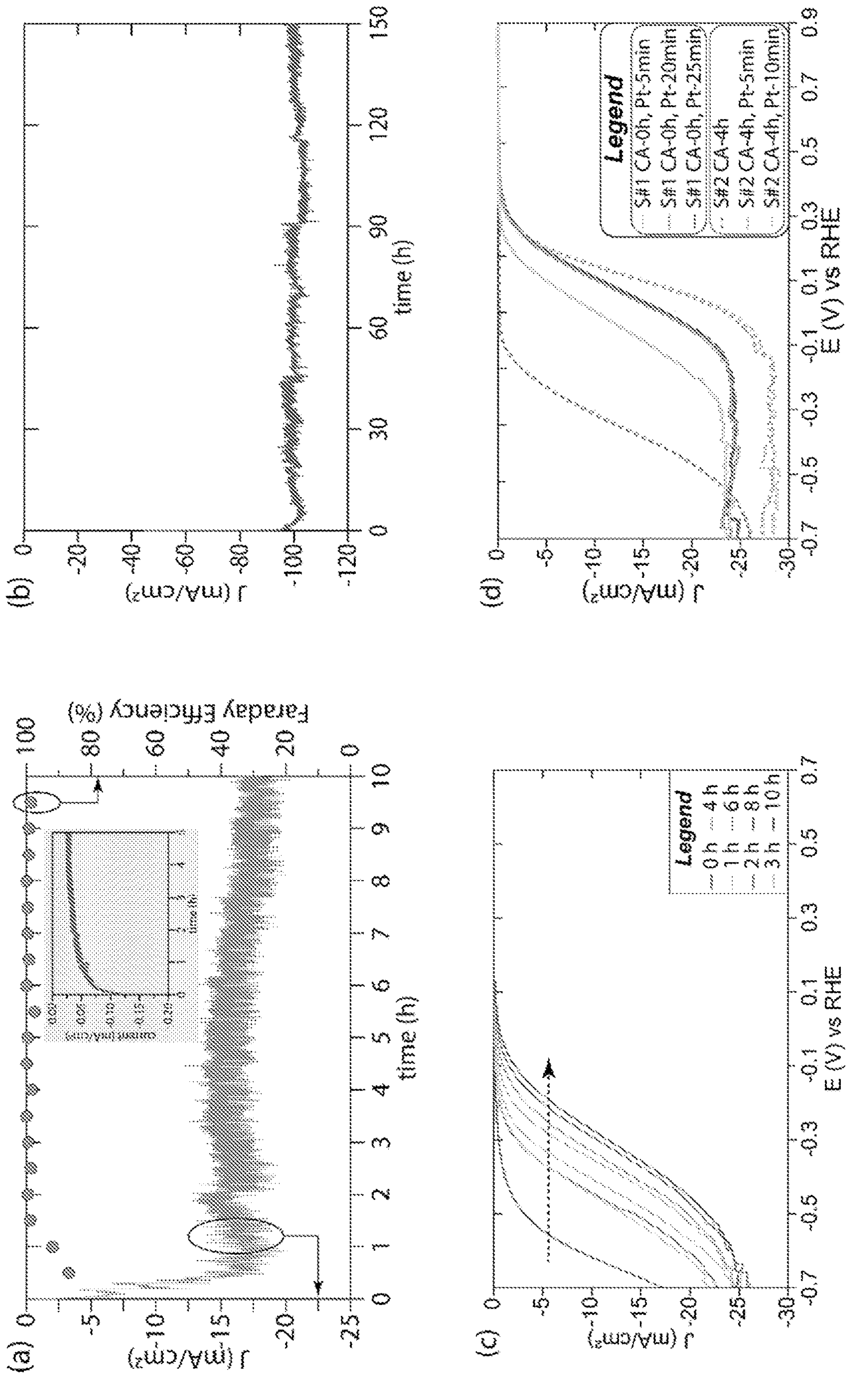
FIG. 4 depicts graphical plots of photocurrent density of a number of photocathodes, including photocathodes having an oxynitride layer for stabilizing surface activation in accordance with several examples.

The observed self-improving anodic shift of the onset potential and charge transfer improvement indicate an enhanced catalytic activity of the PEC tested GaN surface, which usually is obtained through the integration of a catalyst layer. Therefore, with the unique opportunity to improve device performance while decreasing (noble metal) catalyst loading, the direct integration of a platinum (Pt) catalyst onto the modified Si/GaN photocathode is investigated. A comparison between the as-prepared Si/GaN photocathode and the CA tested surface was conducted. The initial PEC performance of the as-prepared device was recorded by LSV scans. Then the CA testing was carried out for four hours to guarantee that the maximum current is achieved (see, e.g., parts (a)-(c) of FIG. 4, showing that improvement completes within first few hours). Pt was photo-deposited on both the four-hour CA tested device (denoted as S #2 CA-4h in part (d) of FIG. 4) and as-prepared cathode (denoted as S #1 CA-0h in FIG. 1*d*). As can be seen in FIG. 1*d*, the S #2 CA-4h only requires 5 minutes Pt deposition (S #2 CA-4h, Pt-5 min) to shift its turn-on voltage to 0.34 V. An additional 5 minutes of Pt deposition (S #2 CA-4h, Pt-10 min) has the J-E curve remain the same as the 5 min deposition case. In stark contrast, 20 minutes of Pt deposition is needed to shift the turn-on voltage to 0.34 V (S #1 CA-0h, Pt-20 min). That is, the required Pt loading is four times higher than the CA tested sample. Thus, it clearly proves that, with the CA tested surface, the use of a platinum catalyst may be lowered.

FIG. 4 depicts the self-improving behavior of the Si/GaN photocathodes. Part (a) shows 10 hours of CA testing under 1 sun illumination and a constant bias at −0.6 V vs RHE. The inset depicts the corresponding Faradaic efficiency, which reveals a self-improving nature of GaN. In comparison, CA testing was conducted on bare Si for 5 hours under 1 sun illumination and −0.6 V vs RHE. The bare Si photocathode rapidly drops down to about 0.05 mA/$cm^2$ within an hour. Part (b) of FIG. 4 depicts accelerated CA testing of a bare epilayer Si/GaN photocathode at constant bias of −0.6 V vs RHE under 3.5 sun illumination for 150 hours in 0.5 M $H_2SO_4$. Part (c) of FIG. 4 depicts photocurrent density versus applied electrochemical potential (J-E) curves as a function of CA testing time. Part (d) of FIG. 4 depicts several selected J-E curves of as-prepared Si/GaN photocathode (CA-0h) and four hour CA tested Si/GaN photocathodes (CA-4h) with different Pt photo-deposition durations under 1 sun illumination.

Figure 5:
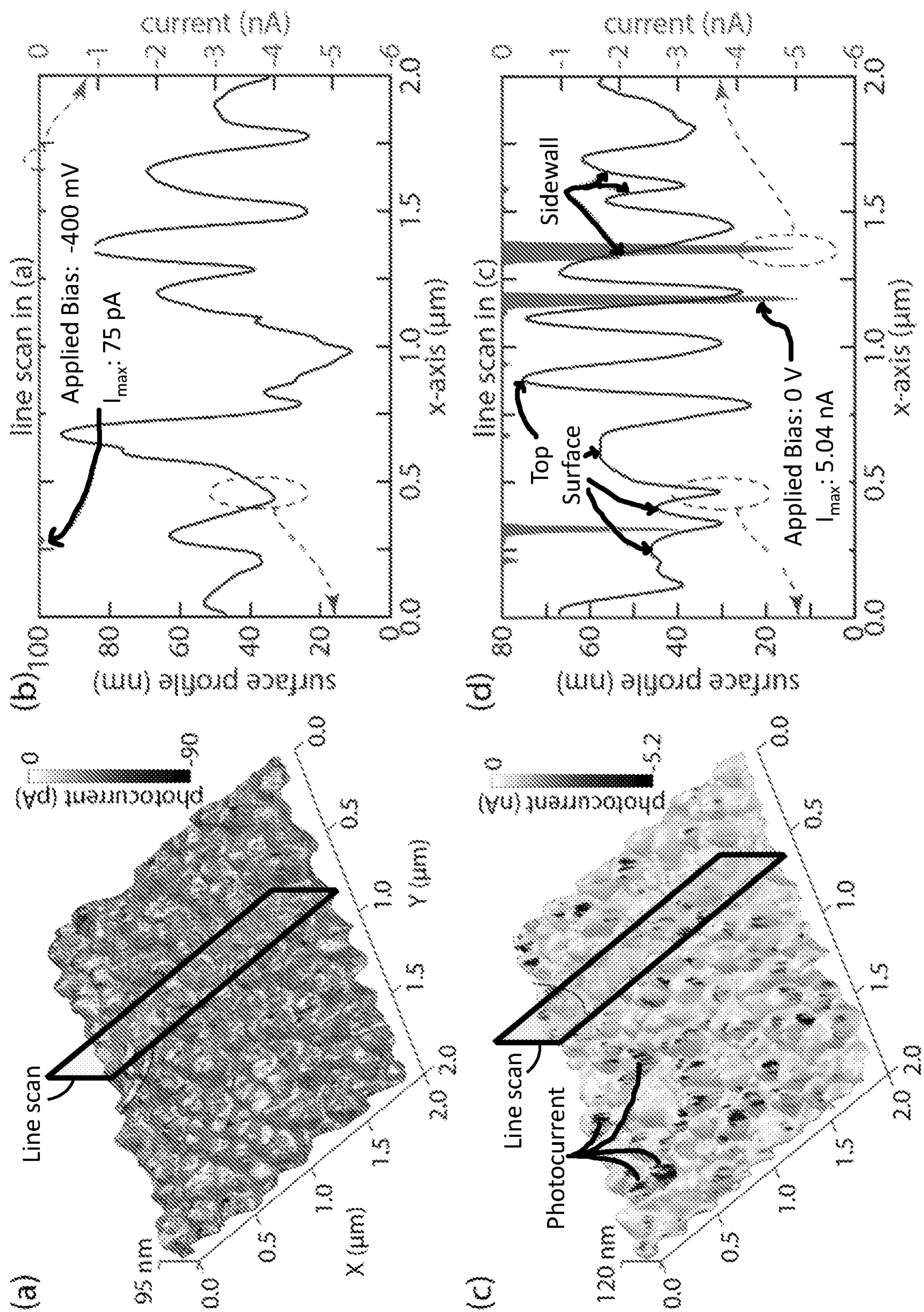
FIG. 5 depicts a topographical view of a photocathode without an oxynitride layer and a photocathode with an oxynitride layer for stabilizing surface activation in accordance with one example, along with graphical plots of the surface profile and photocurrent of the photocathodes.

Surface roughness change and formation of new chemical species are factors associated with PEC performance improvement. Thus, atomic force microscopy (AFM) analysis was performed, as well as scanning transmission electron microscopy combined with electron energy loss spectroscopy (STEM/EELS) and X-ray photoelectron spectroscopy to trace the origin of the observed PEC performance enhancement. Specifically, by performing photoconductive (pc-) AFM on both as-prepared ("CA-0h") and 10 hours CA tested ("CA-10h") examples, the surface topography was compared, as well as probe the nanoscale origin of the macroscopic photocurrent enhancement. The surface morphology remains similar for CA-0h and CA-10h surfaces with similar surface roughness of about 12 nm (as shown in Parts (a) and (c) of FIG. 5), which rules out the surface roughness variation induced PEC performance improvement. However, a significant difference in the photocurrent of the CA-0h and CA-10h examples was observed, as shown in FIG. 5. Overlaid topography-photocurrent maps showed that the CA-0h photocathode exhibited a maximum of about 80 pA at an applied bias of about 400 mV, whereas the CA-10h photocathode exhibited a maximum of about 5 nA without the need of an external bias (as shown in Parts (b) and (d) of FIG. 5). The line profiles of the two maps for each sample highlight that the enhanced photocurrent generation in the tested example is generated by the sidewalls of the grains, whereas the top of the grain barely contributes to the total photocurrent. Such location dependent photocurrent generation may be associated with exposed facets and crystal orientation.

FIG. 5 depicts pc-AFM characterization on CA-0h and CA-10h examples. The topography of the CA-0h example and the CA-10h example are shown in Parts (a) and (c). The corresponding surface profile and photocurrent extracted from the line scans for the CA-0h example and CA-10h example are shown in Parts (b) and (d).

Figure 6:
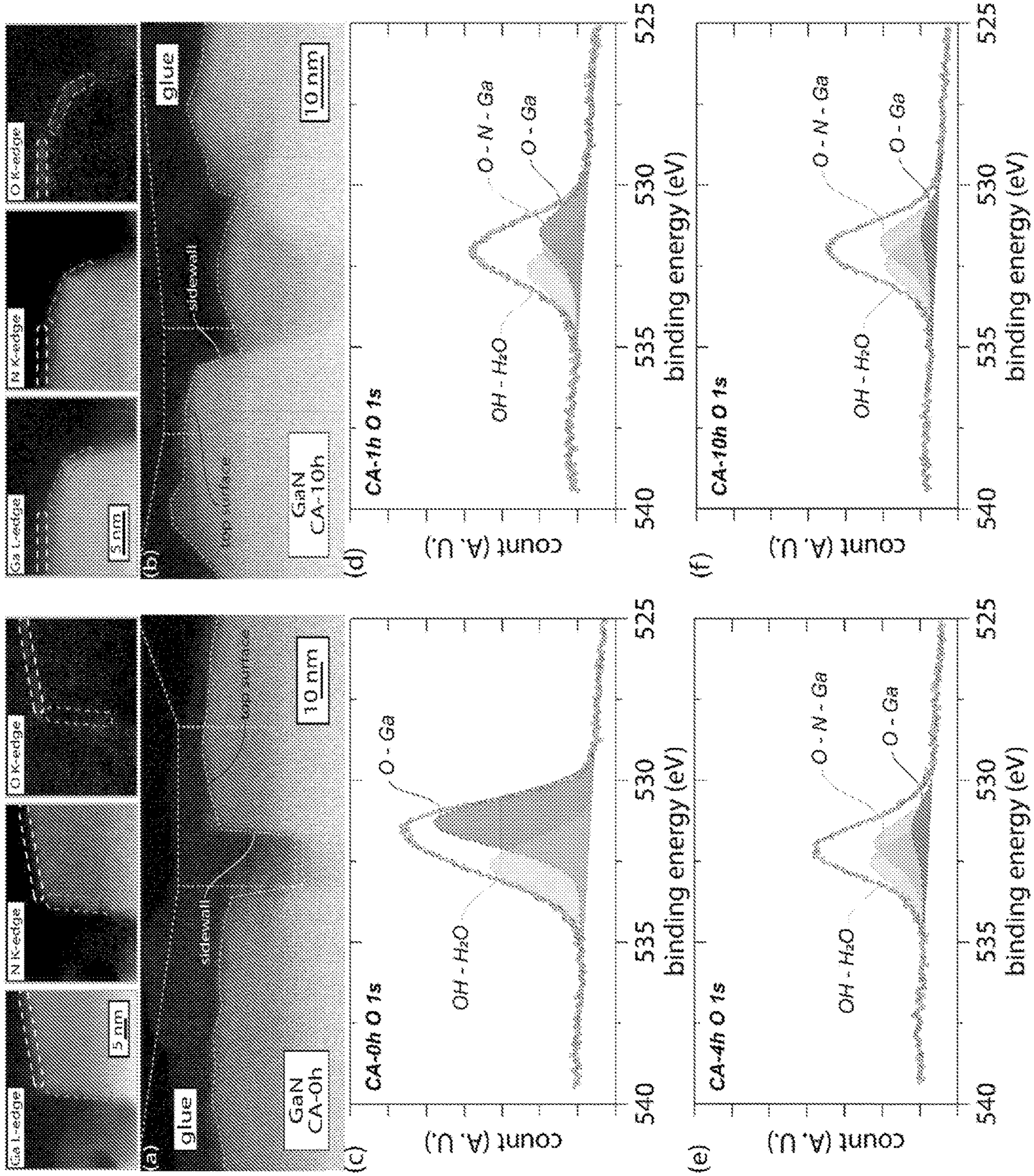
FIG. 6 depicts scanning transmission electron microscopy (STEM) images and electron energy loss spectroscopy (EELS) mappings of a photocathode without an oxynitride layer and a photocathode with an oxynitride layer for stabilizing surface activation in accordance with one example, along with graphical plots of chemical analyses of the photocathodes.

In order to understand how the tested example changed under operating conditions and the reason underlying the increased photocurrent at the sidewall of the GaN grains, aberration correction STEM/EELS was used to analyze crystal orientation combined with chemical information with less than 1 nm spatial resolution (as shown in Parts (a) and (b) of FIG. 6). A native oxide layer of about 2 nm (highlighted with white/light dashed line) was observed on the top surface of grain for the CA-0h sample, while less oxide (circled by red/dark dashed line) was found on the sidewall (Part (a) of FIG. 6). Interestingly, after 10 h of operation, formation of an approximately 1 nm layer mixed with Ga, N and O at the sidewall of grain is observed (area surrounded by red-dashed line in Part (b) of FIG. 6), while the top of grain is covered with Ga and O containing layer (no N was seen in the areas surrounded by white-dashed line in Part (b) of FIG. 6) and no apparent change in the composition. Epitaxial GaN film possesses a wurtzite crystal structure, where the top surface of the grain is a polar c-plane ($000\bar{1}$), while the sidewall of the grain should be a mix of non-polar ($10\bar{1}0$) m-plane and ($11\bar{2}0$) a-plane) and semi-polar planes (e.g., ($11\bar{2}2$), ($20\bar{2}1$), etc.). Given that polarity and orientation effects of GaN often give rise to different chemical, electrical, and mechanical responses to external stimulus, the accumulation of oxygen also has orientation preference, i.e., forming on the non-polar or semi-polar planes (sidewall of the grain) rather than on the polar c-plane (top surface of the grain) is thermodynamically favored.

FIG. 6 depicts chemical analysis of the Si/GaN photocathode surface. Part (a) shows a STEM image of a CA-0h surface with insets (left to right) showing the EELS mappings of Ga L-edge, N K-edge and O K-edge. Part (b) shows a STEM image of a CA-10h surface with insets (left to right) showing the EELS mappings of Ga L-edge, N K-edge and O K-edge. Parts (c)-(f) show O 1s core level spectra of (c) a CA-0h Si/GaN photocathode, (d) a Si/GaN photocathode after 1 hour CA testing, (e) Si/GaN photocathode after 4 hour CA testing, and (f) a Si/GaN photocathode after 10 hour CA testing.

By connecting the STEM/EELS results to the increased photocurrent and anodic shift of the onset potential, an oxygen-containing GaN phase is found to have formed. This finding was readily confirmed by XPS. In addition to the as-prepared example, three different Si/GaN photocathodes were analyzed after 1 h, 4 h and 10 h of chronoamperometric testing (CA-1h, CA-4h, and CA-10h). The XPS spectra of the as-prepared and tested examples show similar Ga 2p and N 1s core levels spectra and high signal-to-noise ratio, irrespectively of the length of the test. In contrast, more insights are gained from O 1s spectra (Parts (c)-(f) of FIG. 6). In addition to OH-based and O—Ga—O species, by looking closer at the O 1s peaks, a new peak is emerging at 531.7 eV. This specific binding energy is representative of gallium oxynitride. Furthermore, compared to Ga 2p and N 1s spectra, the signal-to-noise ratio of O 1s spectra is significantly lower. Given that the probing depth of XPS for GaN is about 5-6 nm, such difference in signal-to-noise ratio between O 1s and Ga 2p (or N 1s) suggests that all the samples are dominantly composed of GaN, while only an ultra-thin layer of oxynitride is present at the surface. Considering that pc-AFM (Part (c) of FIG. 5) shows orders of magnitude enhancement of the photocurrent that generated from the sidewall, while barely no current was detected from the top surface of the grain, such oxynitride visualized on the sidewall of the GaN grain leads to the self-improving behavior.

Figure 8:
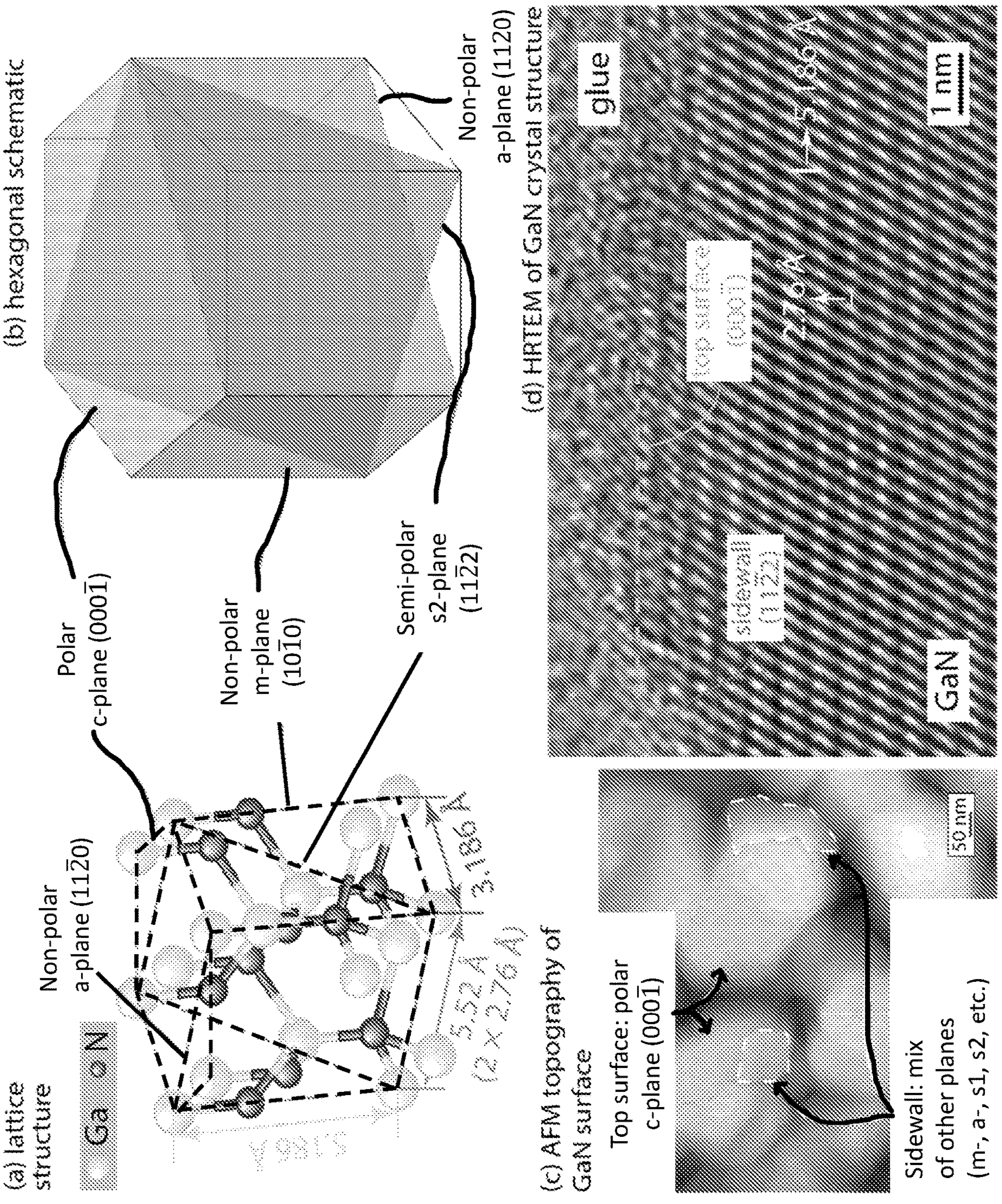
FIG. 8 depicts a schematic view of the Wurtzite structure of gallium nitride, and a schematic view of planes of the Wurtzite structure of gallium nitride, along with atomic force microscopy (AFM) and high resolution transmission electron microscopy (HRTEM) images of gallium nitride surfaces.

To better understand how the experimental observation of the self-improving PEC performance as well as the sustained operation of Si/GaN photocathodes correlate to the presence of gallium oxynitride, density functional theory (DFT) calculations for different GaN surfaces were performed. The top surface of the example is $(000\bar{1})$, whereas the sidewall of the grain consists of semi-polar and non-polar planes. For simplicity, the simulations were carried out for the $(000\bar{1})$ c-plane and $(10\bar{1}0)$ m-plane that represent the top and sidewall of the system, respectively. FIG. 8 shows the GaN crystal structure.

The role of oxygens on the stability of GaN was explored with several representative surface models and the formation energy thereof. For the (0001) orientation, a full replacement of nitrogen atoms of either surface or subsurface bilayers by oxygens was found (red and green lines, FIG. 7, Part (a)), which leads to a higher stability compared to the as-prepared surface. The same conclusion was achieved when nitrogen in these bilayers is simultaneously but partly (50%) replaced by oxygens (blue line, FIG. 7, part (a). Overall, the configuration with all surface nitrogen substituted by oxygens exhibits the highest stability. This is consistent with current STEM results that indicate a strong likelihood to form an oxide layer on the topmost $(000\bar{1})$ surface.

The calculations show that the effect of oxygen substitution is rather different for the non-polar $(10\bar{1}0)$ surface. For this orientation, the most stable structure is instead obtained by partial oxygen substitution (50%) of nitrogen in both surface and subsurface bilayers (blue line, FIG. 7, Part (b)). A higher stability of this structure over the one with all the surface nitrogen replaced by oxygens is related to the ability to form surface Ga with a higher oxygen coordination (1.5 versus 1.0). The calculations suggest that the topmost layers of the $(10\bar{1}0)$ orientation favor a mixture of all three species (Ga, O, N), in stark contrast to the $(000\bar{1})$ orientation where they are more likely to consist of Ga and O only. Surface charge localization and hopping can thus lead to the formation of N—O species and gallium oxynitride on the non-polar plane. It also supports STEM/EELS evidence that gallium oxynitride-like composition is more likely to form on the side wall of GaN grains.

Catalytic activity was then assessed. The free energy of adsorption of hydrogen is the reaction intermediate for both HER and HOR. The absolute magnitude of the free energy of H adsorption ($|\Delta G_{ads}| \approx 0$) is minimized to maximize the reaction. Here, examination of adsorption sites of the most stable surface of the non-polar plane (blue line, FIG. 7, Part (b)) shows that $|\Delta G_{ads}|$ yields a value of 0.12-0.16 eV on Ga, as compared to a corresponding value of 1.07 eV obtained for the pristine surface. On the other hand, N-sites of the two surfaces yield a similar $|\Delta G_{ads}|$ of 0.31-0.39 eV. The results show that the surface with partial nitrogen substituted by oxygens is more active than the pristine one, indicating that transformation in the surface composition is likely responsible for the improved performance of the GaN-protected photocathode.

Figure 7:
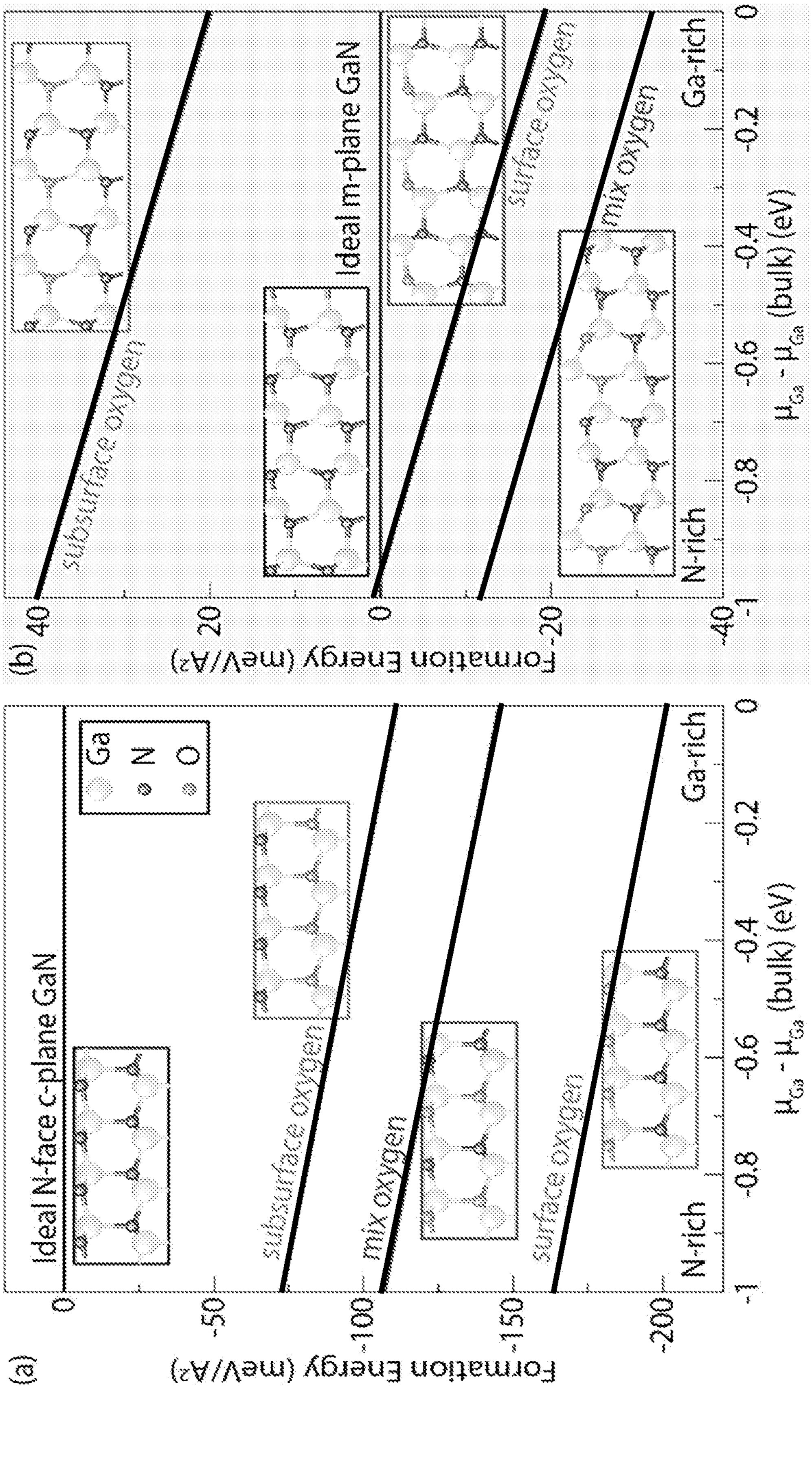
FIG. 7 depicts graphical plots of formation energy of gallium nitride surfaces with varying degrees of replacement of nitrogen by oxygen, along with schematic views of the chemical configuration of the gallium nitride surfaces.

FIG. 7 depicts DFT calculations on the N-polar c-plane and the non-polar m-plane. Parts (a) and (b) show the calculated formation energy of the $(000\bar{1})$ c-plane and the $(10\bar{1}0)$ m-plane GaN surfaces with different oxygen configuration within the anion and cation-rich limits: ideal GaN surfaces of c-plane and m-plane; configurations with 100% replacement of nitrogen by oxygen on the surface c-plane and m-plane; 100% replacement of nitrogen by oxygen in the subsurface bilayer c-plane and m-plane; and configurations with 50% replacement of nitrogen of the surface and subsurface bilayers by oxygens c-plane and m-plane. In both cases, the ideal surface is chosen as the reference.

To advance the application of solar water splitting for renewable energy, work has been directed to the development of cutting-edge coatings for long-term stability and high efficiency. As described herein, Si/GaN photocathodes are capable of sustained hydrogen production with 150 h stability under 3.5 suns and a FE of about 100% without electrocatalysts. By employing pc-AFM, STEM/EELS and XPS characterization techniques, the presence of a thin oxynitride-like layer is shown, which forms over time on Si/GaN photocathodes within the first few hours of operation. Such gallium oxynitride, as well as many other widely reported oxynitrides (TaON, HfON, perovskite oxynitride, etc.), have the hybridization of N 2p and O 2p orbitals and possess good catalytic properties. The gallium oxynitride is capable of providing an electrocatalyst role by better mediation of charge transfer. The DFT simulation results were in line with the experiments that replacing the nitrogen atoms by oxygen to form oxynitride can passivate the surface for further stability, whereas the newly formed oxynitride can also provide more active sites for HER, leading to improved PEC performance. GaN is thus established as a stable and efficient protective layer via formation of oxynitride during hydrogen production.

FIG. 8 illustrates the wurtzite structure of GaN. Part (a) depicts the wurtzite lattice structure of GaN, with polar c-plane on top and non-polar m- and a-planes on the side. Part (b) shows the hexagonal schematic of GaN wurtzite structure. Part (c) assigns the crystal planes to the actual GaN grains, with top surface of the grains being c-plane, and the sidewall of the grains being mixed of other planes. Part (d) shows HRTEM images that reveal the crystal structure of MBE-grown GaN used in the disclosed methods and devices.

Figure 9:
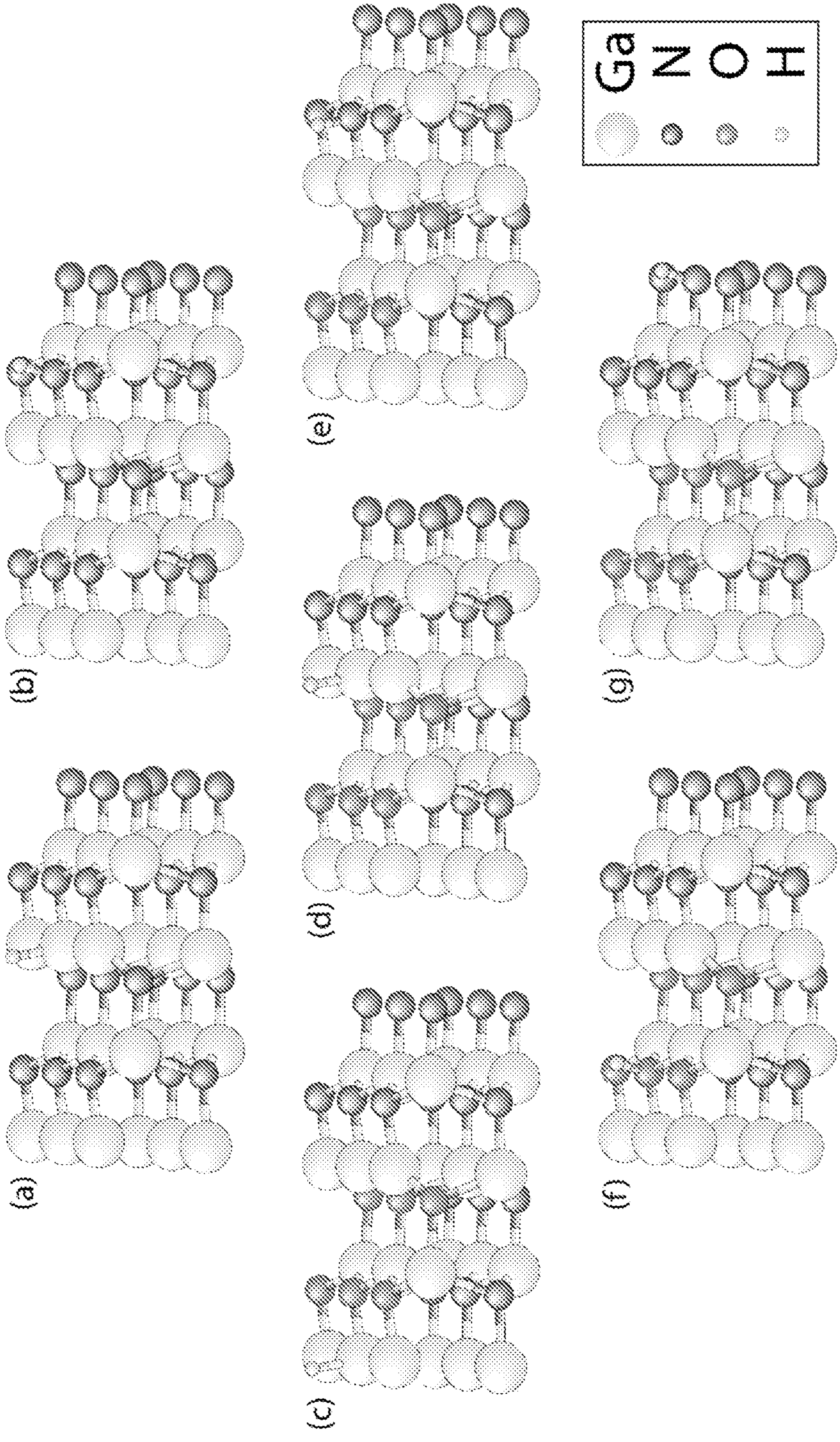
FIG. 9 depicts schematic views of chemical configurations of gallium nitride and gallium oxynitride surfaces for density function theory (DFT) simulations.

FIG. 9 schematically depicts DFT configurations for the above-referenced free energy calculations. Part (a) shows an ideal m-plane GaN with a hydrogen atom bonding to a gallium atom. Part (b) shows an ideal m-plane GaN with a hydrogen atom bonding to a nitrogen atom. Part (c) shows gallium oxynitride forming at m-plan GaN with a hydrogen atom bonding to a gallium atom that associated with oxygen. Part (d) shows gallium oxynitride forming at m-plan GaN with a hydrogen atom bonding to a gallium atom that associated with nitrogen. Part (e) shows gallium oxynitride forming at m-plan GaN with a hydrogen atom bonding to a nitrogen atom. Part (f) shows gallium oxynitride forming at m-plan GaN with a hydrogen atom bonding to an oxygen atom. Part (g) shows gallium oxynitride forming at m-plan GaN with a hydrogen atom bonding to a subsurface nitrogen atom.

Figure 10:
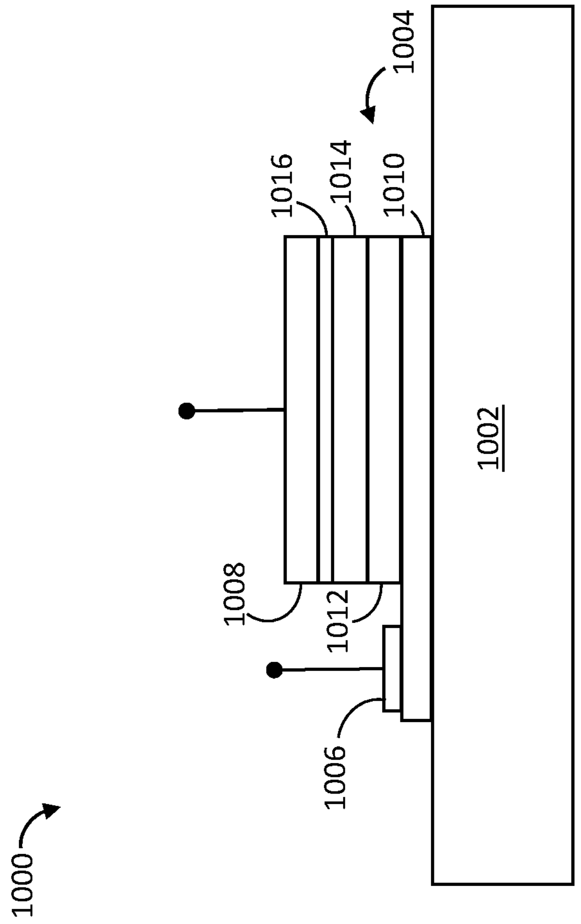
FIG. 10 is a schematic, cross-sectional view of a light emitting device having a stabilizing layer in accordance with one example.

FIG. 10 depicts a light emitting device 1000 in accordance with one example. The device 1000 may be fabricated via the method 200 of FIG. 2 and/or another method. In this case, the device 1000 is configured as a light emitting diode. The device 1000 includes a substrate 1002, and a structure 1004 having a semiconductor composition supported by the substrate 1002. The substrate 1002 may or may not be composed of, or otherwise include, a semiconductor material. For instance, the substrate 1002 may be or include a sapphire substrate.

In this case, the structure 1004 corresponds with, or otherwise includes, a stack of semiconductor layers configured for light emission. For example, one or more of the semiconductor layers in the stack may be composed of, or otherwise include, GaN, InGaN, and/or other III-V semiconductor materials.

The device 1000 further includes electrodes 1006, 1008 for applying a voltage across the stack of semiconductor layers. One of the electrodes 1006 may be configured as an n-metal contact, while the other electrode 1008 may be configured as an p-metal contact. The positions of the p-metal and n-metal contacts may be switched and otherwise vary.

In this example, the stack includes an n-type layer 1010, an active layer 1012, and a p-type layer 1014. The active layer 1012 is disposed between the n-type and p-type layers 1010, 1014. Each of the n-type and p-type layers 1010, 1014 may be configured as current conduction layers of the device 1000. The stack of semiconductor layers may include any number of semiconductor layers. For instance, additional layers may include one or more buffer layers, and/or one or more additional active layers.

The stack of semiconductor layers and, thus, the structure 1004 has a surface at which nitrogen is present. In this example, the surface corresponds with an upper surface of the p-type layer 1014. For instance, the p-type layer may be composed of, or otherwise include, GaN and/or another III-nitride semiconductor, although nitrogen may be present at the surface for additional or alternative reasons.

The device 1000 includes a stabilizing layer 1016 disposed on the surface of the p-type layer 1014. The stabilizing layer 1016 may be configured as described herein. For instance, the stabilizing layer may include a uniform distribution of an oxynitride material. In this case, the stabilizing layer 1016 is disposed adjacent to, and in contact with, the metal contact layer 1008 (e.g., the p-metal contact layer). The stabilizing layer 1016 is disposed along an interface between the metal contact layer 1008 and the stack of semiconductor layers to reduce contact resistance at the interface. In some cases, the oxynitride material of the stabilizing layer 1016 is continuously distributed across the surface of the p-type layer 1014 (e.g., continuously covers the entirety of the p-type layer 1014).

Alternatively or additionally, the stabilizing layer 1016 (or a section thereof) is disposed along an interface between the metal contact layer 1006 and the n-type layer 1010. The contact resistance may thus be reduced at the other contact of the device 1000 and/or both contacts.

Figure 11:
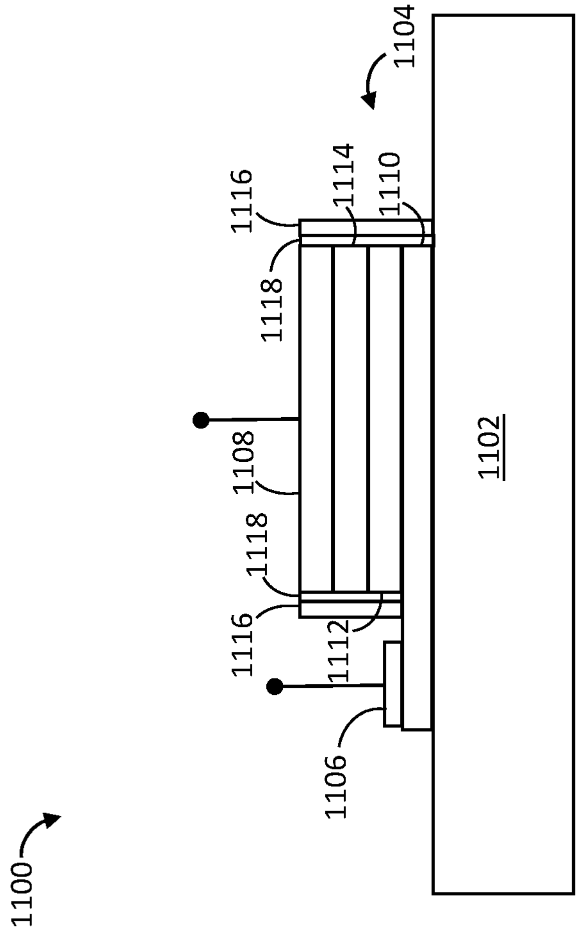
FIG. 11 is a schematic, cross-sectional view of a light emitting device having a stabilizing layer in accordance with another example.

FIG. 11 depicts a light emitting device 1100 in accordance with one example. The device 1100 may be fabricated via the method 200 of FIG. 2 and/or another method. In this case, the device 1100 is configured as a light emitting diode. The device 1100 may be configured as described above in connection with the example of FIG. 10 in one or more ways. For instance, the device 1100 includes a substrate 1102, and a structure 1104 having a semiconductor composition supported by the substrate 1102. The substrate 1102 and the structure 1104 may have one or more aspects in common with the example of FIG. 10. For example, the structure 1004 corresponds with, or otherwise includes, a stack of semiconductor layers configured for light emission.

The device 1100 further includes electrodes 1106, 1108 for applying a voltage across the stack of semiconductor layers. One of the electrodes 1106 may be configured as an n-metal contact, while the other electrode 1108 may be configured as an p-metal contact. The positions of the p-metal and n-metal contacts may be switched and otherwise vary.

As described above, the stack includes an n-type layer 1110, an active layer 1112, and a p-type layer 1114. The active layer 1112 is disposed between the n-type and p-type layers 1110, 1114. Each of the n-type and p-type layers 1110, 1114 may be configured as current conduction layers of the device 1100. The stack of semiconductor layers may include any number of semiconductor layers. For instance, additional layers may include one or more buffer layers, and/or one or more additional active layers.

The stack of semiconductor layers and, thus, the structure 1104 has a surface at which nitrogen is present. In this example, the surface corresponds with sidewalls of one or more of the semiconductor layers of the stack. For instance, each one of the n-type layer 1110, the active layer 1112, and the p-type layer 1114 may be composed of, or otherwise include, GaN and/or another III-nitride semiconductor, although nitrogen may be present at the surface for additional or alternative reasons. In this light emitting device example, the sidewall surface(s) may be a polar surface. In other examples (e.g., transistor devices), the sidewall surface (s) may be a non-polar surface.

The device 1100 includes a passivation layer 1116 disposed along the sidewalls of one or more of the layers of the stack. For example, the passivation layer 1116 may be or include a dielectric material, such as an oxide material. Additional or alternative non-conductive materials may be used. In this example, the passivation layer 1116 is disposed along each sidewall of the stack such that the entirety of each layer is passivated by the passivation layer 1116.

The device 1100 includes a stabilizing layer 1118 disposed between the passivation layer 1116 and the sidewall surfaces of the stack. The stabilizing layer 1118 may be configured as described herein. For instance, the stabilizing layer 1118 includes a uniform distribution of an oxynitride material. In this example, the stabilizing layer 1118 is disposed adjacent to, and in contact with, each sidewall of the stack. The stabilizing layer 1118 is thus disposed along an interface between the stack and the passivation layer 1116 to stabilize the interface between the active layer (and/or other layers of the stack) and the passivation layer and/or to reduce surface recombination. In some cases, the oxynitride material of the stabilizing layer 1118 is continuously distributed across the sidewall surfaces of the stack (e.g., continuously covering the entirety of each sidewall surface of the stack). The stabilizing layer may thus suppress surface traps and/or address other imperfections along the interface.

In this example, the stabilizing layer is disposed along the sidewalls of each layer in the semiconductor stack. In other cases, the stabilizing layer 1118 (or a section thereof) is disposed along the interface between a subset of the layers in the stack. For example, the stabilizing layer 1118 may be disposed along the sidewall(s) of only the active layer of the stack.

The devices 1000 and 1100 of FIGS. 10 and 11 may include additional, fewer, or alternative structures, layers, or other elements. For instance, the stabilizing layer(s) 1016 of the device 1000 of FIG. 10 may be incorporated into the device 1100 to reduce contact resistance at one or both of the electrodes 1106, 1108.

As described above, efficient yet durable photoelectrodes and other devices are fabricated. In solar-fuel production examples involving silicon/gallium nitride photocathodes active for hydrogen production, a thin layer of gallium oxynitride forms on the sidewalls of the gallium nitride grains, via a partial oxygen substitution at nitrogen sites. The thin layer establishes a higher density of catalytic sites for the hydrogen evolving reaction. The chemical transformation of gallium nitride into gallium oxynitride leads to sustained operation and enhanced catalytic activity, thus showing the promise for oxynitride layers as protective catalytic coatings for hydrogen evolution and other reactions.

Further details are set forth below regarding crystallographic-based aspects and effects of nanostructures, such as III-nitride nanostructures (e.g., GaN nanowires and other nanostructures). The crystallographic-based aspects and effects may be useful and/or provided in connection with PEC devices and systems for various types of reactions, as well as other types of devices.

The crystallographic aspects and effects of the disclosed devices may be useful in addressing the efficiency, stability, and product selectivity challenges for artificial photosynthesis. The disclosed devices may accordingly avoid the tradeoff between stability and efficiency. Past high efficiency solar water splitting devices generally exhibit very short lifetime, whereas devices with long-term stability have shown low efficiency. The disclosed devices may also be useful in supporting selective production of target products, which has remained difficult to achieve, with, for example, very low faradaic efficiency of light-driven chemical transformation of $CO_2$ and $CH_4$ to liquid chemicals and fuels to date. The crystallographic aspects and effects of the disclosed devices involve configuring the surface of the photoelectrode. Because the reactions are carried on the surface of the photoelectrode, tuning the surface structure of the photoelectrode provides one of the most effective means to address these fundamental challenges. The facet(s) exposed at the surface play a useful role in determining electronic and catalytic activity, including redox reaction sites, adsorption of chemical species, and desorption of product molecules. In addition, due to the diversity in the arrangement of atoms, facets strongly impact charge carrier separation, extraction and recombination, electrical conductivity, and resistance to photocorrosion and oxidation, all of which are useful factors for achieving efficient and stable artificial photosynthesis and other chemical reactions.

Although described in connection with water splitting examples, the crystallographic-based aspects and effects may be useful in connection with a broad range of artificial photosynthesis chemical reactions.

As described above, III-nitride semiconductor nanostructures, e.g., Ga(In)N nanowires, are useful for applications in artificial photosynthesis. Ga(In)N nanostructures are the only known group III-V compound semiconductors whose energy bandgap can be tuned across nearly the entire solar spectrum while straddling a broad range of redox potentials under visible and near-infrared light irradiation, which is useful for high efficiency artificial photosynthesis.

In some cases, the disclosed devices are configured as photoelectrodes made of III-nitride nanowires. III-nitride nanowires have demonstrated stable and efficient operation for 3,000 hours without any performance degradation. The III-nitride nanowire-based photoelectrodes may be used in various reactions, including, for instance, $CO_2$ reduction to syngas, formic acid, and methane, each with relatively high Faradaic efficiency. Other chemical reactions may be supported, including, for instance, light driven conversion of $CH_4$ into aromatic compounds using gallium nitride (GaN) nanowires.

As described below, the crystallographic aspects of III-nitride nanostructures may be used to improve catalytic and other performance measures. Previous studies have been largely focused on the effects of composition, size, and doping of GaN-based structures on their catalytic performance. Wurtzite III-nitride nanostructures, however, have different facets, e.g., polar vs. nonpolar vs. semipolar, and different polarities, e.g., metal-polar vs. nitrogen polar, which have very different structural, chemical, electrical, and polarization properties. To date, the role of crystal facet and polarity of III-nitride nanostructures on photoelectrochemical reactions has remained largely unknown. The relationship between the crystal facets and catalytic and electrical activity is accordingly addressed below. It is shown that significant activity (e.g., photoelectrochemical activity) is observed at the nonpolar surfaces (e.g., when the nonpolar surfaces are exposed to an electrolyte), whereas little to no activity is measured at the polar (e.g., c-plane) surfaces (e.g., when only the polar surfaces are exposed to the electrolyte), thereby enabling the rational design, synthesis, and practical application of next-generation metal-nitride semiconductor photoelectrodes and other devices.

Although described in connection with GaN nanostructures, the disclosed devices and methods may use a wide variety of semiconductor materials. The disclosed devices and methods are accordingly not limited to III-nitride semiconductors. For instance, the disclosed devices may include one or more layers, components or other elements composed of, or otherwise including, various nitrogen-containing semiconductors and/or various oxygen-containing semiconductors.

Described below are a number of examples that analyze the effect of facet and surface polarity of wurtzite III-nitrides on their photoelectrochemical (PEC) activities, e.g., solar water splitting. To identify unambiguously the impact of facets with different polarities, a number of example III-nitride nanostructures were fabricated by both top-down and bottom-up methods, thereby exposing selectively certain facets/surfaces to the electrolyte and compare their PEC activities. In addition, to rule out any variations in light absorption and alloy composition associated with nanostructure engineering, GaN layers were grown directly on a Si p-n wafer as a platform that serves as the primary light absorber. In these examples, the light absorption and photogenerated electron density in the GaN nanostructures remained nearly the same regardless of variations in their facet and surface polarity.

The examples show that the nonpolar GaN surfaces are significantly more active than the polar surfaces for the PEC reaction. The atomic origin of such behavior is further revealed through detailed density functional theory (DFT) calculations set forth below.

The examples show the unique formation of oxynitrides on the nonpolar plane, but not the c-plane, during the PEC reaction. The presence of oxynitride leads to a positive surface polarization and significant downward band bending, which can drastically enhance charge carrier (electron) extraction. The examples also provide useful insight and guidelines on crystal facet engineering of the emerging metal-nitride photocatalysts and photoelectrodes for a broad range of artificial photosynthesis chemical reactions.

In a first set of examples, GaN epilayers were grown on a Si p-n wafer using plasma-assisted molecular beam epitaxy (MBE). To date, the growth of GaN epilayers directly on Si wafer has remained extremely challenging due to the large lattice mismatch (about 17%) and the large difference in thermal expansion coefficients. Previously, various methods, including an AlN seed layer, an AlGaN/GaN defect filtering layer, a low temperature AlN interlayer, and a SiC intermediate layer, have been employed to improve GaN epilayer quality. These growth techniques, however, are not suitable for the present examples because large bandgap buffer layers would act as charge carrier transfer barriers between the Si wafer and the GaN epilayer, and thus degrade the PEC performance.

Moreover, previous studies have focused on GaN growth on Si (111) substrates, with few demonstrations of GaN epilayers on Si (100) wafers, which are required for direct integration with Si p-n junctions. To overcome these challenges, the examples used optimized growth conditions to realize GaN quasi-epilayer structures on the Si p-n wafers through controlled nanowire coalescence. The growth temperature was about 640° C. with a nitrogen flow rate of 0.4 sccm. The Ga beam equivalent pressure was about 1.6e-7 Torr, corresponding to a growth rate of about 120 nm/h.

The quasi-film structures preferentially grow along the c-plane direction. For such structures, the top GaN c-plane is thus the surface predominantly exposed to the electrolyte, whereas the non-polar planes are kept unexposed. To compare the effects of polar and non-polar planes, two samples were prepared, Sample A and Sample B. Sample A was an as-grown quasi-epilayer, while Sample B was patterned by photolithography and etching of the quasi-epilayer to expose the non-polar surfaces, in this case, sidewalls. With exposed sidewalls, photoexcited electrons can migrate to the GaN nonpolar surfaces and reduce protons to hydrogen. On the other hand, without such exposed sidewalls, electrons have to migrate to the top c-plane surfaces for proton reduction reaction. The photolithography and etching are schematically illustrated in part (a) of FIG. 12.

Part (b) of FIG. 12 shows scanning electron microscopy that confirms that Ga-polar quasi-films have achieved good coalescence, exposing only the top c-plane. The resulting patterned samples have a polar c-plane as the top surface and non-polar m-planes at the sidewalls. The etching process did not expose the underlying Si wafer. For both samples, the simulated solar irradiance was absorbed by the underlying Si p-n junction. Due to the near-perfect conduction band alignment between GaN and Si, photo-generated electrons can readily migrate to GaN to drive hydrogen evolution reaction (see part (c) of FIG. 12), whereas holes transport to the counter electrode for water oxidation. For Sample A, the dominant reaction surface is the top c-plane, whereas the lateral nonpolar surfaces dominate for Sample B. The inset of part (c) of FIG. 12 depicts the wurtzite structure of GaN with a top surface of polar c-plane and sidewalls of non-polar m-plane.

PEC characterizations were performed in a three-electrode setting consisting of the GaN/Si photocathode, an Ag/AgCl reference electrode, and an $IrO_x$ counter electrode in 0.5 M $H_2SO_4$ under AM1.5G one-sun illumination. Pt co-catalyst nanoparticles were deposited on the GaN/Si photocathodes via photodeposition. The linear scan voltammetry (LSV) measurements were performed from 0.6 to about 0.3 V vs. RHE with a scan rate of 100 mV/s. Although a high photocurrent density (up to about 40 mA/$cm^2$) is expected from a Si p-n junction under AM1.5G one-sun illumination, Sample A exhibited no measurable photocurrent density, suggesting that the Ga-face c-plane GaN is not very photoelectrochemically active (see part (a) of FIG. 13). In contrast, Sample B showed a photoresponse with an onset potential (V on) of about 0.45 V vs. RHE and a saturation photocurrent density of about 18 mA/$cm^2$. The photoresponse ($J_{photo}$) is given by the difference in current density between illuminated and dark conditions. Detailed measurements further confirmed that Sample B exhibited stable hydrogen production with a faradaic efficiency of about 100% (see part (b) of FIG. 13). Given that Sample A and Sample B are nearly identical except that Sample B has nonpolar surfaces exposed to the electrolyte, the analysis indicates that the nonpolar surfaces of GaN are the active facets for the PEC reaction.

With reference now to FIG. 14, the charge transfer resistance at the GaN/electrolyte interface was measured with electrochemical impedance spectroscopy (EIS) (see part (a) of FIG. 14). The EIS curves were taken with an initial frequency of 2 MHz and final frequency of 0.5 Hz at a DC bias of 0.2 V vs. RHE with a perturbation AC voltage amplitude of 10 mV. The Nyquist plots under AM1.5G one-sun illumination for both samples present two semicircles: one due to internal device resistance, and the other due to interfacial charge transfer resistance between the photoelectrode and the electrolyte. The radii of the first semicircles are similar between Samples A and B (as the samples are identical in device structure), while the radius of the second semicircle for Sample B is much smaller than that for Sample A. The difference in the radius of the second semicircle confirms that charge transfer at the GaN/electrolyte interface is significantly reduced for Sample B compared to Sample A due to the presence of abundant nonpolar surfaces. Mott-Schottky (MS) measurements (see part (b) of FIG. 14) were also taken to investigate the band alignment and surface band bending between the GaN and the electrolyte in dark with an AC perturbation of 10 mV rms in amplitude and 2 kHz in frequency. Sample A showed negative flat-band potential ($V_{fb}$), while Sample B (with non-polar planes exposed) has a positive one, i.e., showed a positive shift in W. This difference indicates that Sample A has a much higher Schottky barrier for surface electron transport than Sample B. The implications and origins of such a significant difference in $V_{fb}$ between Sample A and B are further discussed below.

FIG. 15 depicts the results of an analysis directed to ruling out the effects of surface area difference as well as charge carrier migration path difference between Samples A and B on the PEC activity. To that end, the PEC performance characteristics of example GaN nanowire (NW) arrays grown on Si p-n wafer were analyzed. Their growth parameters and structural characterizations are given in the Supporting Information. The nanowire arrays were grown along the c-axis, with the top and lateral surfaces being c-plane and nonpolar plane GaN, respectively. Their surface exposure to electrolyte was controllably varied via the deposition of an insulating parylene passivation layer, followed by, in some cases, an etch-back process to reveal the top portions of the nanowire array. The parylene was selectively etched back with oxygen plasma for different durations. Longer durations of etching exposed greater amounts of the GaN NW nonpolar sidewalls, resulting in positive shifts in the $V_{on}$ and better fill factors.

The as-grown GaN NW/Si photocathode exhibits an onset potential of 0.45 V vs. RHE and maximum photocurrent density of 28 $mA/cm^2$ (see part (a) of FIG. 15). The activity diminished to negligible values when an insulating passivation layer 1500 was deposited to protect the non-polar sidewalls from the electrolyte (see part (b) of FIG. 15). After an initial etch-back process to form an insulating passivation layer 1502, top c-planes 1504 of the GaN nanowires were first exposed. Then, as the etch-back process proceeded for longer periods, sidewalls 1506 of the nanowires were gradually exposed to the electrolyte (see part (c) of FIG. 15). The effect of the increase in nonpolar surface area with etch-back duration is reflected in the positive shift of the onset potential and improved fill factor due to the reduction of charge transfer resistance associated with a larger surface area.

The photocurrent data of FIG. 15 also shows that even a little exposure of the nonpolar sidewall 1506 can lead to or support a maximum saturation photocurrent density that is nearly identical to that of the as-grown nanowire sample without any surface passivation. Such negligible dependence of the maximum photocurrent density on the etch-back duration rules out the effect of surface area on the measured PEC activity difference between the predominantly c-plane samples and (predominantly) non-polar plane samples and therefore accentuates the role that polarity plays in the stark contrast between the PEC activity of the as-grown quasi-film Sample A and that of the etched Sample B. The lack of surface area dependence also provides options for partial passivation of nanowire and other nanostructures used for charge transfer, examples of which are described below.

Density Functional Theory (DFT) Analysis. As described above, during PEC water splitting reactions, oxygen adsorption and substitution can occur on GaN surfaces. Therefore, to understand the fundamental difference in the PEC activity between c-plane and nonpolar plane GaN surfaces, it has been taken into account the role of oxygen that can readily adsorb and be incorporated into the surfaces, e.g., during operation.

FIG. 16 schematically depicts the DFT configurations for the analysis. Arrows in parts (a) and (b) indicate the spatial direction of the oxygen-induced surface dipole moment. Part (a) shows the oxygen substitution at the m-plane, forming a gallium oxynitride layer. Part (b) shows oxygen adsoprtion at the (0001) plane. Parts (c) and (d) schematically show the surface band bending variation induced by oxygen substitution and adsorption, respectively. The (partial) oxygen substitution at the m-plane induces an outward surface dipole moment that reduces the surface band bending, schematically shown in part (c). The oxygen adsorption at the (0001) plane induces an inward surface dipole moment that increases the surface band bending, further obstructing electron transfer to the surface, shown in part (d).

The DFT calculations were performed with the generalized gradient approximation, using the plane-wave pseudopotential quantum-ESPRESSO package. Ultrasoft pseudopotentials were used to describe the interaction between valence electrons and ionic cores, where Ga 3d electrons were explicitly treated as valence electrons. The wave functions and electronic density were expanded in a plane-wave basis set truncated at a cutoff energy of 30 Ry and 240 Ry, respectively. The surface was modeled with a repeated slab geometry using a (2×2) unit cell with a thickness of seven GaN bilayers, where the N-terminated bottom side was passivated by pseudo-hydrogen with charge of 0.75e. In addition, the $(10\bar{1}0)$ surface was modeled using 8 GaN atomic layers with a lateral dimension of 9.57 Å×10.38 Å. A vacuum width of at least 15.0 Å was introduced between consecutive slabs, and a k-point mesh of 5×5×1 and 2×2×1 was used to sample the surface Brillouin zone for the polar and non-polar surfaces, respectively.

For the nonpolar $(10\bar{1}0)$ surface, the most stable configuration was obtained with nitrogen atoms in the surface and subsurface layer partially replaced by oxygen, leading to the formation of unique gallium oxynitride on the non-polar surfaces (see part (a) of FIG. 16). Gallium oxynitride is known to have a smaller energy bandgap and enhanced catalytic activity, compared to GaN, thereby leading to significantly enhanced charge carrier (electron) transfer to the nonpolar GaN surfaces for PEC reaction.

On the other hand, for the polar (0001) GaN surface, the most stable surface configuration in an oxygen-rich condition was found to be the one with a 0.25 ML coverage of oxygen adsorption (see part (b) of FIG. 16).

Interestingly, the oxygen was found to have significant effects on the surface polarization and thereby the band bending at the surfaces. More specifically, the calculations showed that oxygen substitution and adsorption lead to a positive and negative surface polarization at the nonpolar $(10\bar{1}0)$ and polar (0001) planes, respectively. At the (0001) plane, the negative surface polarization effectively decreases the work function, which is related to the difference in the electrostatic potential deep in vacuum and deep in the semiconductor. In contrast, the work function at the $(10\bar{1}0)$ plane is increased due to a positive surface polarization.

Quantitatively, these surface polarizations induce an upward band bending of 0.21 eV at the (0001) plane and a downward band bending of 0.25 eV at the non-polar surface, as shown in parts (c) and (d) of FIG. 16. Collectively, this observation indicates that oxygen has contrasting effects on charge transfer at the two planes, i.e., they facilitate electron transport at the non-polar plane, while limiting transport at the polar one. These contrasting characteristics of the oxynitride layer may be applied to support different types of device interfaces directed to promoting charge transfer (e.g., an electrode) and inhibiting charge transfer (e.g., gate oxide stabilization or passivation), respectively, examples of which are described herein.

The difference between Sample A and B in surface polarization induced by different surface oxygen interactions contributes to their difference in surface band bending shown in the MS measurements. Sample A, with essentially only its top c-plane exposed to the electrolyte, showed a negative flat-band potential (see part (b) of FIG. 14), indicating a conduction band Schottky barrier at the interface between the n-type GaN c-plane and the electrolyte likely due to both Fermi level pinning and upward bending banding. In contrast, Sample B, with lateral nonpolar surfaces exposed to the electrolyte, showed a positive shift in $V_{fb}$. Open circuit potential (OCP) measurements revealed that Sample B had a photovoltage of about 0.4 V which is consistent with the MS measurements. The difference in activity between samples A and B can be attributed to the difference in the energetic barriers between the polar and nonpolar surfaces due to the different nature of the surface oxidation, as well as the resultant polarization-induced surface band bending and Fermi level pinning at surface states of the c-plane GaN surface. At a semiconductor-electrolyte interface, Fermi level pinning results in a Schottky barrier that remains constant at different polarization biases. This barrier prevents efficient charge carrier transport to the c-plane surface by imposing a large overpotential for hydrogen evolution reaction and thus results in little to no photoresponse from Sample A even after Pt cocatalyst deposition, which serves to facilitate hydrogen evolution with any available surface (photo)electrons. The non-polar m-plane, in the presence of surface gallium oxynitride, may exhibit an unpinned Fermi level that allows for facile charge transfer to the electrolyte, while the electronic energy barrier at the Ga-polar c-plane is further exacerbated due to oxygen adsorption.

Through the foregoing theoretical and experimental analyses, the significance of the non-polar GaN planes in promoting PEC hydrogen evolution reaction has been identified. During the PEC reaction, the formation of unique gallium oxynitride on the nonpolar GaN surfaces significantly enhances charge carrier (electron) transport and extraction, whereas oxygen adsorption on polar c-plane surfaces prevents the efficient charge carrier extraction. The analyses elucidate the atomic origin for the high efficiency photo(electro)catalytic activities of GaN nanowires, compared to conventional GaN film structures. Exposing the non-polar facets of wurtzite III-nitrides is a useful strategy for achieving breakthrough advances in PEC activity by enhancing the electron migration between the photocathode and the electrolyte. An understanding of the relationship between crystallographic orientation and photo(electro) chemical reactions will be useful in PEC water splitting and various other catalytic reactions such as carbon dioxide reduction and nitrogen fixation.

FIG. 17A depicts a device 1700 with crystallographic- and oxynitride-based stabilization in accordance with one example. In some cases, the device 1700 may be a photoelectrode for a PEC reaction such as water splitting, as described herein, or another electrode. The device 1700 includes any number of nanostructures 1702.

The nanostructure(s) 1702 is/are supported by a substrate (not shown) as described herein. The nanostructures 1702 may be disposed in an array or other arrangement. In this case, each nanostructure 1702 is configured as a nanowire, but other shapes and structures may be used. The nanostructures may be grown (e.g., epitaxially grown) or formed via additional and/or alternative techniques, such as through etching. The device 1700 may include or have any one or more of the features or characteristics of the nanowire-based devices described herein.

The nanostructure 1702 has a semiconductor composition. In some cases, the nanostructure 1702 is composed of GaN and/or another III-nitride semiconductor material. Alternative or additional semiconductor materials (e.g., compound semiconductors). For instance, the semiconductor composition is not limited to nitrogen-containing semiconductors. Oxygen-containing semiconductors may be used in other cases.

The nanostructure 1702 has a surface at which either nitrogen or oxygen is present. The presence of nitrogen or oxygen may arise from the composition of the semiconductor material. In some cases, the surface may be nitrogen-terminated.

The device 1700 includes a stabilizing layer 1704. The stabilizing layer 1704 is disposed on the surface of the nanostructure 1702. In this case, the surface on which the stabilizing layer 1704 is disposed is a sidewall of the nanostructure 1702. The stabilizing layer 1704 includes an oxynitride material, as described herein. The oxynitride material may be continuously distributed across the surface of the nanostructure 1702. The stabilizing layer may thus continuously cover the surface. The oxynitride of the stabilizing layer 1704 may be established via the substitution of the nitrogen or oxygen at the surface with oxygen or nitrogen, respectively.

In the example of FIG. 17A, the surface on which the stabilizing layer 1704 is disposed is a non-polar surface of the nanostructure 1702. In GaN and other wurtzite examples, the non-polar surface is oriented along an m-plane of a lattice of the nanostructure 1702.

The device 1700 further includes a passivation cover or cap 1706 disposed on a polar surface of the nanostructure 1702. In this example, the nanostructure 1702 has a top or upper polar surface, end, or facet. The passivation cap 1706 may be configured to completely cover or passivate the top surface of the nanostructure 1702. Such coverage or passivation may protect the nanostructure 1702 from corrosion or other degradation arising from, for instance, an electrolyte in which the device 1700 is immersed. In this wurtzite example, the polar surface is oriented along a c-plane of the lattice. In some cases, the passivation cap 1706 includes a nitride material or an oxide material. For example, the passivation cap 1706 may be composed of, or otherwise include, $AlO_x$, $HfO_2$, $Si_xN_y$, and $AlSiN_x$, but other materials may be used.

FIG. 17B depicts a device 1710 with crystallographic- and oxynitride-based stabilization in accordance with another example. The device 1710 may be a photoelectrode or other electrode. The device 1710 includes any number of nanostructures 1712. The nanostructure(s) 1712 is/are supported by a substrate (not shown) as described herein. The nanostructures 1712 may be disposed, configured, or constructed as described herein. The device 1712 may accordingly include or have any one or more of the features or characteristics of the nanowire-based devices described herein.

As with the example of FIG. 17A, the nanostructure 1712 has a sidewall surface at which either nitrogen or oxygen is present, and the device 1710 includes a stabilizing layer 1714 disposed thereon. The stabilizing layer 1714 includes an oxynitride material, and the sidewall surface is a non-polar surface, as described herein.

The example of FIG. 17B may differ from the above-described examples in that the stabilizing layer 1714 may or may not cover the entire sidewall surface. The stabilizing layer 1714 may instead only cover an exposed portion (e.g., an upper portion) of the nanostructure 1712 (e.g., exposed to the electrolyte). However, the oxynitride material of the stabilizing layer 1714 may nonetheless be continuously distributed across the exposed portion (e.g., the exposed portion is be continuously covered by the stabilizing layer 1714).

The device 1710 further includes a passivation cover or cap 1716 disposed on a polar surface of the nanostructure 1712. The passivation cap 1716 may be disposed on a polar surface, as well as configured and constructed, as described above in connection with the example of FIG. 17A.

The device 1710 includes further includes a passivation structure 1718 that partially covers the non-polar surface of the nanostructure 1712. In this example, the passivation structure 1718 surrounds or otherwise covers a lower portion of the sidewall surface of the nanostructure 1712.

The extent to which the sidewall surface is passivated by the passivation structure 1718 may vary. As described above, the current density of the device 1710 may not be significantly hampered by a decrease in exposed surface area of the nanostructure 1712. The passivation structure 1718 may thus cover a substantial amount of the sidewall surface without adversely affecting charge transfer and/or other device performance.

In some cases, the passivation structure 1718 is composed of, or otherwise includes, parylene, as described above. Other materials may be used, including various nitride materials and various oxide materials. For instance, $AlO_x$, $HfO_2$, $Si_xN_y$, or $AlSiN_x$ may be used.

The passivation structure 1718 may be configured as, or otherwise include, a layer in which any number of nanostructures 1712 of the device 1710 are embedded or otherwise disposed. For instance, the device 1710 may be configured as described and shown in the example of part (c) of FIG. 15.

In other examples, the device may include other types of nanostructures. For instance, the device may be configured as a light emitting device, such as a light emitting diode (LED) device. The device may thus include an active layer and an electrode supported by the active layer, as described above in connection with the example of 10. In such cases, the stabilizing layer is disposed between the active layer and the electrode. The active layer has a non-polar surface (e.g., an upper surface oriented along the m-plane of a wurtzite lattice) on which the stabilizing layer is disposed. The presence of the oxynitride of the stabilizing layer may thus promote charge transfer between the active layer and the electrode, as described above.

LED and other devices having a stabilizing layer on a non-polar surface may also include one or more passivation structures disposed along a sidewall of the active layer or other structure stabilized by the stabilizing layer. Please see, e.g., the example shown in FIG. 11. In such cases, the sidewall may be oriented along an m-plane of a lattice of the active layer or other structure. The passivation structure may be or include an oxynitride-based stabilizing layer, as described and shown in connection with the example of FIG. 11 and elsewhere herein. That stabilizing layer, however, is disposed along a polar surface (e.g., a c-plane of a wurtzite lattice) and therefore inhibits rather than promotes charge transfer. Additional or alternative passivation structures along the sidewalls may be used, including, for instance, various nitride materials and various oxide materials.

In still other cases, the device includes a stabilizing layer disposed along a polar surface to act as a passivation layer. For instance, the device may be configured as a transistor, such as a transistor device. In such cases, the stabilizing layer is disposed between a channel layer and a gate oxide layer, as described above in connection with the example of FIG. 3. The surface of the channel layer is a polar surface (e.g., an upper surface of the channel layer oriented along the c-plane of a wurtzite lattice). Disposition of the oxynitride material of the stabilizing layer on the polar surface inhibits charge transfer, as described above, thereby protecting the gate oxide from high energy charge carriers in the channel layer. The oxynitride material may be continuously distributed across the surface (e.g., continuously cover the entire surface of the channel layer) to suppress surface traps and/or address other imperfections along the interface between the channel layer and the gate oxide layer.

FIG. 17C depicts a device 1720 having a surface stabilization in accordance with another example. The device 1720 includes a substrate 1722 and a nanostructure 1724 supported by the substrate 1722. In this example, the nanostructure 1724 is planar. The nanostructure 1724 may be a patterned layer formed via an etching procedure. In some cases, the nanostructure 1724 is one layer or other component of a heterostructure, the other layers of which are not shown for ease in illustration.

The nanostructure 1724 has a semiconductor composition. The semiconductor composition may vary. For instance, any of the semiconductor compositions described herein may be used.

The nanostructure 1724 has a surface stabilized by a stabilizing layer 1726. The stabilizing layer 1726 is composed of, or otherwise includes, an oxynitride material, as described herein. In this example, the surface is an upper, planar surface of the nanostructure 1724. In some cases, the surface is a non-polar surface, in which case the stabilizing layer 1726 may be used to facilitate charge transfer between the nanostructure 1724 and another layer, such as a contact or electrode 1728. As described herein, the surface may correspond with the m-plane of a lattice of the nanostructure 1724. The stabilizing layer 1726 may thus establish an interface between the m-plane surface of the nanostructure 1724 and the electrode 1728. In other cases, the stabilizing layer 1726 is disposed between the nanostructure 1724 and another layer, component or element of the device 1700. In still other examples, the surface of the nanostructure 1724 is a polar surface, (e.g., corresponding with a c-plane of the lattice). In such cases and other cases, the stabilizing layer 1726 may be used to passivate the surface of the nanostructure 1724. For instance, the stabilizing layer 1726 may act to stabilize an interface between the nanostructure 1724 and the layer 1728, which may be configured as an oxide or other dielectric layer. In any of these cases, the oxynitride material of the stabilizing layer 1726 may be continuously distributed across the planar surface of the nanostructure 1724 (e.g., continuously cover the entirety of the surface).

The device 1700 may have one or more other aspects, features, components, or other characteristics in common with any one of the other examples described herein.

FIG. 18 depicts a method 1800 of fabricating a device in accordance with multiple examples. The method 1800 may be used to fabricate the devices of FIGS. 17A-17C, as well as other examples described herein, including, for instance, those shown in connection with FIGS. 1, 3, 10, and 11.

The method 1800 may be implemented in conjunction with one or more of the acts of the other fabrication methods described herein, including, for instance, those shown in connection with FIG. 2. For instance, the method 1800 may include one or more acts directed to providing a substrate of the device. Such substrate-related acts may be configured as described herein.

The method 1800 includes an act 1802 in which a structure of the device is formed. The structure may be or include a nanostructure such as a nanowire or an active, channel, or other layer of a device. The structure is supported by the substrate, has a semiconductor composition, as described herein.

In the example of FIG. 18, the method 1800 includes two branches that correspond with the two different types of stabilizing layers described herein. One branch is directed to fabricating a device in which a stabilizing layer supports charge transfer at, for instance, an electrode. The other branch is directed to fabricating a device in which a stabilizing layer acts as a passivation layer or an insulation layer to, e.g., inhibit charge transfer. In some cases, a device may include both types of stabilizing layers, in which case both branches are implemented.

On the charge transfer branch, the method 1800 may include an act 1804 in which one or more passivation structures is deposited. For instance, the passivation structure(s) may be disposed adjacent to the structure. As a result, a portion of the structure is covered by the passivation structure. Examples of such passivation structures include the cap layer on a c-plane of a nanowire, as described herein. The act 1804 may thus in some cases include covering a c-plane or other polar surface of the structure. In other examples, the passivation structure partially covers a sidewall (e.g., an m-plane) or other non-polar surface of the nanowire, as described herein.

The method 1800 includes an act 1806 in which a stabilizing layer is formed on a non-polar surface of the structure. The stabilizing layer includes an oxynitride material, as described herein. In some cases, the act 1806 may include depositing an oxygen-containing material (e.g., an oxide) on the non-polar surface, and implementing an anneal to form the oxynitride material from oxygen of the oxygen-containing material. The act 1806 may include any one or more of the acts described herein in connection with incorporating oxygen into the surface (see, e.g., FIG. 2), such as one or more pre-treatments of the surface. In other cases (e.g., semiconductor surfaces already including oxygen), a nitrogen-containing material (e.g., a nitride) may be deposited on the surface. The act 1806 may also be used to form oxynitride on a c-plane or other polar surface of the nanowire or other structure.

The act 1806 may be implemented via an oxidation reaction, as described herein. The act 1806 may thus be implemented after depositing a passivation structure in the act 1804. In other cases, depositing the passivation structure is implemented after forming the stabilizing layer.

Turning to the passivation/insulation branch, the method 1800 includes an act 1808 in which a stabilizing layer is formed on a polar surface of the structure. The stabilizing layer is composed of, or otherwise includes, an oxynitride material, as described herein. In this case, the oxynitride of the stabilizing layer is used to passivate and/or insulate an interface of the device, such as the interface between a channel layer and a gate dielectric layer of a transistor device, as described herein. The polar surface of the structure may thus be a c-plane of a wurtzite lattice, as described herein. The act 1808 may include any one or more of the acts described herein in connection with incorporating oxygen into the surface (see, e.g., FIG. 2).

The method 1800 may include an act 1810 to address one or more surfaces of the structure, such as an polar (e.g., c-plane) surface on which the stabilizing layer is formed, or a non-polar (e.g., m-plane) surface, via the deposition of a passivation or other insulating structure. In examples of the former case, the act 1810 may include depositing an insulating layer, such as a gate oxide layer. In examples of the latter case, the act 1810 may include depositing a passivation structure along sidewalls. For instance, the non-polar sidewalls of an active layer may be passivated via the act 1810. The act 1810 may be directed to depositing a passivation structure along such non-polar surface(s) of the structure such that the m-plane or other non-polar surface is covered by the passivation structure. The passivation structure deposited in the act 1810 may thus be useful in cases in which use of the oxynitride of the stabilizing layer would not passivate the non-polar surface for the reasons set forth herein.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A method of fabricating a device, the method comprising:
- providing a substrate of the device;
- forming a structure of the device, the structure being supported by the substrate, having a semiconductor composition, and comprising a surface, wherein nitrogen is present at the surface; and
- incorporating oxygen into the surface to form a stabilizing layer on the surface;
- wherein incorporating the oxygen is implemented such that the stabilizing layer comprises a uniform distribution of an oxynitride material, and
- wherein the surface is a non-polar surface of the structure.

2. The method of claim 1, wherein the stabilizing layer is configured as an activation layer.

3. The method of claim 1, wherein the stabilizing layer is configured as a passivation layer.

4. The method of claim 1, wherein incorporating the oxygen comprises implementing an oxidation reaction to form the stabilizing layer.

5. A method of fabricating a device, the method comprising:
- providing a substrate of the device;
- forming a structure of the device, the structure being supported by the substrate, having a semiconductor composition, and comprising a surface, wherein nitrogen is present at the surface; and
- incorporating oxygen into the surface to form a stabilizing layer on the surface;
- wherein incorporating the oxygen is implemented such that the stabilizing layer comprises a uniform distribution of an oxynitride material, and
- wherein incorporating the oxygen comprises implementing an electrochemical procedure.

6. The method of claim 5, wherein the electrochemical procedure is implemented for a period of time on the order of minutes.

7. The method of claim 5, wherein the electrochemical procedure comprises implementing a water splitting reaction in which the device is immersed in water.

8. The method of wherein incorporating the oxygen comprises annealing the surface.

9. A method of claim 1, fabricating a device, the method comprising:
- providing a substrate of the device;
- forming a structure of the device, the structure being supported by the substrate, having a semiconductor composition, and comprising a surface, wherein nitrogen is present at the surface; and
- incorporating oxygen into the surface to form a stabilizing layer on the surface;
- wherein incorporating the oxygen is implemented such that the stabilizing layer comprises a uniform distribution of an oxynitride material, and
- wherein incorporating the oxygen comprises depositing an oxygen-containing material on the surface.

10. The method of claim 9, wherein the oxygen-containing material comprises an oxide.

11. The method of claim 10, wherein the oxide is aluminum oxide.

12. The method of claim 10, wherein the oxide is hafnium oxide.

13. The method of claim 9, wherein incorporating the oxygen comprises treating the surface before depositing the oxygen-containing material.

14. The method of claim 9, wherein incorporating the oxygen further comprises annealing the surface after depositing the oxygen-containing material.

15. The method of claim 9, wherein the oxygen-containing material comprises a ferroelectric material.

16. The method of claim 1, wherein forming the structure comprises forming an array of conductive projections supported by the substrate and extending outwardly from the substrate, the array of conductive projections comprising the structure.

17. The method of claim 16, wherein forming the array of conductive projections comprises implementing a molecular beam epitaxy (MBE) growth procedure such that each conductive projection of the array of conductive projections comprises a respective nanowire.

18. A method of fabricating a device, the method comprising:

providing a substrate of the device;

forming a structure of the device, the structure being supported by the substrate, having a semiconductor composition, and comprising a surface, wherein nitrogen is present at the surface; and incorporating oxygen into the surface to form a stabilizing layer on the surface;

wherein:

incorporating the oxygen is implemented such that the stabilizing layer comprises a uniform distribution of an oxynitride material;

forming the structure comprises forming an array of conductive projections supported by the substrate and extending outwardly from the substrate, the array of conductive projections comprising the structure;

forming the array of conductive projections comprises implementing a molecular beam epitaxy (MBE) growth procedure such that each conductive projection of the array of conductive projections comprises a respective nanowire; and the MBE growth procedure is implemented under nitrogen-rich conditions such that sidewalls of each conductive projection of the array of conductive projections are nitrogen-terminated.

19. The method of claim 1, wherein:

the substrate comprises silicon; and the semiconductor composition of the structure comprises gallium nitride such that the oxynitride material is $GaO_xN_{1-x}$.

20. The method of claim 1, wherein the stabilizing layer has a thickness falling in a range from about one monolayer to a few monolayers.

21. The method of claim 1, wherein the surface is oriented along a non-polar plane of the semiconductor composition.

22. The method of claim 4, wherein the semiconductor composition is configured such that implementing the oxidation reaction results in partial oxygen substitution of the nitrogen.

23. The method of claim 1, wherein the semiconductor composition has a Wurtzite crystal structure.

24. The method of claim 1, wherein the nitrogen of the surface is disposed in a compound semiconductor arrangement of the semiconductor composition.

* * * * *